(12) United States Patent
Waltrich et al.

(10) Patent No.: US 12,494,407 B2
(45) Date of Patent: Dec. 9, 2025

(54) POWER ELECTRONICS CONVERTER WITH STACKED CARRIER SUBSTRATES

(71) Applicant: Rolls-Royce Deutschland Ltd & Co KG, Blankenfelde-Mahlow (DE)

(72) Inventors: Uwe Waltrich, Forchheim (DE); Stanley Buchert, Herzogenaurach (DE); Marco Bohlländer, Hirschaid (DE); Claus Müller, Wolfratshausen (DE)

(73) Assignee: ROLLS-ROYCE DEUTSCHLAND LTD & CO KG, Blankenfelde-Mahlow (DE)

( * ) Notice: Subject to any disclaimer, the term of this patent is extended or adjusted under 35 U.S.C. 154(b) by 513 days.

(21) Appl. No.: 18/100,873

(22) Filed: Jan. 24, 2023

(65) Prior Publication Data

US 2023/0387821 A1    Nov. 30, 2023

(30) Foreign Application Priority Data

May 31, 2022  (DE) ...................... 10 2022 205 493.8

(51) Int. Cl.
*H01L 23/36*   (2006.01)
*B60L 50/00*   (2019.01)
(Continued)

(52) U.S. Cl.
CPC .............. *H01L 23/36* (2013.01); *B60L 50/00* (2019.02); *B64D 27/34* (2024.01); *B64D 27/35* (2024.01);
(Continued)

(58) Field of Classification Search
CPC . H01L 23/312; H01L 23/36; H01L 23/49822; H01L 23/3121; H01L 23/367;
(Continued)

(56) References Cited

U.S. PATENT DOCUMENTS 6,650,559 B1 *   11/2003   Okamoto .............. H01L 25/162
                                                  363/141
8,912,670 B2 *   12/2014   Teh ..................... H01L 23/5389
                                                  257/E23.101
(Continued)

FOREIGN PATENT DOCUMENTS

DE   102019203125 A1   9/2020
DE   102020132348 A1   6/2022
(Continued)

*Primary Examiner* — Sean Kayes
*Assistant Examiner* — Nusrat Quddus
(74) *Attorney, Agent, or Firm* — Lempia Summerfield Katz LLC

(57) ABSTRACT

A power electronics converter may include: a first multi-layer planar carrier substrate having one or more electrically conductive layers; a second multi-layer planar carrier substrate having one or more electrically conductive layers; a converter commutation cell circuit including a plurality of commutation cell components that are electrically connected together via the one or more electrically conductive layers of the first planar carrier substrate and electrical connections, the commutation cell components including one or more power semiconductor switching elements in one or more power semiconductor prepackages, each power semiconductor prepackage including a power semiconductor switching element embedded in a solid insulating material; one or more additional converter components electrically connected to the one or more electrically conductive layers of the second planar carrier substrate; and one or more further electrical connections connecting together one or more of the electrically conductive layers of the first carrier substrate and the second carrier substrate.

19 Claims, 20 Drawing Sheets

(51) Int. Cl.
| | |
|---|---|
| *B64D 27/34* | (2024.01) |
| *B64D 27/35* | (2024.01) |
| *B64D 27/359* | (2024.01) |
| *H01L 23/48* | (2006.01) |
| *H02M 1/00* | (2006.01) |
| *H02M 1/08* | (2006.01) |
| *H02M 7/00* | (2006.01) |
| *H02M 7/219* | (2006.01) |
| *H02P 27/06* | (2006.01) |
| *H03K 17/56* | (2006.01) |
| *H05K 1/14* | (2006.01) |
| *B64D 27/02* | (2006.01) |

(52) U.S. Cl.
CPC ............ *B64D 27/359* (2024.01); *H01L 23/48* (2013.01); *H02M 1/0054* (2021.05); *H02M 1/08* (2013.01); *H02M 7/003* (2013.01); *H02M 7/219* (2013.01); *H02P 27/06* (2013.01); *H03K 17/56* (2013.01); *H05K 1/144* (2013.01); *B60L 2200/10* (2013.01); *B60L 2210/30* (2013.01); *B64D 27/026* (2024.01)

(58) Field of Classification Search
CPC ............... H01L 23/373; H01L 23/3735; H01L 23/5383; H01L 23/3107; H01L 2224/16225; H01L 2224/32225; H01L 2224/73253; H01L 24/16; H01L 24/32; H01L 24/73; H01L 24/81; H02M 3/33569; H02M 3/33573; H02M 3/33576; H02M 7/003; H02M 7/537; H02M 7/219; H02M 7/217; H02M 7/797; H02M 7/79; H02M 7/5387; H02M 1/08; F02C 6/00; B60L 2210/14; B60L 2210/30; B60L 2210/40; B60L 15/007; B60L 15/02; B60L 50/00; B64D 35/04; B64D 2027/026; B64D 27/34; B64D 27/10; B64D 27/24; B64C 29/0033; B64C 29/0008; H05K 1/0201–0204; H05K 1/0209; H05K 7/00; H05K 7/1427; H05K 7/209; H05K 7/1422; H05K 7/20409–20418; H05K 7/20154; H05K 7/20509; H02K 11/33; H02K 11/03; H02K 11/04

See application file for complete search history.

(56) References Cited

U.S. PATENT DOCUMENTS

| | | | | |
|---|---|---|---|---|
| 11,634,034 | B1* | 4/2023 | Waltrich | B60L 15/007 |
| | | | | 363/142 |
| 11,637,504 | B1* | 4/2023 | Waltrich | H02M 1/0054 |
| | | | | 361/749 |
| 11,688,723 | B1* | 6/2023 | Waltrich | H01L 23/5383 |
| | | | | 244/17.23 |
| 11,728,743 | B1* | 8/2023 | Waltrich | H02M 1/007 |
| | | | | 363/131 |
| 11,745,599 | B1* | 9/2023 | Waltrich | B60L 15/007 |
| 11,764,647 | B1* | 9/2023 | Waltrich | H02M 3/33573 |
| | | | | 310/68 D |
| 11,772,788 | B1* | 10/2023 | Waltrich | B64D 27/359 |
| | | | | 244/17.23 |
| 11,811,276 | B1* | 11/2023 | Waltrich | H02K 11/33 |
| 11,855,551 | B1* | 12/2023 | Waltrich | H05K 7/209 |
| 11,869,881 | B2* | 1/2024 | Waltrich | H01L 23/5383 |
| 11,975,611 | B2* | 5/2024 | Waltrich | B60L 15/007 |
| 12,057,784 | B2* | 8/2024 | Buchert | H02M 1/007 |
| 12,220,987 | B2* | 2/2025 | Waltrich | B60L 15/007 |
| 12,323,071 | B2* | 6/2025 | Waltrich | H02M 7/5387 |
| 2005/0230746 | A1* | 10/2005 | Eden | H02M 3/33592 |
| | | | | 257/330 |
| 2005/0270745 | A1* | 12/2005 | Chen | H01F 27/2804 |
| | | | | 361/707 |
| 2006/0152085 | A1* | 7/2006 | Flett | H02M 7/003 |
| | | | | 307/75 |
| 2006/0169976 | A1* | 8/2006 | Kameda | H01L 24/73 |
| | | | | 257/E23.101 |
| 2006/0175627 | A1* | 8/2006 | Shiraishi | H10D 30/4755 |
| | | | | 257/E29.253 |
| 2007/0164396 | A1* | 7/2007 | Jow | H01G 4/40 |
| | | | | 257/532 |
| 2014/0167248 | A1* | 6/2014 | Delgado | H01L 24/83 |
| | | | | 257/713 |
| 2015/0102480 | A1* | 4/2015 | Nakagawa | H01L 23/3672 |
| | | | | 257/714 |
| 2015/0311815 | A1* | 10/2015 | Nedic | H02M 7/003 |
| | | | | 363/21.01 |
| 2018/0366455 | A1* | 12/2018 | Spanos | H01L 23/49844 |
| 2021/0100091 | A1 | 4/2021 | Waltrich | |
| 2021/0179285 | A1 | 6/2021 | Waltrich | |
| 2021/0219456 | A1 | 7/2021 | Waltrich | |
| 2021/0380268 | A1 | 12/2021 | Ruppert et al. | |
| 2022/0285173 | A1* | 9/2022 | Schmidt | H01L 25/16 |
| 2023/0335472 | A1* | 10/2023 | Schuderer | H01L 25/071 |
| 2024/0170383 | A1* | 5/2024 | Taylor | H01L 23/36 |
| 2024/0213123 | A1* | 6/2024 | Kodama | H01L 24/29 |
| 2024/0421132 | A1* | 12/2024 | Tsuchimochi | H01L 23/24 |
| 2025/0105081 | A1* | 3/2025 | Fukutani | H01L 24/73 |
| 2025/0132281 | A1* | 4/2025 | Kato | H10D 8/50 |
| 2025/0201679 | A1* | 6/2025 | Kawano | H01L 24/29 |

FOREIGN PATENT DOCUMENTS

| | | |
|---|---|---|
| WO | 2019214944 A1 | 11/2019 |
| WO | 2019238381 A1 | 12/2019 |
| WO | 2020078841 A1 | 4/2020 |
| WO | 2020126561 A1 | 6/2020 |
| WO | 2020141053 A1 | 7/2020 |
| WO | 2022161868 A1 | 8/2022 |

* cited by examiner

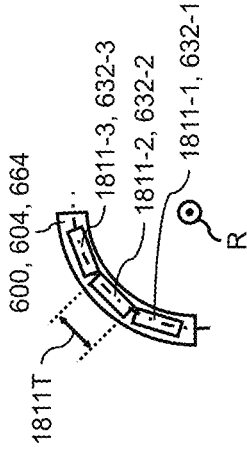
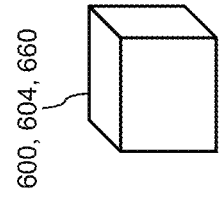
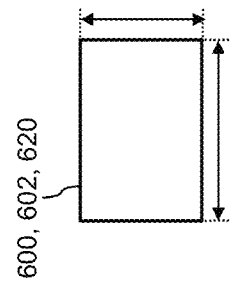
FIG. 18A  FIG. 18B  FIG. 18C  FIG. 18D  FIG. 18F  FIG. 18G  FIG. 18H  FIG. 19

POWER ELECTRONICS CONVERTER WITH STACKED CARRIER SUBSTRATES

The present patent document claims the benefit of German Patent Application No. DE 10 2022 205 493.8, filed May 31, 2022, which is hereby incorporated by reference in its entirety.

TECHNICAL FIELD

This disclosure relates to power electronics converters, and particularly but not exclusively to power electronics converters including power semiconductor prepackages for use in the power and propulsion systems of aircraft. Further, this disclosure relates to the design and manufacture of power electronics converters.

BACKGROUND

In aerospace, aircraft and power and propulsion systems of the aircraft are becoming increasingly electrical in their design. Some proposed platforms are purely electric, relying completely on batteries or fuel cells for all their power and propulsion requirements. Other proposed platforms are of the hybrid-electric type, and others still are 'more electric' in that the proposed platforms derive most or all their propulsive power from on-board engines (e.g., gas turbine engines) but have an increased number of electrically powered aircraft and engine systems, sub-systems, and accessories.

The electrical power systems that feature in these platforms include power electronics converters. AC-DC converters (e.g., inverters and rectifiers) convert between AC and DC, for example, to deliver AC to an electrical machine configured as a motor from a DC power source (e.g., a battery or DC power channel), or to deliver DC power from an electrical machine configured as a generator to a DC power channel or rechargeable battery. DC-DC converters may be used to regulate the DC voltage delivered from a battery to a DC power channel, for example. The electrical power systems may also include other power electronics devices such as, for example, protection devices such as solid-state power controllers (SSPCs) and solid-state circuit breakers, some of which may be incorporated into the converters themselves.

So-called power modules, or power electronics modules, are the dominant state of the art technology for power electronics converters. In a converter including a power module, the components of the converter circuit, which include power semiconductor devices including transistors and diodes, and smoothing DC-link or input capacitor(s), are fixed to a carrier substrate and electrically connected to each other (e.g., using wire bonds). Power module-based converters are widely used in, for example, the automotive industry and are used in existing aerospace systems, where the power module-based converters may provide acceptable performance with average operating efficiencies as high as 95%.

The performance of converters based on the power module topology is acceptable for most applications, especially when due account is taken of their relatively low cost and high availability. From the point of view of aerospace applications, however, improving the efficiency and power-to-weight ratio of power electronics converters would be advantageous. Compared with ground-based applications including automotive applications, aerospace applications are highly sensitive to weight. For purely electric aircraft applications especially, even a relatively small increase in converter efficiency could provide meaningful improvements in aircraft performance and mission range.

Improvements in the performance of converters based on the existing power module topologies are likely to be limited to what can be achieved through advances in the underlying semiconductor technologies. This is at least in part because of the inherently high parasitic inductance of the commutation cell of a power module, much of which is introduced by the electrical connections between the commutation cell components. Parasitic inductance in the commutation cell is associated with transistor switching losses and voltage overshoot during turn-off, which not only limits efficiency and generates heat that is to be removed, but also limits other performance characteristics including the transistor switching frequency.

SUMMARY

The scope of the present disclosure is defined solely by the appended claims and is not affected to any degree by the statements within this summary. The present embodiments may obviate one or more of the drawbacks or limitations in the related art.

A power electronics converter (e.g., a converter) is disclosed. The power electronics converter includes a converter commutation cell including a power circuit and a gate driver circuit. The power circuit includes at least one power semiconductor switching element and at least one capacitor. Each power semiconductor switching element has at least three terminals including a gate terminal. The gate driver circuit is electrically connected to and configured to provide switching signals to the gate terminal of each of the at least one power semiconductor switching elements. The power electronics converter may be an AC-DC power electronics converter (e.g., an inverter or a rectifier) or a DC-DC power electronics converter.

An electrical power system including an electrical machine and an AC-DC power electronics converter is also disclosed. The electrical machine includes one or more windings. The AC-DC power electronics converter includes a commutation cell including a power circuit and a gate driver circuit. The power circuit includes a plurality of power semiconductor switching elements and at least one capacitor. An AC-side connection of the power circuit is connected to the one or more windings of the electrical machine to supply current to or receive current from the electrical machine. The electrical machine may be a motor or a generator, and the AC-DC power electronics converter may be an inverter or a rectifier. The electrical machine may be a motor-generator, and the AC-DC converter may be a bi-directional converter operable as an inverter or a rectifier.

The following metric prefixes are used herein to abbreviate numerical values:

TABLE 1

| Prefix | Abbreviation | Value |
|---|---|---|
| exa | E | $\times 10^{18}$ |
| peta | P | $\times 10^{15}$ |
| tera | T | $\times 10^{12}$ |
| giga | G | $\times 10^{9}$ |
| mega | M | $\times 10^{6}$ |
| kilo | k | $\times 10^{3}$ |
| centi | c | $\times 10^{-2}$ |
| milli | m | $\times 10^{-3}$ |
| micro | μ | $\times 10^{-6}$ |

TABLE 1-continued

| Prefix | Abbreviation | Value |
|---|---|---|
| nano | n | ×10⁻⁹ |
| pico | p | ×10⁻¹² |
| femto | f | ×10⁻¹⁵ |
| atto | a | ×10⁻¹⁸ |

Any of the following features below may be applied singularly or in combination with each other and with the power electronics converter and the electrical power system set out above.

A method of designing and manufacturing a power electronics converter for an electrical power system is provided. The method includes selecting a circuit design for the power electronics converter, determining a shape constraint for integrating the power electronics converter into the electrical power system, and obtaining at least one multi-layer carrier substrate according to the determined shape constraint. A plurality of power semiconductor prepackages are obtained. Each power semiconductor prepackage of the plurality of power semiconductor prepackages includes at least one power semiconductor switching element embedded in a solid insulating material and at least one electrical connection extending through the solid insulating material from at least one terminal of the at least one power semiconductor switching element to a connection surface of the respective power semiconductor prepackage. The power electronics converter is obtained by forming electrically conductive connections in a z-direction connecting terminals of the power semiconductor switching elements of the plurality of power semiconductor prepackages and one or more electrically conductive layers of the multi-layer carrier substrate. The z-direction is perpendicular to an x-y plane of the multi-layer carrier substrate and the one or more electrically conductive layers.

Parasitic inductance is a notable problem in power electronics converters because parasitic inductance creates a loss mechanism: switching losses. The reduced parasitic inductance of the power electronics converters may be achieved by design measures such as surface mounted devices (e.g., surface mounting of power semiconductors) and/or encapsulation of power semiconductors in pre-packages and/or direct electrical connection of components (e.g., by vias) in a vertical direction.

The present disclosure includes the finding that, with the help of one or more of these design measures, it is possible to flexibly design power electronics converters that meet a shape constraint of the electrical power system of the aircraft without compromising on the efficiency and/or power density of the power electronics converter. Since strict space and/or weight constraints apply for electrical power systems, such as electrical propulsion units or turbo-generator systems, it is advantageous to adapt or optimize the shape of the power electronics converter according to existing shape constraints. In other words, with the presented method, it is possible to fit a set of required power electronics converters into an existing spatial volume, required by a design of an electrical power system and/or an aircraft including the electrical power system, while achieving low losses and high power density.

Each power semiconductor switching element may be a transistor. Each transistor may be a MOSFET having at least the gate terminal, a source terminal, and a drain terminal. The MOSFETs may be Silicon Carbide (SiC) MOSFETs. In other examples, the MOSFETS are Gallium Nitride (GaN) MOSFETs.

Each power semiconductor switching element may be included in a power semiconductor prepackage. Each power semiconductor prepackage includes one or more power semiconductor switching elements embedded in a solid insulating material. Each power semiconductor prepackage may include precisely one power semiconductor switching element.

The power electronics converter may include one or more power semiconductor logical switches each including one or more parallel-connected power semiconductor switching elements. Each power semiconductor logical switch may include one or more power semiconductor prepackages, each power semiconductor prepackage including at least one (and optionally precisely one) power semiconductor switching element. The number of power semiconductor switching elements per logical switch may be greater than or equal to three. The number may be in the range of three to twelve.

A peak rated power output of the power electronics converter may be greater than 10 kW (equivalently kVA) and may be greater than 25 kW. The peak rated power may be greater than or equal to 40 kW, or greater than or equal to 50 kW. The peak rated power may be less than or equal to 500 kW. The peak rated power output may be less than or equal to 400 kW, or less than or equal to 300 kW. The peak rated power may be in the range 50 kW to 300 kW.

A maximum efficiency of the power electronics converter may be greater than 97%. The maximum efficiency may be greater than 97.5%, greater than 98%, greater than 98.5% or even greater than 99%. The maximum efficiency of the power electronics converter may be less than 100%.

A value of a converter parameter $\alpha$ may be less than or equal to 5 pHm³. $\alpha$ is a product of the smallest cuboidal volume that encloses the commutation cell and a parasitic inductance of the power circuit of the commutation cell. $\alpha$ may be greater than or equal to 0.3 pHm³. $\alpha$ may be is less than or equal to 4 pHm³. $\alpha$ may satisfy 0.4 pHm³≤$\alpha$≤3.5 pHm³. $\alpha$ may satisfy 0.5 pHm³≤$\alpha$≈2.5 pHm³.

The value of $\alpha$ divided by the peak rated power output of the power electronics converter may be greater than or equal to 1.5 aHm³/W. The value of $\alpha$ divided by the peak rated power output of the power electronics converter may be less than or equal to 100 aHm³/W. The value of $\alpha$ divided by the peak rated power output of the power electronics may be in the range 2.5 aHm³/W to 50 aHm³/W.

A product of the parasitic inductance of the power circuit of the commutation cell and the peak rated power output may be in the range 0.05 mHW to 1.5 mHW. The product may be in the range 0.1 mHW to 1.2 mHW, or in the range 0.2 mHW to 1.0 mHW.

A value of $\alpha$ parameter $\beta$ may be greater than or equal to 0.3 PV/s². $\beta$ is a product of a maximum switching frequency of the switching signals and a maximum rate of change of a source-drain voltage of the plurality of power semiconductor switching elements during operation. The value of $\beta$ may be less than or equal to 10 PV/s². The value of $\beta$ may be greater than or equal to 0.5 PV/s². The value of $\beta$ may satisfy 0.8 PV/s²≤$\beta$≤5 PV/s² or may satisfy 1.0 PV/s²≤$\beta$≤2.5 PV/s².

A value of a converter parameter $\gamma$ may be less than or equal to 150 fFs/W. $\gamma$ is a total rated capacitance of the at least one capacitor of the power circuit divided by a product of the peak rated power output of the power electronics converter and a maximum switching frequency of the switching signals. The value of $\gamma$ may be greater than or equal to 1.0 fFs/W. The value of $\gamma$ may be less than or equal to 100 fFs/W, less than or equal to 75 fFs/W or less than or equal to 50 fFs/W. The value of $\gamma$ may satisfy 2.0 fFs/W≤$\gamma$≤50 fFs/W or may satisfy 4.0 fFs/W≤$\gamma$≤25 fFs/W.

A value of a converter parameter δ may be greater than or equal to 0.5 PV/FH. δ is a maximum blocking voltage of the one or more power semiconductor switching elements of the power circuit divided by a product of a parasitic inductance of the power circuit of the commutation cell and a total rated capacitance of the at least one capacitor of the power circuit. The value of δ may be less than or equal to 40 PV/FH. The value of δ may be greater than or equal to 1.5 PV/FH. The value of δ may be in the range 2.5 PV/FH to 25 PV/FH. The value of δ may be in the range 4.0 PV/FH to 15 PV/FH.

A value of a converter parameter ε may be greater than or equal to $10^{26}$ V/s$^4$. ε is equal to:

$$\varepsilon = \frac{f_{max} \times \left|\frac{dv}{dt}\right|_{max}}{L \times C} \quad (1)$$

In this equation, $f_{max}$ is a maximum switching frequency of the switching signals, $|dv/dt|_{max}$ is a maximum rate of change of a source-drain voltage of the one or more power semiconductor switching elements during operation, L is a parasitic inductance of the power circuit of the commutation cell, and C is a total rated capacitance of the at least one capacitor of the power circuit. The value of ε may be less than or equal to $10^{29}$ V/s$^4$. The value of ε may be greater than or equal to $5 \times 10^{26}$ V/s$^4$. The value of ε may be in the range $10^{27}$ V/s$^4$ to $5 \times 10^{28}$ V/s$^4$ or may be in the range $1.5 \times 10^{27}$ V/s$^4$ to $3 \times 10^{28}$ V/s$^4$.

The parasitic inductance of the power circuit of the commutation cell may be less than or equal to 16 nH, less than or equal to 10 nH, less than or equal to 8 nH, less than or equal to 6 nH, less than or equal to 4 nH, less than or equal to 3 nH, or even less than or equal to 2 nH. The parasitic inductance may be in the range 2 nH to 8 nH.

The total rated capacitance of the power circuit of the commutation cell divided by the peak rated power may be less than or equal to 5 nF/W, and may be less than or equal to 3 nF/W. The total rated capacitance of the power circuit of the commutation cell divided by the peak rated power may be in the range 0.1 nF/W to 2.5 nF/W.

The smallest cuboidal volume that encloses the commutation cell may be less than or equal to 1,000 cm$^3$. The smallest cuboidal volume may be less than or equal to 900 cm$^3$, less than or equal to 800 cm$^3$, less than or equal to 700 cm$^3$, or less than or equal to 600 cm$^3$. The smallest cuboidal volume may be in the range 100 cm$^3$ to 800 cm$^3$, 100 cm$^3$ to 700 cm$^3$, 100 cm$^3$ to 600 cm$^3$, 150 cm$^3$ to 600 cm$^3$, or 200 cm$^3$ to 450 cm$^3$.

A maximum rate of change of a source-drain voltage of the one or more power semiconductor switching elements during operation may be greater than or equal to 10 kV/μs, greater than or equal to 15 kV/μs, or greater than or equal to 20 kV/μs. The maximum rate of change may be less than 150 kV/μs, less than 120 kV/μs, less than 100 kV/μs, less than 90 kV/μs, or less than 80 kV/μs. The maximum rate of change may be in the range 10 kV/μs to 120 kV/μs, in the range 15 kV/μs to 100 kV/μs, in the range 20 kV/μs to 90 kV/μs, or in the range 25 kV/μs to 80 kV/μs. The maximum rate of change may be in the range 10 kV/μs to 60 kV/μs, in the range 15 kV/μs to 50 kV/μs, in the range 20 kV/μs to 50 kV/μs, in the range 25 kV/μs to 50 kV/μs, or in the range 30 kV/μs to 50 kV/μs. The maximum rate of change may be in the range 30 kV/μs to 40 kV/μs.

The maximum switching frequency of the switching signals ($f_{max}$) may be greater than or equal to 10 kHz. The maximum switching frequency may be greater than or equal to 20 kHz, greater than or equal to 30 kHz, greater than or equal to 40 kHz, or greater than or equal to 50 kHz. The maximum switching frequency may be less than 100 kHz. The maximum switching frequency may be in the range 30 kHz to 70 kHz.

The blocking voltage (e.g., the 'source-drain blocking voltage,' sometimes referred to as the 'rated voltage') of each power semiconductor switching element may be greater than 600 V, greater than 700 V, or greater than 800 V. The blocking voltage may be less than 1,800 V or less than 1,700V. The blocking voltage may be in the range 800 V to 1,600 V, 900 V to 1,500, or 1,000 V to 1,400 V.

The power electronics converter may further include a multi-layer planar carrier substrate. The multi-layer planar carrier substrate may define an x-y direction parallel to a planar surface of the substrate and a z-direction perpendicular to the x-y direction. The carrier substrate may include a plurality of electrically conductive layers extending in the x-y direction and at least one electrical connection extending in the z-direction. The carrier substrate may include an outer conductive layer on one or both of its opposed planar surfaces.

The multi-layer planar substrate may be a rigid printed circuit board (PCB). The multi-layer planar substrate may be a flexible PCB. The multi-layer planar substrate may be a ceramic carrier substrate. The multi-layer planar substrate may be a structural component of the converter.

Each power semiconductor prepackage may further include at least one electrical connection extending in the z-direction from at least one terminal of each of the one or more power semiconductor switching elements through the solid insulating material to an electrical connection side of the power semiconductor prepackage. At least one of the terminals of each of the one or more power semiconductor switching elements of the prepackage may be connected to at least one of the conductive layers of the multi-layer planar carrier substrate at the electrical connection side of the power semiconductor prepackage.

The electrical connection side of the power semiconductor prepackage may be spaced apart in the z direction from the multi-layer planar carrier substrate so as to define a gap (referred to herein as the prepackage gap) between the multi-layer planar carrier substrate and the electrical connection side of the prepackage. A size in the z-direction of the prepackage gap may be less than or equal to 300 μm. The size of the prepackage gap may be less than or equal to 250 μm. The size of the prepackage gap may be less than or equal to 200 μm. The size of the prepackage gap may be less than or equal to 150 μm. The size of the prepackage gap may be greater than or equal to 10 μm, or greater than or equal to 20 μm, or greater than or equal to 50 μm, or greater than or equal to 80 μm. The prepackage gap may be in the range 20 μm to 250 μm, or in the range 50 μm to 150 μm.

A value of a converter parameter θ may be less than or equal to 300 pm$^2$/V. θ is a size in the z-direction of the prepackage gap divided by a maximum electric field strength in the prepackage gap. Accordingly, the converter parameter θ may be expressed as follows:

$$\theta = \frac{G_1}{E_1} \quad (2)$$

In this equation, $G_1$ is the size of the prepackage gap in the z-direction, and $E_1$ is the maximum electric field strength in the prepackage gap. θ may be greater than or equal to 0.1 pm²/V. θ may be less than or equal to 250 pm²/V. θ may be in the range 2.0 pm²/V to 20 pm²/V, in the range 3.0 pm²/V to 10 pm²/V, in the range 0.5 pm²/V to 100 pm²/V, or in the range 2.0 pm²/V to 50 pm²/V.

The maximum electric field strength in the prepackage gap may be greater than or equal to 1 kV/mm, greater than or equal to 3 kV/mm, greater than or equal to 5 kV/mm, or greater than or equal to 10 kV/mm. The maximum electric field strength in the prepackage gap may be less than or equal to 50 kV/mm, less than or equal to 40 kV/mm, or less than or equal to 25 kV/mm. The maximum electric field strength in the prepackage gap may be in the range 5 kV/mm to 40 kV/mm, in the range 10 kV/mm to 25 kV/mm, or in the range 3 kV/mm to 25 kV/mm.

The power electronics converter may further include a heat sink for removing heat from power semiconductor prepackages. The heat sink may be spaced apart in the z-direction from the multi-layer planar carrier substrate so as to define a gap (referred to herein as the heat sink gap) between the multi-layer planar carrier substrate and the heat sink. The size in the z-direction of the heat sink gap between the multi-layer planar carrier substrate and the heat sink may be less than or equal to 10 mm, less than or equal to 5 mm, less than or equal to 3 mm, less than or equal to 2.5 mm, less than or equal to 1 mm, or less than or equal to 0.3 mm. The size of the heat sink gap may be greater than or equal to 0.1 mm, greater than or equal to 0.5 mm or greater than or equal to 1 mm. The size of the heat sink gap may be within the range 0.5 mm to 3 mm, in the range 0.5 mm to 2.5 mm, in the range 0.5 mm to 2 mm, in the range 1 mm to 2 mm, or in the range 1.3 mm to 1.7 mm.

A value of a converter parameter φ may be less than or equal to 20 nm²/V. φ is a size in the z-direction of the heat sink gap divided by the maximum electric field strength in the heat sink gap. Accordingly, the converter parameter φ may be expressed as follows:

$$\varphi = \frac{G_2}{E_2} \quad (3)$$

In this equation, $G_2$ is the size of the heat sink gap in the z-direction, and $E_2$ is the maximum electric field strength in the heat sink gap. φ may be less than or equal to 15 nm²/V. φ may be greater than or equal to 0.01 nm²/V. φ may be in the range 0.25 nm²/V to 2.5 nm²/V, in the range 0.5 nm²/V to 1.5 nm²/V, in the range 0.02 nm²/V to 10 nm²/V, or in the range 0.05 nm²/V to 5 nm²/V.

The maximum electric field strength in the heat sink gap may be greater than or equal to 0.1 kV/mm, greater than or equal to 0.2 kV/mm, or greater than or equal to 1 kV/mm. The maximum electric field strength in the heat sink gap may be less than or equal to 20 kV/mm, less than or equal to 15 kV/mm, less than or equal to 10 kV/mm, or less than or equal to 5 kV/mm. The maximum electric field strength in the heat sink gap may be in the range 0.2 kV/mm to 10 kV/mm, in the range 1 kV/mm to 2 kV/mm, or in the range 1.3 kV/mm to 1.7 kV/mm.

Those skilled in the art will appreciate that the maximum electric field strength in the prepackage gap and/or the heat sink gap may be determined using a mathematical and/or computational simulation method (e.g., Finite Element Analysis).

The maximum electric field strengths $E_1$, $E_2$ are maximum homogenous field strengths in the respective gaps. In other words, the maximum field strengths may exclude highly localized maxima such as singularities that occur at or near sharp edges. The maximum electric field strengths may be determined at a point or in a region in the respective gap, where the point or region is located away in the x-y direction from a singularity (e.g., an edge or boundary) of the multi-layer planar carrier substrate, power semiconductor prepackage, and/or heat sink. The distance in the x-y direction between the point or region and the singularity (e.g., the edge of the multi-layer planar carrier substrate, the power semiconductor prepackage, and/or the heat sink) may be defined by a number of mesh cells of the simulation method (e.g., three mesh cells). By determining the maximum electric field strength in the point or region, the maximum electric field strength is determined in a region of the electric field that is relatively homogenous.

The maximum electrical field strengths may be determined in a region between two opposed and substantially parallel surface regions.

Where a prepackage gap is present, at least a portion of the prepackage gap may be filled with an electrically insulating material. The electrically insulating material, which may be a resin (e.g., a dielectric resin or polymer resin) or another suitable insulating material, may have a plurality of voids within the region (e.g., volume) the electrically insulating material occupies.

A converter parameter σ may be greater than or equal to 10/mm. σ is defined as an insulation fill factor of the electrically insulating material divided by a maximum void size of the plurality of voids. Accordingly, the a may be expressed as follows:

$$\sigma = \frac{F}{R_{max}} \quad (4)$$

In this equation, F is the insulation fill factor and $R_{max}$ is the maximum void size of the plurality of voids. The insulation fill factor is defined as a cumulated volume of the plurality of voids (e.g., 'void volume'), subtracted from a volume of the electrically insulating material, divided by the volume of the electrically insulating material. This may be expressed as follows:

$$F = \frac{V_{IM} - V_V}{V_{IM}} \quad (5)$$

In this equation, $V_{IM}$ is the volume of the electrically insulating material and $V_V$ is the cumulated volume of the plurality of voids. Hence, the converter parameter σ may also be expressed as:

$$\sigma = \frac{V_{IM} - V_V}{V_V \times R_{max}} \quad (6)$$

σ may be greater than or equal to 15/mm, greater than or equal to 18/mm, greater than or equal to 50/mm, greater than or equal to 80/mm, or greater than or equal to 80/mm. σ may be less than or equal to 1000/mm, less than or equal to 800/mm, less than or equal to 500/mm, less than or equal to 200/mm, or less than or equal to 150/mm. σ may be in the range 30/mm to 200/mm or in the range 50/mm to 150/mm.

The insulation fill factor may be greater than or equal to 90%, greater than or equal to 95%, greater than or equal to 99%, or greater than or equal to 99.99%.

The electrically insulating material may be described as an underfill material of the semiconductor prepackage. In contrast to some applications of underfill material in the field of electronics, which provide improved mechanical properties (e.g., stiffness), the underfill material according to the present disclosure additionally or alternatively has an electrically insulating function to resist the high electric fields developed in the power dense converters of the present disclosure.

The maximum void size of the plurality of voids may be less than or equal to 100 μm, less than or equal to 50 μm, less than or equal to 20 μm, less than or equal to 10 μm, less than or equal to 5 μm, or less than or equal to 1 μm.

Those skilled in the art will appreciate that the term "voids" refers to the inclusion of 'foreign' material, different to the electrically insulating material, in the region occupied by the electrically insulating material. The voids may be in solid (e.g., particle-like), liquid, or gaseous form. Example void materials may include solder material, solder flux residues, air, washing liquid, and the like. Voids may be unintentionally introduced during the manufacturing process.

The maximum void size may be defined as the diameter of an equivalent spherical body having the same volume as the largest void. The largest void and/or the maximum void size may be determined by methods known to those skilled in the art; for example, the largest void and/or the maximum void size may be determined by statistical methods determining the void size of a representative number of voids. The representative number of voids is smaller than the total number of the plurality of voids in the electrically insulating material.

A converter parameter τ may be less than or equal to 10,000 V. τ is a product of a dielectric strength of the electrically insulating material and the maximum void size of the plurality of voids. Accordingly, τ may be expressed as:

$$\tau = D \times R_{max} \quad (7)$$

In this equation, D is the dielectric strength of the electrically insulating material and $R_{max}$ is the maximum void size of the plurality of voids. τ may be less than or equal to 1,000 V, less than or equal to 500 V, or less than or equal to 250 V. τ may be greater than or equal to 1 V, greater than or equal to 10 V, greater than or equal to 100 V, or greater than or equal to 150 V. τ may be in the range 100 V to 300 V or in the range 150 V to 250 V.

The dielectric strength of the electrically insulating material, D, may be greater than or equal to 1 kV/mm, greater than or equal to 10 kV/mm, or greater than or equal to 15 kV/mm. D may be less than or equal to 250 kV/mm, less than or equal to 200 kV/mm, less than or equal to 100 kV/mm, or less than or equal to 50 kV/mm. D may be in the range 10 kV/mm to 30 kV/mm or range 15 kV/mm to 25 kV/mm.

One or more (e.g., each) power semiconductor prepackage may further include one or more electrically conductive layers. The one or more electrically conductive layers may extend in the x-y direction. At least one of the one or more electrically conductive layers may be embedded within the solid electrically insulating material of the power semiconductor prepackage. At least one of the one or more electrically conductive layers may be located on an opposite side of the power semiconductor switching element to the electrical connection side of the prepackage and connect to at least one of the terminals of the power semiconductor switching element. At least one electrical connection may extend in the z-direction from an electrically conductive layer of the prepackage to the electrical connection side of the prepackage.

Each power semiconductor prepackage may further include an electrical isolation layer. The electrical isolation layer may be located on an opposite side of the power semiconductor switching element to the electrical connection side of the prepackage. The electrical isolation layer may be of a ceramic material. The electrical isolation layer may be embedded within the solid electrically insulating material of the power semiconductor prepackage. The electrical isolation layer may extend in the x-y direction.

The at least one capacitor may be connected to the at least one power electronics switching element through at least one of the conductive layers of the multi-layer planar carrier substrate.

The at least one capacitor may be a ceramic capacitor.

The gate driver circuit may be electrically connected to the gate terminal of each power semiconductor switching element by one or more electrical connections extending in the z-direction.

The power electronics converter may further include a heat sink for removing heat from power semiconductor prepackages.

The converter may further include a thermal interface layer (TIL) between a heat removal side of the prepackage and the heat sink. The heat removal side of the prepackage is opposite the electrical connection side of the prepackage.

The at least one prepackage may be located between the multi-layer carrier substrate and the heat sink. The heat sink may include one or more recessed regions defining one or more chambers for receiving the prepackages. Adjacent chambers may be separated by a wall.

The at least one prepackage may be embedded within the multi-layer carrier substrate. The heat sink may be located adjacent to the heat removal side of the prepackage opposite the electrical connection side of the prepackage.

A converter parameter η may be greater than or equal to 100 kW/m³K. η is a heat transfer coefficient between the heat removal side of the power semiconductor prepackage and a cooling medium of the heat sink divided by the size in the z-direction of the gap between the heat removal side of the power semiconductor prepackage and the heat sink. Accordingly, η may be expressed as:

$$\eta = \frac{h}{G_3} \quad (8)$$

In this equation, h is the heat transfer coefficient between the heat removal side of the power semiconductor prepackage and the cooling medium of the heat sink, and $G_3$ is the size in the z-direction of the gap between the heat removal side of the power semiconductor prepackage and the heat sink. The converter parameter η may be greater than or equal to 500 kW/m³K, greater than or equal to 1 MW/m³K, or greater than or equal to 10 MW/m³K. The converter parameter η may be less than or equal to 1000 MW/m³K, less than or equal to 500 MW/m³K, less than or equal to 150 MW/m³K, or less than or equal to 100 MW/m³K. The converter parameter η may be in the range 1 MW/m³K to 1000 MW/m³K, in the range 10 MW/m³K to 100 MW/m³K, in the range 20 MW/m³K to 50 MW/m³K, in the range 125 kW/m³K to 75 MW/m³K, in the range 30 MW/m³K to 45 MW/m³K, or in the range 35 MW/m³K to 40 MW/m³K.

The heat transfer coefficient between the heat removal side of the power semiconductor prepackage and a cooling medium of the heat sink, h, may be greater than or equal to 0.1 kW/m²K, greater than or equal to 1 kW/m²K, or greater than or equal to 5 kW/m²K. h may be less than or equal to 50 kW/m²K, less than or equal to 30 kW/m²K, or less than or equal to 20 kW/m²K. h may be in the range 2.5 kW/m²K to 15 kW/m²K or in the range 5 kW/m²K to 10 kW/m²K. The size in the z-direction of the gap between the heat removal side and the heat sink, $G_3$, may be less than or equal to 2 mm, less than or equal to 1 mm, less than or equal to 0.8 mm, or less than or equal to 0.5 mm. $G_3$ may be greater than or equal to 0.05 mm, greater than or equal to 0.1 mm, or greater than or equal to 0.2 mm.

The thermal interface layer (TIL) may have a thermal conductivity and a mechanical compressibility.

A converter parameter Ω may satisfy 0.1 MNK/Wm<Ω<1 GNK/Wm. Ω is the mechanical compressibility of the thermal interface layer divided by the thermal conductivity of the thermal interface layer. Accordingly, Ω may be expressed as:

$$\Omega = \frac{M}{k} \quad (9)$$

In this equation, M Is the mechanical compressibility of the thermal interface layer and k is the thermal conductivity of the thermal interface layer. Ω may be greater than or equal to 0.2 MNK/Wm, greater than or equal to 0.4 MNK/Wm, or greater than or equal to 0.6 MNK/Wm. Ω may be less than or equal to 500 MNK/Wm, less than or equal to 100 MNK/Wm, less than or equal to 10 MNK/Wm, or less than or equal to 5 MNK/Wm. Ω may be in the range 0.25 MNK/Wm to 2 MNK/Wm, in the range 0.7 MNK/Wm to 1.5 MNK/Wm, in the range 0.7 MNK/Wm to 1.5 MNK/Wm, or in the range 0.8 MNK/Wm to 0.9 MNK/Wm.

The mechanical compressibility of the thermal interface layer, M, may be less than or equal to 3000 MN/m² (300 MPa), may be less than or equal to 100 MN/m² (10 MPa), or may be less than or equal to 10 MN/m² (1 MPa). M may be greater than or equal to 0.5 MN/m² (0.05 MPa). M may be in the range 1 MN/m² (0.1 MPa) to 5 MN/m² (0.5 MPa) or in the range 2.5 MN/m² (0.25 MPa) to 3.5 MN/m² (0.35 MPa).

The thermal conductivity of the thermal interface layer, k, may be less than or equal to 100 W/mK, less than or equal to 25 W/mK, less than or equal to 10 W/mK, or less than or equal to 5 W/mK. k may be greater than or equal to 0.5 W/mK or greater than or equal to 1 W/mK. k may be in the range 2 W/mK to 10 W/mK or in the range 3 W/mK to 4 W/mK.

The thickness (e.g., size in the z-direction) of the thermal interface layer may be in the range 0.05 mm to 3 mm, in the range 0.075 mm to 1.5 mm, in the range 0.1 mm to 0.75 mm, or in the range 0.15 mm to 0.25 mm.

An electrical isolation layer may be arranged between the one or more power semiconductor switching elements of the prepackage and the heat sink. The electrical isolation may form part of the power prepackage or be between the prepackage and the heat sink. The electrical isolation layer may be arranged between the prepackage and the thermal interface layer. The electrical isolation layer may be arranged between the thermal interface layer and the heat sink.

A converter parameter ρ may be greater than or equal to 5 MVW/m²K. ρ is a product of a thermal conductivity of the thermal interface layer and a breakdown electrical field strength of the electrical isolation layer. Accordingly, ρ may be expressed as:

$$\rho = k \times E_{Break} \quad (10)$$

In this equation, k is the thermal conductivity of the thermal interface layer and $E_{Break}$ is the breakdown electric field strength (which may also be referred to as a dielectric strength) of the electrical isolation layer. ρ may be greater than or equal to 10 MVW/m²K, greater than or equal to 25 MVW/m²K, or greater than or equal to 50 MVW/m²K. ρ may be less than or equal to 25 GVW/m²K, less than or equal to 5 GVW/m²K, less than or equal to 500 MVW/m²K, or less than or equal to 250 MVW/m²K. ρ may be in the range 25 MVW/m²K to 5 GVW/m²K or in the range 50 MVW/m²K to 250 MVW/m²K.

The breakdown electric field strength (e.g., dielectric strength), $E_{Break}$, of the electrical isolation layer may be greater than or equal to 5 kV/mm. $E_{Break}$ may be less than or equal to 250 kV/mm. $E_{Break}$ may be in the range 10 kV/mm to 50 kV/mm, in the range 10 kV/mm to 100 kV/mm, or in the range 15 kV/mm to 25 kV/mm.

The thickness (e.g., size in the z-direction) of the thermal interface layer may be in the range 0.05 mm to 3 mm, in the range 0.075 mm to 1.5 mm, in the range 0.1 mm to 0.75 mm, or in the range 0.15 mm to 0.25 mm.

The thickness (e.g., size in the z-direction) of the electrical isolation layer may be in the range 0.025 mm to 2 mm, in the range 0.025 mm to 1 mm, in the range 0.05 mm to 1 mm, in the range 0.1 mm to 0.8 mm, or in the range 0.2 mm to 0.3 mm.

The thermal interface layer may have a relatively low electrical conductivity (e.g., a high dielectric strength) so as to reduce the dependence of the converter on additional electrical isolation measures such as the inclusion of the dedicated electrical isolation layer described above. Hence, some embodiments may not include an electrical isolation layer. In such embodiments, a converter parameter λ may be greater than or equal to 1 TW/SK, λ being defined as a thermal conductivity of the thermal interface layer divided by an electrical conductivity of the thermal interface layer. The converter parameter λ may be expressed as:

$$\lambda = \frac{k}{P} \quad (11)$$

In this equation, k is the thermal conductivity of the thermal interface layer and P is the electrical conductivity of the thermal interface layer. λ may be less than or equal to 100 PW/SK, less than or equal to 10 PW/SK, less than or equal to 1 PW/SK, or less than or equal to 500 TW/SK. λ may be greater than or equal to 10 TW/SK, greater than or equal to 50 TW/SK, greater than or equal to 100 TW/SK, or greater than or equal to 200 TW/SK. λ may be in the range 100 TW/SK to 500 TW/SK or in the range 300 TW/SK to 400 TW/SK.

The electrical conductivity of the thermal interface layer, P, may be less than or equal to 0.1 pS/m (e.g., $1 \times 10^{-13}$ S/m). P may be greater than or equal to 1 fS/m (e.g., $1 \times 10^{-15}$ S/m). P may be in the range 5 fS/m to 50 fS/m or in the range 7.5 fS/m to 25 fS/m.

The thermal conductivity of the thermal interface layer, k, may be greater than or equal to 0.1 W/mK. k may be less than or equal to 150 W/mK. k may be in the range 0.5 W/mK to 100 W/mK, in the range 1 W/mK to 25 W/mK, in the range 2 W/mK to 10 W/mK, or in the range 2.5 W/mK to 5 W/mK.

The multi-layer planar carrier substrate may include at least one outer conductive layer and/or at least one internal conductive layer. The at least one inner conductive layer may be thicker than (e.g., at least twice or at least three times as thick as) the outer conductive layer. The outer conductive layer and the inner conductive layer may be electrically connected by at least one connection (e.g., a plurality of connections) extending in the z-direction through the carrier substrate. Each power semiconductor prepackage may further include an electrical connection from at least one terminal of the one or more power semiconductor switching elements to the outer conductive layer of the multi-layer planar carrier substrate. The electrical connection extends in the z-direction through the solid insulating material.

Each power semiconductor prepackage may further include an electrical connection from at least one of its terminals to an electrical connection side of the power semiconductor prepackage. The electrical connection extends in the z-direction through the solid insulating material. Electrical connections may extend from each of the terminals to the electrical connection side of the power semiconductor prepackage, each electrical connection extending in the z-direction through the solid insulating material.

At least one of the terminals of each of the at least one power semiconductor switching elements may be connected to at least one of the conductive layers of the multi-layer planar carrier substrate at the electrical connection side of the power semiconductor prepackage. The at least one of the terminals may be a source and/or drain terminal of the power semiconductor switching element.

For each power semiconductor prepackage, the electrical connection side of the prepackage may form a flat surface. The prepackage may be surface mounted at its electrical connection side to a planar surface of the multi-layer planar carrier substrate.

For each power semiconductor prepackage, each electrical connection extending from the at least one of the terminals of the power semiconductor switching element through the solid insulating material may terminate at the flat surface of the prepackage. Each power semiconductor prepackage may be surface mounted to the surface of the multi-layer planar carrier substrate by soldering, sintering, or gluing of the terminated electrical connection to an electrical connection of the multi-layer planar carrier substrate.

The flat surface of the electrical connection side may further include conductive pads (e.g., solder pads) for connecting the terminals of the power semiconductor switching element to the surface of the multi-layer planar carrier substrate.

The terminated electrical connection may be connected (e.g., soldered, sintered, or glued) to an external conductive layer of the multi-layer carrier substrate. These connections space apart each power semiconductor prepackage from the planar surface of the multi-layer planar carrier substrate to define a gap (referred to herein as the prepackage gap) between the multi-layer planar carrier substrate and the electrical connection side.

In a group of embodiments, a power electronics converter may include a first multi-layer planar carrier substrate and a second multi-layer planar carrier substrate. The first multi-layer planar carrier substrate defines an x-y direction parallel to a planar surface of the first multi-layer planar carrier substrate and a z-direction perpendicular to the x-y direction. The first multi-layer planar carrier substrate has one or more electrically conductive layers extending in the x-y direction. The second multi-layer planar carrier substrate is spaced apart from the first multi-layer planar carrier substrate in the z direction. A planar surface of the second multi-layer planar carrier substrate is parallel to the planar surface of the first multi-layer planar carrier substrate. The second multi-layer planar carrier substrate has one or more electrically conductive layers extending in the x-y direction.

The power electronics converter may include a converter commutation cell circuit including a plurality of commutation cell components. The plurality of commutation cell components are electrically connected together via the one or more electrically conductive layers of the first planar carrier substrate and electrical connections extending in the z-direction. The plurality of commutation cell components include one or more power semiconductor switching elements included in one or more power semiconductor prepackages. Each power semiconductor prepackage includes a power semiconductor switching element embedded in a solid insulating material. The power electronics converter may further include one or more additional converter components electrically connected to the one or more electrically conductive layers of the second planar carrier substrate. The power electronics converter may further include one or more further electrical connections extending in the z-direction connecting together one or more of the electrically conductive layers of the first carrier substrate and one or more of the electrically conductive layers of the second carrier substrate.

The second multi-layer planar carrier substrate and the one or more power semiconductor prepackages may be located on opposite sides of the first multi-layer planar carrier substrate. In otherwords, without loss of generality, if the first multi-layer planar carrier substrate defines a z=0 plane, the second multi-layer planar carrier substrate may be spaced apart in the +z-direction (e.g., positive z-direction) from the first multi-layer planar carrier substrate, whereas the power semiconductor prepackages may be located in the −z-direction (e.g., negative z-direction).

The plurality of commutation cell components may further include one or more capacitors and/or a gate driver circuit.

Each power semiconductor switching element of the one or more power semiconductor switching elements may be a Silicon Carbide (SiC) power semiconductor switching element. A blocking voltage of each power semiconductor switching element may be greater than or equal to 800 V.

The one or more additional converter components may not form part of the commutation cell of the power electronics converter. The one or more additional converter components may include an AC filter, one or more sensors for sensing one or more operating conditions of the power electronics converter, a protection circuit, an auxiliary power supply, a logic circuit, or any combination thereof. The one or more additional converter components include a protection circuit in the form of a solid-state power controller (SSPC).

Each power semiconductor prepackage of the one or more power semiconductor prepackages may be surface mounted to a planar surface of the first multi-layer planar carrier. For each respective power semiconductor prepackage of the one or more power semiconductor prepackages, a gap measured in the z-direction between the planar surface of the first multi-layer planar carrier and the respective power semiconductor prepackage may be less than or equal to 300 µm.

The power electronics converter may further include a heat sink spaced apart from the first multi-layer planar carrier substrate in a −z direction opposite the +z direction and configured to remove heat from heat-generating components of the converter commutation cell. The heat sink may be further configured to remove heat from one or more heat-generating components of the one or more additional converter components electrically connected to the one or more electrically conductive layers of the second planar carrier substrate. The power electronics converter may include one or more thermally conductive elements extending in the z-direction from the second multi-layer planar carrier substrate to the first multi-layer planar carrier substrate to increase a rate of heat transfer from the one or more heat-generating components of the one or more additional converter components to the heat sink. The heat sink may be further configured to remove heat from an electrical machine to which the power electronics converter is electrically connected. The power electronics converter may be provided within a first housing, and the electrical machine may be provided within a second housing. The heat sink may form at least a portion of a shared wall shared by the first housing and the second housing.

The power electronics converter may have an AC connection for connection to an AC electrical load. The power electronics converter may be provided within a housing arranged to electromagnetically shield the AC connection.

The power electronics converter may further include a third multi-layer planar carrier substrate spaced apart from the second multi-layer planar carrier substrate in the +z direction. A planar surface of the third multi-layer planar carrier substrate may be parallel to the planar surfaces of the first multi-layer planar carrier substrate and the second multi-layer planar carrier substrate.

The power electronics converter may further include a controller for controlling operations of the power electronics converter. The third multi-layer planar carrier substrate may electrically connect the controller to one or more commutation cell components of the plurality of commutation cell components and to at least one additional converter component of the one or more additional converter components via one or more electrical connections extending in the z-direction.

Each power semiconductor switching element of the one or more power semiconductor switching elements may include a gate terminal. The commutation cell components or the at least one additional converter component may include a gate driver circuit electrically connected to and configured to provide switching signals to the gate terminal of each of the one or more power semiconductor switching elements. The controller may be configured to supply switching control signals to the gate driver circuit. A voltage of the switching control signals may be lower than a voltage of switching signals.

The power electronics converter may be an AC-DC converter (e.g., an inverter or a rectifier). The AC-DC converter may be a multi-phase AC-DC converter. For each phase of the plurality of phases, the power circuit may include a phase leg. In this case, the parasitic inductance of the power circuit of the commutation cell is the parasitic inductance of one phase leg. Those skilled in the art will understand that, aside from inherent variation due to variation in components and manufacture, the parasitic inductance of each phase leg is the same.

The AC-DC converter may be a two-level converter including two logical switches per phase. The number of power semiconductor prepackages per logical switch may be greater than or equal to three. In some examples, a multi-phase (e.g., three-phase or four-phase) AC-DC converter includes greater than 50 power semiconductor prepackages.

The power electronics converter may be a DC-DC converter. The power circuit of the commutation cell may further include an inductor.

The at least one capacitor may be a single capacitor (e.g., a single "DC-link" capacitor or "input capacitor"). In other examples, a more complex DC filter including a plurality of capacitors may be used.

The electrical machine may be of any suitable type and configuration. In one specific example, the electrical machine is a transversal flux (e.g., transverse flux) electrical machine. The transversal flux electrical machine may be air-cooled. The transversal flux electrical machine and the power semiconductor prepackages may both be air-cooled by a common cooling system.

According to one embodiment, the shape constraint is a two-dimensional shape constraint: The shape constraint may be defined as an area. Although a power electronics converter extends in three dimensions, it may be that in terms of design restrictions, only two dimensions (e.g., a surface) are relevant. This may imply that the required shape to accommodate the power electronics converter in an x-direction and a y-direction is given but an extension in a z-direction is arbitrary (e.g., there may be sufficient space in the z-direction that the size of the power electronics converter in the z-direction is not meaningfully constrained).

A two-dimensional shape constraint may be defined as a rectangle with a length and a width. In other embodiments, the two-dimensional shape constraint may be defined as any other two-dimensional geometric shape such as, for example, a circle, a circular segment, a trapezoid, a parallelogram, an annular segment shape constraint, or any other polygon or shape. The two-dimensional shape constraint may be defined in a plane parallel to the multi-layer carrier substrate.

"Obtaining a multi-layer carrier substrate according to the selected shape" implies that a multi-layer carrier substrate is selected such that the multi-layer carrier substrate fits inside (e.g., does not exceed) the boundaries defined by the shape constraint. In the case of a two-dimensional shape constraint, where the height (e.g., the extension in the z-direction) is not relevant, the boundaries are defined in the x-direction and the y-direction.

The shape constraint may be defined by an installation space and may be configured to accommodate the at least one multi-layer carrier substrate including the power semiconductor prepackages and/or other components arranged on the multi-layer carrier substrate.

The shape constraint may be defined as a volume. Such a three-dimensional shape constraint takes into account that space constraints for a power electronics converter module may exist in three dimensions. A three-dimensional shape constraint may be defined as a cuboid with a length, a width, and a height. In other embodiments, the three-dimensional shape constraint may be defined as any other three-dimensional geometric shape, such as a cylinder, a hollow cylinder, a circumferential segment of a cylinder or of a hollow cylinder (e.g., a hollow cylindrical segment shape constraint), a disc, or any other three-dimensional body.

A three-dimensional shape constraint may be defined as an extruded form of any of the above mentioned two dimensional geometric shapes. In other words, a height (e.g., in the z-direction) may be added to any two-dimensional shape constraint to form a three-dimensional shape constraint.

In some embodiments, a three-dimensional shape constraint may include a plurality of space segments. Thus, according to these embodiments, a multi-layer carrier substrate may be obtained according to each space segment. In other words, a power converter according to these embodiments may include a number (e.g., a plurality) of multi-layer carrier substrates according to the number of space segments. For example, a space segment may be a planar space segment, where each planar space segment of a shape constraint represents or accommodates a (e.g., one) multi-layer carrier substrate of a power electronics converter. A planar space segment itself may be considered a two-dimensional space constraint. A plurality of space segments may be arranged parallelly and/or vertically adjacent. At least two space segments may be arranged vertically adjacent to accommodate at least two stacked multi-layer carrier substrates. A planar space segment may be a relatively flat space segment, with a height (e.g., in the z direction) significantly smaller than a width or a length (e.g., in the x direction or the y direction) of the space segment. In other words, the space may include a plurality of planar space segments, where each planar space segment of the plurality of planar space segments includes one of the multi-layer carrier substrates.

The space segments (e.g., the planar space segments) may be arranged in a non-coplanar manner (e.g., along an arcuate, circular, or polygonal line). For example, the space segments may be arranged circumferentially around a component of the electrical power system, such as a stator of an electrical machine of the electrical power system. Such installation space may result in, for example, a hollow cylindrical segment shape constraint. Electrical machines often have a circular or cylindrical shape. As such, distribution (e.g., circumferential distribution) of multi-layer carrier substrates or power electric converters may be advantageous in terms of a space saving design. Also, from a thermal management point of view, the distribution of space segments along a line may be advantageous, as the surface for heat exchange is increased, and/or a thermally conductive connection to cooling (e.g., a cooling device), such as cooling (e.g., a cooling device) for the stator, may be established.

The shape constraint may be defined by an installation space defined by at least one of the following components: a stator housing, a battery pack housing, a power electronics converter housing, a cooling duct housing, and a gas turbine housing. Additionally or alternatively, the shape constraint and/or installation space may be defined by other structures or components of the aircraft, such as the airframe, wing, pylon, air duct, or the like structural or functional component.

According to this disclosure, a further constraint may be provided in the form of a position constraint. The method may include arranging the power semiconductor prepackages on the multi-layer carrier substrate, where the position of each of the power semiconductor prepackages in the x-y plane meets a position constraint. A position constraint may define an area or a space within the shape constraint where certain components of the power electronics converter (e.g., power semiconductors, such as prepackages including one or more power semiconductor switching elements) may be placed from a design point of view. One position constraint may be assigned to one electric component (e.g., to one power semiconductor) of the power electronics converter. For example, one position constraint may be assigned to each power semiconductor of the power electronics converter.

In one embodiment, each power semiconductor prepackage includes precisely one power semiconductor switching element, and the method may further include determining a power rating constraint for the power electronics converter. A number of power semiconductor prepackages is selected according to the power rating constraint. For example, a required power rating of a power electronics converter may be obtained by selecting a number of power semiconductor prepackages (e.g., identical power semiconductor prepackages). This may be advantageous as there may be less or no need to change the design of individual power semiconductor prepackages to accommodate different power ratings (e.g., different power rating constraints).

The position constraint may be or may meet a predefined thermal constraint. Two adjacent position constraints or thermal constraints may define a minimum distance from one power semiconductor prepackage to a neighboring power semiconductor prepackage. This may be advantageous for avoiding the spatial cumulation of heat (e.g., by evenly distributing the power semiconductors over an area). Two adjacent position constraints or thermal constraints may define a maximum distance from one power semiconductor prepackage to a neighboring power semiconductor prepackage. This may be advantageous for accommodating an optimum heat sink size.

A plurality of position constraints may be adapted such that the plurality of power semiconductor prepackages may be arranged in a grid, or in a circular or arcuate or straight line.

The method may include selecting a heat sink for the power electronics converter and forming a thermally conductive connection in the z-direction between a heat removal side of the power semiconductor prepackages and the heat sink.

A plurality of position constraints may be determined such that a plurality of the semiconductor prepackages are arranged in a region of an x-y plane adjacent the heat sink.

Electrically connecting a plurality of power semiconductor prepackages to the obtained multi-layer carrier substrate may include forming electrical connections between the terminals of the power semiconductor switching elements of the plurality of power semiconductor prepackages and one or more of the at least one electrically conductive layer of the obtained multi-layer planar carrier substrate having the selected two-dimensional shape. The electrical connections extend in a direction orthogonal to the carrier substrate.

The space constraint may include a first space segment and a second space segment, where a first multi-layer carrier substrate is obtained according to the first space segment, and a second multi-layer carrier substrate is selected to the second space segment. Such space constraint including a plurality of space segments may be considered a combined space constraint.

The method may include Integrating a second multi-layer carrier substrate of the converter into the electrical power system, where the second multi-layer carrier substrate is spaced apart from the at least one multi-layer carrier substrate in a z-direction.

The method may include assigning the power semiconductor prepackages to the first multi-layer carrier substrate or the second multi-layer carrier substrate. The assigning of each of the power semiconductor prepackages meets a power rating constraint. The first multi-layer carrier substrate, the second multi-layer carrier substrate, or a further multi-layer carrier substrate may include semiconductors for a control unit. The electrical power system is an electrical power system for an aircraft. The shape constraint may be a shape constraint for integrating the converter into an electrical propulsion unit (EPU) of an aircraft, where the EPU includes a propeller or a fan, an electric motor configured to drive rotation of the propeller or the fan, and the converter connected to the electric motor.

An electrical propulsion unit (EPU) for an aircraft is also provided. The EPU includes an electric motor and an AC-DC power electronics converter in accordance the AC-DC power electronics converters set out above. The AC-DC power electronics converter is configured as an inverter and arranged to supply current to a winding of the electric motor.

A gas turbine engine is also provided. The gas turbine engine includes a spool, an electrical machine having a rotor mechanically coupled to the spool, and an AC-DC power electronics converter in accordance the AC-DC power electronics converters set out above. The AC-DC power electronics converter is arranged to supply current to or receive current from a winding of the electric machine.

An electrical power system for an aircraft is also provided. The electrical power system includes a power electronics converter in accordance the power electronics converters set out above.

An aircraft is also provided. The aircraft includes the EPU, the gas turbine engine, or the electrical power system set out above. In one group of embodiments, the aircraft is an electric vertical take-off and landing (eVTOL) aircraft having a plurality of EPUs as set out above.

The skilled person will appreciate that except where mutually exclusive, a feature described in relation to any one of the above aspects may be applied mutatis mutandis to any other aspect. Further, except where mutually exclusive, any feature described herein may be applied to any aspect and/or combined with any other feature described herein.

BRIEF DESCRIPTION OF THE DRAWINGS

Embodiments will now be described by way of example only with reference to the accompanying drawings, which are purely schematic and not to scale, and in which:

FIGS. 18A, 18B, 18C, 18D, 18F, 18G, and 18H show different examples of shape constraints;

FIG. 19 shows a combined shape constraint;

DETAILED DESCRIPTION

Figure 1:
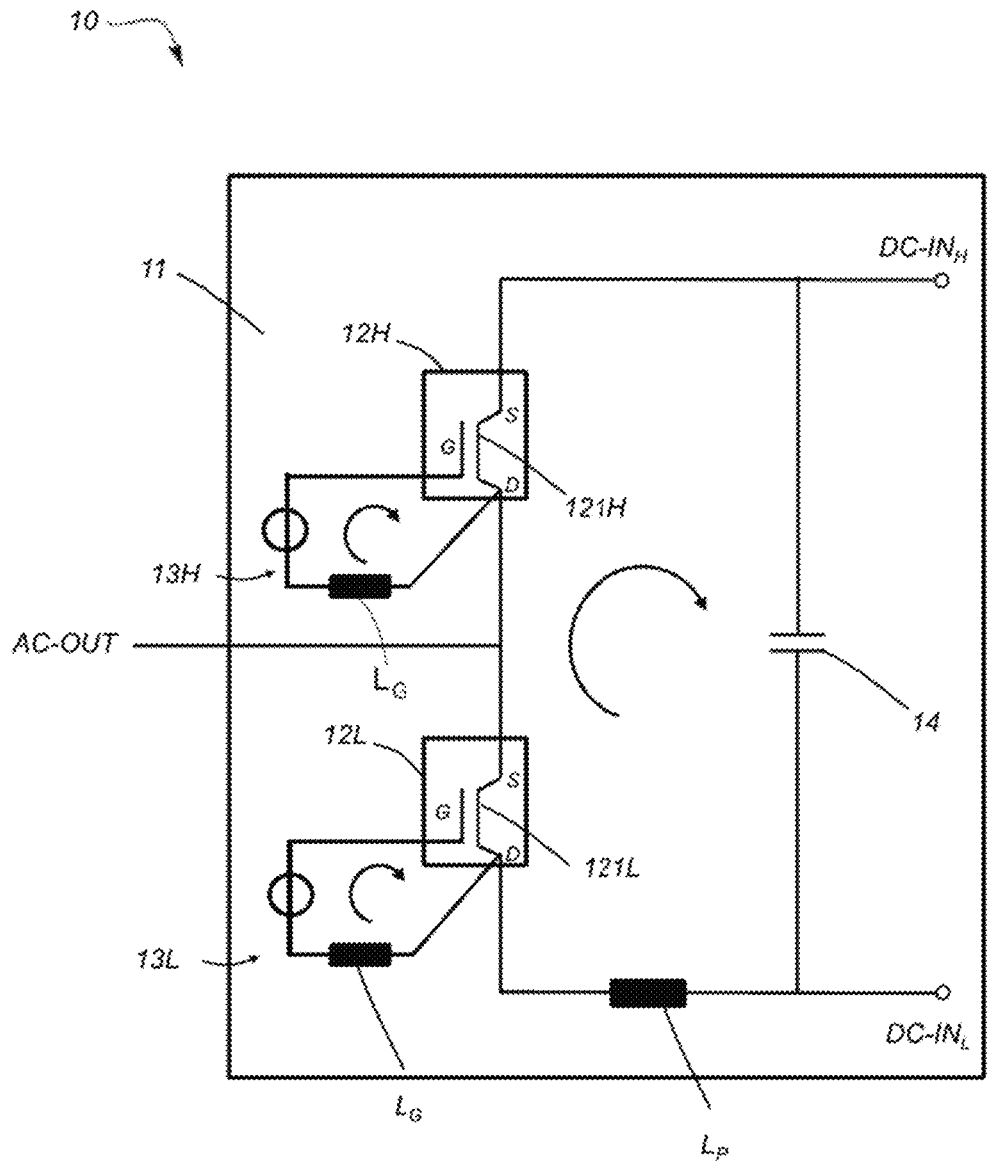
FIG. 1 is circuit diagram of one embodiment of a commutation cell of a one-phase, two-level AC-DC converter.

FIG. 1 is a circuit diagram of a power electronics converter 10. For simplicity and ease of explanation, one phase of a two-level AC-DC inverter is illustrated. The present disclosure is not, however, limited to converters of this circuit type, and further examples are disclosed herein.

The power electronics converter 10 has a commutation cell having two parts: a power circuit and a gate driver circuit.

The power circuit has two DC inputs (DC-IN$_L$ and DC-IN$_H$) and a single-phase AC output (AC-OUT). Connected between the DC inputs and the AC output of the power circuit is a half-bridge circuit including two power semiconductor switching elements 121L, 121H. The letters 'L' and 'H' designate the low- and high-voltage sides of the half-bridge which are connected to the low- and high-voltage DC inputs. The power circuit also includes an intermediate smoothing capacitor 14 (e.g., referred to as the 'DC-link capacitor' in the context of an AC-DC converter). The function of the DC-link capacitor will be familiar to those skilled in the art.

Each power semiconductor switching element 121L, 121H has three terminals. In the case of a MOSFET, the terminals are referred to as the source (S), the drain (D), and the gate (G). Current flowing from the DC inputs to the AC output passes between the source (S) and the drain (D), while the voltage and current at the gate (G) controls whether or not the path between the source (S) and the drain (D) conducts. The power semiconductor switching elements may be MOSFETs (e.g., Silicon Carbide (SiC) based MOSFETs), though other semiconductor technologies such as Galium Nitride (GaN) may be used. As will be understood by those skilled in the art, the use of MOSFETs may allow for the omission of discrete parallel-connected diodes due to the inherent 'body diode' character of a MOSFET.

The gate driver circuit 13L, 13H is electrically connected to and configured to supply switching signals to the gate terminal of the MOSFET 121L, 121H to control the conduction of the MOSFETs (e.g., to control whether current may flow between the source and drain terminals or whether the flow of current is blocked). The gate driver circuit effectively acts as an amplifier of signals received from a controller (not shown) (e.g., a digital controller that operates at and supplies signals having lower voltages, such as 3 V to 5 V). In this example, the gate driver circuit is also connected to the drain terminals of the MOSFETs 121L, 121H, though those skilled in the art will appreciate this is not necessarily the case and that the gate and drain terminals may be isolated from each other.

The power circuit is further shown to include an inductor $L_P$. The inductor $L_P$ is not a discrete component of the power circuit, but instead represents the combined parasitic inductance of the power circuit. Parasitic inductance is the inherent inductance of components and the connections between components that is not intentionally introduced into the circuit. The gate driver circuits 13L, 13H are also shown to include inductors $L_G$; these too represent the parasitic inductances of the gate driver circuits 13L, 13H and are not discrete components.

Parasitic inductance is a notable problem in power electronics converters because parasitic inductance creates a loss mechanism: switching losses. The higher the parasitic inductance, the higher the switching losses. The magnitude of the switching losses also increases with the operating voltage of the power semiconductor switches 121L, 121H and with the switching frequency of the power semiconductor switches 121L, 121H. This provides that a high parasitic inductance also limits a system designer's ability to select higher values of the converter operating voltage and maximum switching frequency, as these are to be kept lower to keep the switching losses at a tolerable level. These are undesirable limitations. The use of a lower voltage necessitates the use of a higher current to achieve the same power (P=I×V), which increases resistive losses (e.g., $I^2R$ losses) in the power circuit and in, for example, electric machine windings to which the converter is connected. The use of a lower switching frequency limits the quality of the output voltage/current waveform, which leads to undesirable effects such a torque ripple in the rotor of an electrical machine connected to the power electronics.

The present disclosure provides power electronics converters with commutation cells having reduced parasitic inductances. As well as reducing the switching losses, this allows the adoption of increased operating voltages, increased switching frequencies, and higher voltage and current ramp rates during switching. Overall, this provides for a significant increase in the operating efficiency of the converters compared with state-of-the-art power electronics converters.

Table 2 provides exemplary values of the parasitic inductance of the power circuit and the maximum operating efficiency of AC-DC converters in the power range 50-400 kW. The powers quoted are peak rated powers (e.g., the highest electrical power that may be controlled by the converter). This differs from the continuous rated power that depends on, for example, environmental conditions during operation and the capabilities of the converter cooling system.

TABLE 2

| | Parasitic Inductance of Power Circuit, $L_P$ (nH) | | Peak Operating Efficiency | |
|---|---|---|---|---|
| Peak Rated Power (kW) | State-of-the-Art Example | Present Disclosure Example | State-of-the-Art Example | Present Disclosure |
| 50 | 40 | 8 | 95% to 96% | 97% to >99% |
| 100 | 20 | 4 | 95% to 96% | 97% to >99% |
| 150 | 15 | 3 | 95% to 96% | 97% to >99% |
| 200 | 10 | 2 | 95% to 96% | 97% to >99% |
| 400 | 5 | 1 | 95% to 96% | 97% to >99% |

Only the parasitic inductance $L_P$ of the power circuit, and not of the whole commutation cell, is quoted. This is because the gate driver circuit is electrically decoupled from the power circuit, and so the parasitic inductances of the two circuits are not combined. It should, however, be appreciated that according to the present disclosure, the close integration of the gate driver circuit within the commutation cell results in a reduced value of $L_G$.

As shown in Table 2, the value of parasitic inductance of power electronics converters according to the present disclosure may be approximately five times lower than the comparable state-of-the-art example. This, along with other measures disclosed herein, results in operating efficiencies up to and in excess of 99%, which compares with values of 95-96% commonly achieved in state-of-the-art power electronics modules.

Table 2 also shows that the parasitic inductance of the power circuit may decrease as the power rating increases. This is because the peak rated power may be increased through parallelization of the power semiconductors of the power circuit (e.g., at higher power ratings each low-side MOSFET 121L of a given phase is implemented by multiple MOSFETs connected in parallel). This parallel connection of the components has the additional effect of reducing the parasitic inductance of the power circuit. While this provides a mechanism for reducing the parasitic inductance of the power circuit to any desired low value, the additional components significantly add to the weight and volume of the converter, reducing the power density.

Thus, a power electronics converter may be characterized by a converter inductance-volume parameter α, defined as the product of the parasitic inductance of the power circuit and the volume of the commutation cell:

$$\alpha = L_P \times \text{Vol.} \quad (12)$$

where:
$L_P$=Parasitic inductance of power circuit, and
Vol.=Smallest cuboidal volume enclosing commutation cell As stated above, the volume is defined as the smallest cuboidal volume that encloses the entire commutation cell (e.g., the combination of the power circuit and the gate driver circuit). An example illustrating the commutation cell volume is shown and will be described with reference to FIGS. 3A and 3B.

Table 3 shows exemplary values of α for power electronics converters according to the present disclosure. The values of α are characteristically lower than the prior art and associated with a combination of high efficiency and high power density. Values of α are quoted in pHm³ (pico-Hm³, or ×10⁻¹² Hm³).

TABLE 3

| Peak Rated Power (kW) | α = $L_P$ × Vol. (pHm³) | | |
|---|---|---|---|
| | Example 1 | Example 2 | Example 3 |
| 50 | 0.60 | 1.70 | 4.80 |
| 100 | 0.42 | 1.20 | 3.40 |
| 150 | 0.37 | 1.04 | 2.94 |
| 200 | 0.30 | 0.85 | 2.40 |
| 400 | 0.21 | 0.60 | 1.70 |

Example values of the parasitic inductance of the power circuit are quoted in Table 2 and may be less than or equal to 16 nH for converters having peak power ratings in the range 25-500 kW. The commutation cell volume may increase with power rating, and values of less than 1,000 cm³ may be provided for converters having powers up to 500 kW. Commutation cell volumes may be greater than or equal to 100 cm³, with volumes of 150 cm³ to 600 cm³ striking a good balance between power density and relative ease of heat removal.

For reference, Table 4 includes values of $\alpha_p$, which is the power-normalized value of α, and values of the product of the power and parasitic inductance of the power circuit.

TABLE 4

| Peak Rated Power (kW) | $\alpha_P = \alpha/P$ (aHm³/W) | | $L_P$*P (mHW) | |
|---|---|---|---|---|
| | Example 1 | Example 2 | Example 1 | Example 2 |
| 50 | 12 | 96 | 0.2 | 0.8 |
| 100 | 4.2 | 34 | 0.2 | 0.8 |
| 150 | 2.5 | 20 | 0.2 | 0.8 |
| 200 | 1.5 | 12 | 0.2 | 0.8 |
| 400 | 0.7 | 5.7 | 0.2 | 0.8 |

Returning to FIG. 1, although a circuit diagram, the components of the commutation cell are shown to be located on a carrier substrate 11. The carrier substrate 11 is a multi-layer carrier substrate 11 (e.g., a rigid printed circuit board (PCB)) including alternating insulating and conductive layers that extend in the x-y plane. The components of the commutation cell, including both the power circuit and gate driver circuit, are mounted on the multi-layer planar carrier substrate 11 and are electrically connected through the multi-layer carrier substrate 11. The electrical connections are made through a combination of the conductive layers of the multi-layer carrier substrate 11 and connections extending through the carrier substrate 11 in a z-direction defined perpendicular to the x-y direction of the planar substrate and its conductive layers. The connections extending the z-direction may, for example, be conductive vias or filled holes (e.g., laser micro-vias having diameters of the order of 100 μm) and may have an x- and/or y-component as well as z-component (e.g., the connections may be parallel to or form an angle with respect to the z-direction).

FIG. 1 also schematically illustrates that the power semiconductor switching elements 121L, 121H of the power circuit are each included in a power semiconductor prepackage 12L, 12H. Those skilled in the art will understand this to provide that the power semiconductors (e.g., MOSFETs) are embedded in a solid insulating material that electrically isolates the power semiconductors and their terminals from their surroundings. The prepackages and their connections to each other and to other components of the commutation cell will be described in more detail below.

Figure 2A:
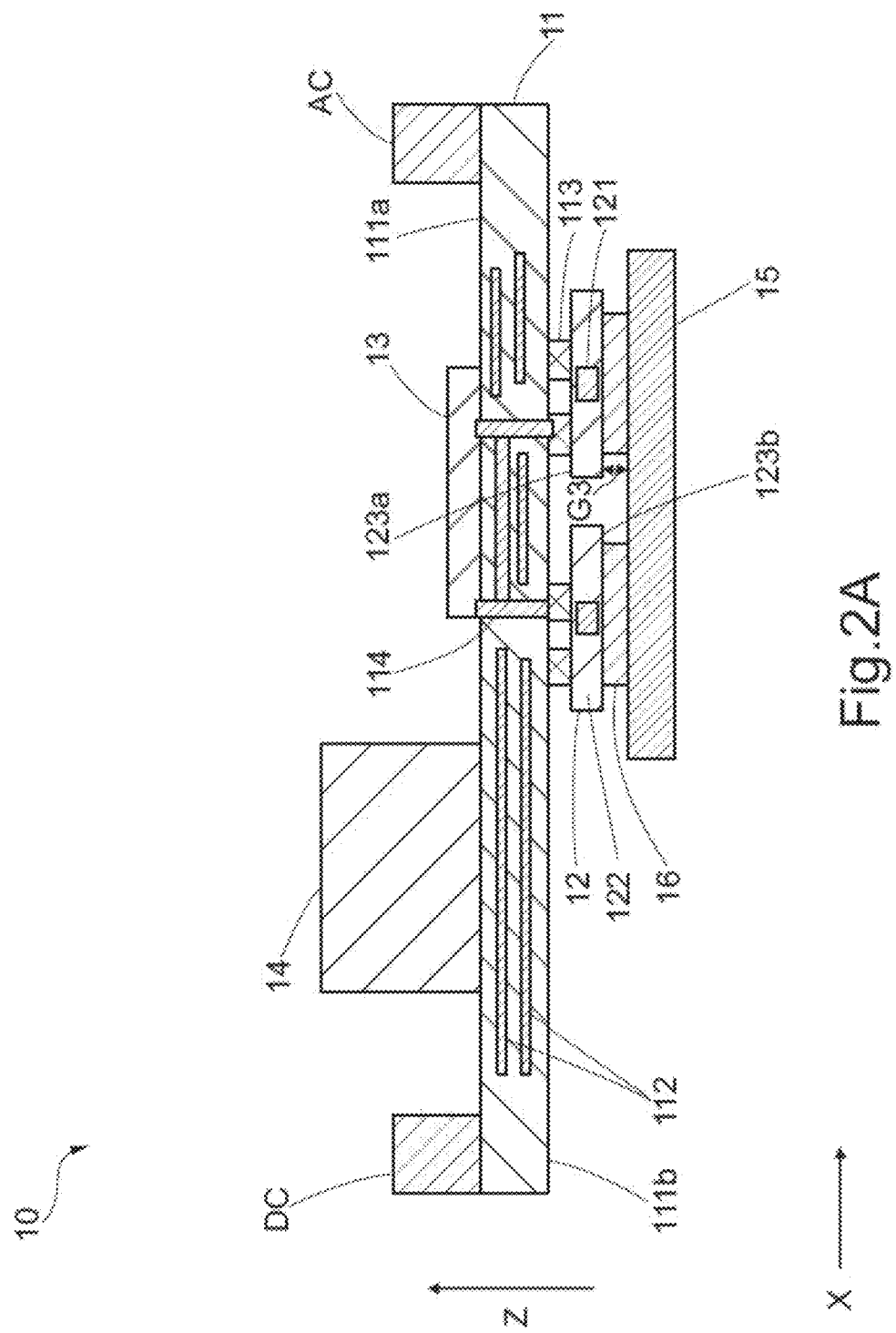
FIG. 2A is a schematic cross-section of the one-phase, two-level AC-DC converter of FIG. 1.

FIG. 2A is a schematic cross-section of a power electronics converter 10 in accordance with the present disclosure. Again, for clarity and ease of explanation, one phase of a two-level AC-DC converter is illustrated. The x-direction and z-direction are indicated. The y-direction extends into the plane of the page.

The converter 10 includes a multi-layer carrier substrate 11, power semiconductor prepackages 12, a gate driver circuit 13, an intermediate (DC-link) capacitor 14, DC inputs (DC-IN), and an AC output (AC-OUT). FIG. 2A further illustrates an integrated heat sink 15 that interfaces with a cooling side (also referred to herein as the heat removal side) of the prepackages 12 via a thermal interface layer 16.

The multi-layer carrier substrate 11 has opposed first and second planar surfaces 111a and 111 b that define an x-y direction and a z-direction perpendicular to the x-y direction. The multi-layer substrate 11 includes alternating layers of insulating and electrically conductive material. The electrically conductive layers 112 may be formed of copper, though the electrically conductive layers 112 may be formed of any suitable conductive material such as silver, gold, or aluminum. The insulating layers may be formed of the base material of the carrier substrate 11.

The multi-layer carrier substrate 11 may be a rigid PCB, in which case the base material and conductive layers may be a glass woven fabric impregnated with resin, as is known in the art of PCB manufacture. The multi-layer carrier substrate 11 may, however, take a different form (e.g., a ceramic-based carrier substrate or a flexible PCB having flexible polymer film base). A rigid material may be used, partly so that the carrier substrate 11 may effectively act as a structural component of the converter 10.

The number of layers in the multi-layer carrier substrate 11 may vary between applications, partly depending on the specifics of the power circuit (e.g., the number of phases in an AC-DC converter and the number of power semiconductors connected in parallel in each logical switch). In one specific example, there are sixteen layers, including eight insulating layers and eight conductive layers 112.

Figure 4A:
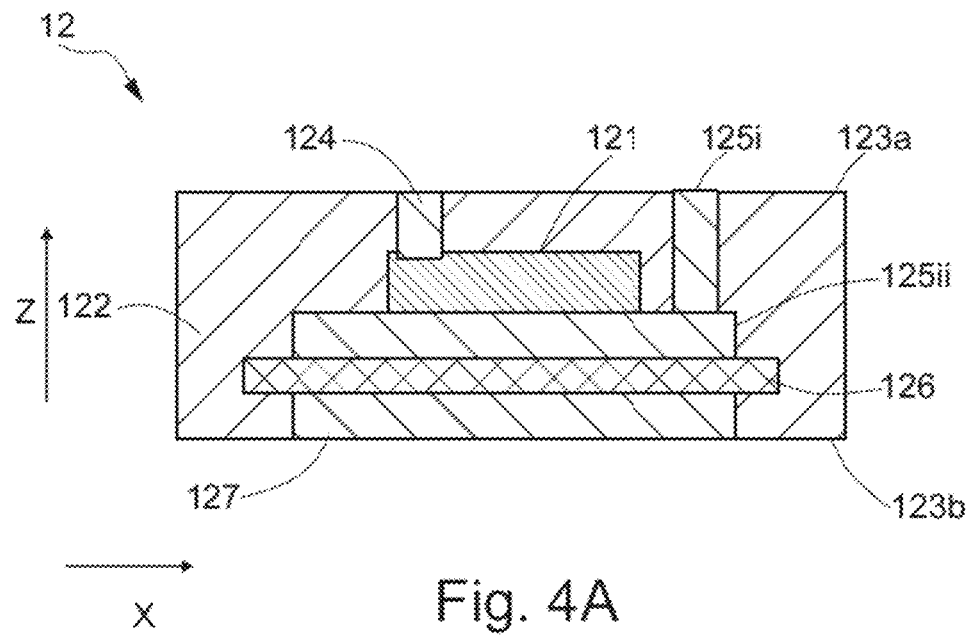
FIG. 4A is a schematic cross-section of a single power semiconductor prepackage, showing details not visible in FIGS. 2A and 3A.
Figure 4B:
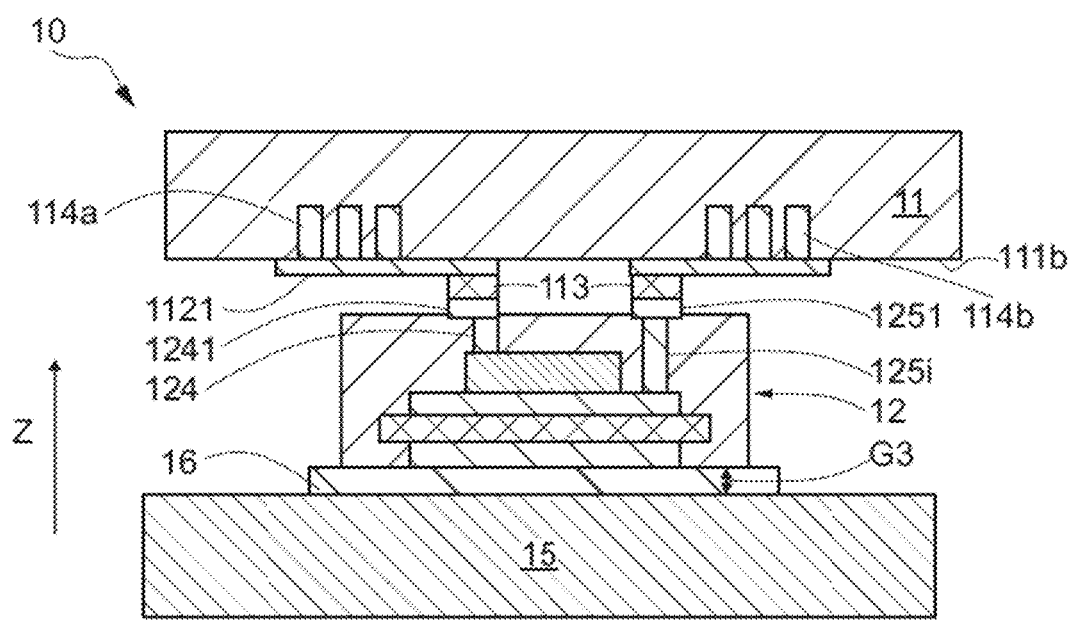
FIG. 4B is a schematic cross-section of the power semiconductor prepackage of FIG. 4A sandwiched between a multi-layer carrier substrate and a heat sink.

Referring to FIG. 4B, in some examples, at least a portion of one of the planar surfaces 111b of the carrier substrate 11 carries a metal layer 1121 that defines one or more electrical connection regions on the surface 111b of the substrate 11. Referring again to FIG. 2A, additionally or alternatively to the outer layer, electrical connections in the form of, for example, vias or filled holes vias 114 extend in the z-direction through the carrier substrate 11 and terminate at the planar surface 111b. The points at which the electrical connections 114 terminate define electrical connection points at the planar surface 111b of the carrier substrate 11.

Each prepackage 12 includes a power semiconductor switching element 121 embedded in a solid insulating material 122. Embedding the power semiconductor switching elements 121 in solid insulating material provides there are no air gaps surrounding the semiconductor chips and the terminals, reducing the risk of electrical breakdown even where high converter voltages are used. This allows higher voltages to be used and/or for the power semiconductors 121 and other components to be spaced closer together, increasing the power density of the converter 10.

Table 5 provides exemplary values of the maximum blocking voltage (e.g., the source-drain blocking voltage or 'rated voltage') of the power semiconductor switching elements 121 in accordance with the present disclosure.

TABLE 5

| Peak Rated Power (kW) | Power Semiconductor Blocking Voltage (V) | | |
|---|---|---|---|
| | Example 1 | Example 2 | Example 3 |
| 50 | 1200 | 800 | 1600 |
| 100 | 1200 | 800 | 1600 |
| 150 | 1200 | 800 | 1600 |
| 200 | 1200 | 800 | 1600 |
| 400 | 1200 | 800 | 1600 |

As shown, the source-drain blocking voltages utilized in accordance with the present disclosure are high. The blocking voltage may be in the range of 600 V to 1,800 V, and values greater than or equal to 800 V may be provided to limit the peak current and reduce conduction losses. State of the art power electronics converters may have much lower blocking voltages, with voltages of even 600 V being rare. As also shown, the blocking voltage does not increase with the peak power of the converter. This is because most or all the increase in peak rated power is achieved through parallelization in the power circuit. In other examples, a somewhat higher blocking voltage may be used for converters with higher power ratings (e.g., higher than 200 kW).

Each power semiconductor switching element 121 may have at least three terminals, including a gate terminal (G) for switching the conduction state of the switching element 121. In some embodiments, the power semiconductor switching element 121 may have more than three terminals (e.g., if one or more terminals are provided for measurement, such as a Kelvin terminal) or if additional shorted terminals are present. In embodiments, the power semiconductor switching elements 121 are MOSFETs, in which case the terminals are designated the source (S), gate (G), and drain (D). In principle, however, other materials semiconductor switching devices (e.g., IGBTs) may be used in place of MOSFETs. The solid insulating material 122 may be any suitable insulating material (e.g., FR4).

As will be described in more detail below with reference to FIGS. 4A-4B, electrical connections extend from the terminals of the power semiconductor switching elements 121 through the solid insulating material 122 and terminate at an electrical connection side/surface 123a of the prepackage 12. Thus, the electrical connection side 123a of the prepackage 12 forms a substantially flat surface with exposed electrical connection points.

The electrical connection side of the prepackages 123a faces one of the planar surfaces 111b of the carrier substrate 11. The prepackages 12 are surface mounted at their flat electrical connection sides 123a to the planar surface 111b, for example, by soldering, sintering, or gluing (e.g., sinter gluing using a mix of glue and sinter paste) the electrical connection points of the prepackages 12 to the electrical connection points or region(s) of the planar surface of the carrier substrate 11. FIG. 2A schematically illustrates soldered/sintered/glued connections 113.

The thickness (e.g., the size in the z-direction) of the connections 113, which define a prepackage gap between the opposed surfaces 123a, 111b of the prepackages 12 and the carrier substrate 11, is small. For example, the thickness and gap may be, when measured parallel to the z-direction, less than 500 μm (e.g., between 20 μm and 250 μm). In a specific embodiment, the gap is 100 μm.

Terminating the electrical connections from the chip terminals at a flat surface 123a of the prepackage 12 and using surface mounting to form the onward electrical connections through the PCB reduces the overall size of the converter 10 in the z-direction, which reduces the size and weight of the converter 10. Further, the surface mounting of the prepackages 12 reduces the impact of 'open loop' effects in the electrical connections between the power semiconductors 121, the gate driver circuit 13, and the DC-link capacitor 14. This may substantially reduce the parasitic inductance of the commutation cell, which reduces switching losses and allows the use of, for example, an increased switching frequency.

The gate driver circuit 13 is electrically connected to and configured to supply switching signals to the gate terminals of the power semiconductor switching elements 121. In the illustrated embodiment, the gate driver circuit 13 is mounted to the first planar surface 111a of the carrier substrate 11, opposite to the second planar surface 111b that faces the power semiconductor prepackages 12. In other embodiments, the prepackages 12 and the gate driver circuit 13 may be mounted at the same side of the carrier substrate 11 (e.g., the second side 111b). In the illustrated embodiment, the electrical connection 114 between the gate driver circuit 13 and the gate terminals of the power semiconductor switching elements 121 extends in the z-direction through the carrier substrate to the surface 111b of the carrier substrate 11. The onward path then passes through a solder connection 113 and then through the electrical connection that passes in the z-direction through the solid insulating material 122 of the prepackages 12 to the gate terminal. In other embodiments, the connection between the gate driver circuit 13 and the gate terminals may be made through one or more conductive layers 112 of the substrate 11.

Table 6 provides exemplary values of the switching frequency of the power semiconductor switching elements of a power electronics converter in accordance with the present disclosure. Table 6 also includes maximum absolute values of the rate of change of the source-drain voltage (measured in units of kilo-Volts per micro-second) of the power semiconductor switching elements 121 during a switching cycle. The quoted values are maximum values of the switching frequency to occur during operation.

TABLE 6

| Peak Rated Power (kW) | $f_{max}$ (kHz) | | $|dV/dt|_{max}$ (kV/µs) | |
|---|---|---|---|---|
| | Example 1 | Example 2 | Example 1 | Example 2 |
| 50 | 50 | 80 | 30 | 45 |
| 100 | 50 | 80 | 30 | 45 |
| 150 | 50 | 80 | 30 | 45 |
| 200 | 50 | 80 | 30 | 45 |
| 400 | 50 | 80 | 30 | 45 |

In many converter arrangements, the switching frequency of each power semiconductor switching element 121 is the same and the same voltage value is used, such that the maximum values quoted above are the same for each individual power semiconductor switching element 121. However, some converter architectures (e.g., multi-level converter architectures such as modular multi-level converter architectures) that interface with multiple network voltage levels use different voltages and/or switching frequencies for different power semiconductor switching elements 121. In these cases, the quoted values correspond to the maximum value of any individual power semiconductor switching element 121 in the converter.

Converters according to the present disclosure use maximum frequencies greater than 10 kHz, though switching frequencies in excess of 30 kHz may be provided, which as discussed below, may facilitate a reduction in the required capacitance in the power circuit. Unlike many state-of-the-art systems in which the parasitic inductance of the converter commutation cell limits the maximum usable frequency, the low parasitic inductance of the converter commutation cell may provide other system constraints that limit the maximum frequency. For example, a maximum desirable switching frequency may be imposed by the capabilities of the insulation of the windings of an electrical machine that interfaces with an AC-DC converter. A switching frequency of less than or equal to 100 kHz may be used.

The use of a high switching frequency and high source-drain block voltage results in a notably high value of the maximum the rate of change of the source-drain voltage during operation. Rapid switching between the on- and off-states of the power semiconductor switching elements results in clean switching and improved output waveforms, which limits the harmonic content of the waveforms and improves, for example, converter efficiency, and reduces electric machine torque ripple. In the above examples, the maximum rate of change of the source-drain voltage during operation is in the range 30 to 45 kV/µs. However, lower values (e.g., 10 to 20 kV/µs) or higher values (e.g., greater than 50 kV/µs or as high or higher than 100 kV/µs) may be used, for example, where a relatively low or high switching frequency is utilized.

Thus, a power electronics converter may be characterized by a converter switching parameter β, defined as the product the maximum switching frequency of the switching signals and the maximum rate of change of the source-drain voltage of the power semiconductor switching elements during operation.

$$\beta = f_{max} \times |dv/dt|_{max} \quad (13)$$

where:
$f_{max}$=Maximum frequency of switching signals, and
$|dV/dt|_{max}$=Maximum rate of change of source-drain voltage during operation Table 7 shows exemplary values of β for power electronics converters according to the present disclosure. The values of β are characteristically higher than the prior art and associated with a combination of high efficiency, high power density, and high-quality (e.g., highly sinusoidal AC) output waveforms. Values of β are quoted in PV/s² (Peta-V/s² or $\times 10^{15}$ V/s²).

TABLE 7

| Peak Rated Power (kW) | $\beta = f_{max} \times |dv/dt|_{max}$ (PV/s²) | | |
|---|---|---|---|
| | Example 1 | Example 2 | Example 3 |
| 50 | 0.5 | 1.5 | 5.0 |
| 100 | 0.5 | 1.5 | 5.0 |
| 150 | 0.5 | 1.5 | 5.0 |
| 200 | 0.5 | 1.5 | 5.0 |
| 400 | 0.5 | 1.5 | 5.0 |

Converters in accordance with the present disclosure may have a value of β that is greater than or equal to 0.3 PV/s². Values of β may be less than 10 PV/s² to mitigate against problems such as, for example, insulation breakdown. Values in the range $0.8 \text{ PV/s}^2 \leq \beta \leq 5 \text{ PV/s}^2$ or $1.0 \text{ PV/s}^2 \leq \beta \leq 2.5 \text{ PV/s}^2$ may strike a good balance between the competing effects.

Returning to FIG. 2A, the intermediate capacitor 14, which forms part of the power circuit of the commutation cell, is electrically connected to the power semiconductor switching elements 121 through one or more conductive layers 112 of the multi-layer carrier substrate 11. In the illustrated embodiment, the capacitor 14 is mounted to the first planar surface 111a of the carrier substrate 11, opposite to the second planar surface 111b that faces the power semiconductor prepackages 12. In other embodiments, the prepackages 12 and the capacitor 14 may be mounted at the same side of the carrier substrate 11 (e.g., the second side 111b). Electrical connections between the capacitor 14 and the conductive layers 112 of the multi-layer carrier substrate 11 may be formed in a number of ways. In one example, the capacitor 14 is surface mounted to the substrate 11 in a similar manner as the prepackages 12 (e.g., by soldering, sintering, or gluing electrical contacts of the capacitor 14 to an electrical connection region of the surface 111a of the substrate 11). The electrical connection region may be an outer conductive layer on the surface 111a of the substrate (similar to the layer 1121 shown in FIG. 4B) or an exposed end of one or more vias or filled holes 114 that extends in the z-direction from the surface 111a of the substrate 11 to an internal conductive layer 112 of the substrate 11. The connection between the capacitor 12 and the multi-layer substrate 11 may be made through through hole technology (THT) as an alternative to surface mount technology (SMT), both of which will be familiar to those skilled in the art.

In state-of-the-art converters, the capacitor(s), which are an essential component of most AC-DC and DC-DC converter architectures, are a significant contributor to both size and weight. This is a particular problem in the context of aerospace applications, which are both sensitive to size and weight and require relatively high powers (e.g., compared to electric vehicles and domestic appliances), which necessitate a higher total rated power circuit capacitance. According to the present disclosure, however, the reduction in parasitic inductance allows for a lower capacitance per unit rated power. This is partly because the low parasitic inductance allows for a high switching frequency. Increasing the switching frequency may decrease the required capacitance of the power circuit.

Table 8 provides exemplary values of the total rated capacitance of the power circuit. Values of the total rated capacitance normalized by peak rated power of the converter are also included. It will be understood from the above that the values of the total rated capacitance and the normalized capacitance are low compared with state-of-the-art power electronics converters.

TABLE 8

| Peak Rated | Total Rated Capacitance C (µF) | | C/P (nF/W) | |
|---|---|---|---|---|
| Power (kW) | Example 1 | Example 2 | Example 1 | Example 2 |
| 50 | 15 | 40 | 0.3 | 0.8 |
| 100 | 30 | 80 | 0.3 | 0.8 |
| 150 | 45 | 120 | 0.3 | 0.8 |
| 200 | 60 | 160 | 0.3 | 0.8 |
| 400 | 120 | 320 | 0.3 | 0.8 |

Values of the total rated capacitance normalized by the peak rated power may be less than 5 nF/W or less than 1 nF/W to achieve a low size and weight for the converter. The use of low values of the capacitance may also allow for the use of low-weight capacitor technologies (e.g., ceramic capacitors), allowing for a further weight reduction. Capacitance is known to somewhat vary with operating conditions, and therefore, the literature may quote nominal values of capacitance. In Table 8, the quoted capacitances are those measured at nominal conditions of 25° C. (298K) and 1,000 V DC, which is typical for capacitance measurements.

The term "total rated capacitance of the power circuit" is the total capacitance of all the capacitors in the power circuit. In the simplest cases, there may be a single capacitor. For example, the one-phase two-level AC-DC converter circuit of FIG. 1 includes a single DC link capacitor, as does the three-phase, two-level AC-DC converter circuit of FIG. 10A. In other examples, there may be multiple capacitors: there may be a separate DC-link capacitor for each phase, as is the case in the H-bridge based arrangement of FIG. 10B and the three-phase, two-level circuit of FIG. 10C. Where there is parallelization of the power semiconductors in the power circuit, each power semiconductor switching element may be associated with its own capacitor, or multiple parallel-connected power semiconductor switching elements 121 may be connected with a single larger capacitor.

A power electronics converter may be characterized by a converter frequency-capacitance parameter γ, defined as the total rated capacitance of the power circuit divided by the product of the peak rated power output of the power electronics converter and the maximum switching frequency of the gate switching signals:

$$\gamma = \frac{C}{P \times f_{max}} \tag{14}$$

where:
C=Total rated capacitance of power circuit of commutation cell,
P=Peak rated power of power electronics converter, and
$f_{max}$=Maximum frequency of switching signals.

Table 9 shows exemplary values of γ for power electronics converters according to the present disclosure. The values of γ are characteristically lower than the prior art and associated with a combination of high efficiency and high power density. Values of γ are quoted in fFs/W (femto-Fs/W or ×10$^{-15}$ Fs/W).

TABLE 9

| Peak Rated | $\gamma = C/(P \times f_{max})$ (fFs/W) | | |
|---|---|---|---|
| Power, P (kW) | Example 1 | Example 2 | Example 3 |
| 50 | 2.5 | 10 | 100 |
| 100 | 2.5 | 10 | 100 |
| 150 | 2.5 | 10 | 100 |
| 200 | 2.5 | 10 | 100 |
| 400 | 2.5 | 10 | 100 |

Power electronics converters in accordance with the present disclosure may have values of γ less than or equal to 150 fFs/W. γ may be greater than 1.0 fFs/W, with the provision of a lower bound limiting problems associated with, for example, insulation breakdown at high switching frequencies. Values of γ may be in the range 4.0 fFs/W≤γ≤25 fFs/W, which may strike a good balance between high power density and reliable operation.

A power electronics converter may also be characterized by a converter frequency-capacitance parameter δ, defined as the maximum source-drain blocking voltage of the power semiconductor switching elements of the power circuit divided by the product of the parasitic inductance of the power circuit and the total rated capacitance of the power circuit:

$$\delta = \frac{V_{block}}{L \times C} \tag{15}$$

where:
$V_{block}$=Maximum source-drain blocking voltage of power semiconductors,
L=Parasitic inductance of power circuit, and
C=Total rated capacitance of power circuit of commutation cell.

Table 10 shows exemplary values of δ for power electronics converters according to the present disclosure. The values of δ are characteristically higher than the prior art and associated with a combination of high efficiency and high power density. Values of δ are quoted in PV/FH (Peta-V/FH or ×10$^{-5}$ V/FH).

TABLE 10

| Peak Rated Power | $\delta = \frac{V_{block}}{L \times C}$ (PV/FH) | | |
|---|---|---|---|
| (KW) | Example 1 | Example 2 | Example 3 |
| 50 | 1.0 | 6.0 | 30 |
| 100 | 1.0 | 6.0 | 30 |
| 150 | 1.0 | 6.0 | 30 |
| 200 | 1.0 | 6.0 | 30 |
| 400 | 1.0 | 6.0 | 30 |

Power electronics converters in accordance with the present disclosure may have values of δ greater than 0.5 PV/FH. The value of δ may be less than or equal to 40 PV/s$^2$. The value of δ may be greater than or equal to 1.5 PV/s$^2$. The value of γ may be in the range 2.5 PV/s$^2$ to 25 PV/s$^2$. The value of γ may be in the range 4.0 PV/s$^2$ to 15 PV/s$^2$.

A power electronics converter may also be characterized by a converter frequency-capacitance parameter ε, defined as:

$$\varepsilon = \frac{f_{max} \times \left|\frac{dv}{dt}\right|_{max}}{L \times C} \quad (16)$$

where:

$f_{max}$=Maximum frequency of switching signals, $|dV/dt|_{max}$=Maximum rate of change of source-drain voltage during operation, L=Parasitic inductance of power circuit, and C=Total rated capacitance of power circuit of commutation cell.

Table 11 shows exemplary values of $\varepsilon$ for power electronics converters according to the present disclosure. The values of $\varepsilon$ are characteristically lower than the prior art and associated with a combination of high efficiency, high power density, and good-quality output waveforms. Values of $\varepsilon$ are quoted in units of $\times 10^{27}$ V/s$^4$.

TABLE 11

| Peak Rated Power | $\varepsilon = \frac{f_{max} \times \left\|\frac{dv}{dt}\right\|_{max}}{L \times C}$ ($\times 10^{27}$ V/s$^4$) | | |
|---|---|---|---|
| (KW) | Example 1 | Example 2 | Example 3 |
| 50 | 1.9 | 7.5 | 30 |
| 100 | 1.9 | 7.5 | 30 |
| 150 | 1.9 | 7.5 | 30 |
| 200 | 1.9 | 7.5 | 30 |
| 400 | 1.9 | 7.5 | 30 |

Power electronics converters in accordance with the present disclosure may have values of $\varepsilon$ less than or equal $10^{29}$ V/s$^4$. The value of $\varepsilon$ may be greater than $5 \times 10^{26}$ V/s$^4$, as lower values may be associated with, for example, insulation failure, though this will depend to some extent on the application requirements (e.g., if high quality insulation may be provided in an electrical machine). Values of $\varepsilon$ may be in the range $1.5 \times 10^{27}$ V/s$^4$ to $3 \times 10^{28}$ PV/s$^2$, as this strikes a good balance between power density, efficiency, and reliability.

Returning to FIG. 2A, components of the converter 10, particularly the power semiconductor switching elements 121, generate heat that is to be removed. Heat removal may be a particularly notable consideration in power electronics converters in accordance with the present disclosure because of their compactness and high power density. To this end, the converter 10 includes an integral heat sink 15 that is in close thermal contact with power semiconductor prepackages 12. To provide efficient heat removal, a solid path is provided between a heat removal side 123b of the prepackages (e.g., the underside of the prepackage 12 as illustrated in FIG. 2A, opposite the electrical connection side 123a) so that the heat sink 15 removes heat from the prepackages 12 by thermal conduction. In the illustrated example, a plurality of the prepackages 12 of the converter 10, and optionally all of the prepackages 12 of the converter 10, share a common heat sink 15.

The heat sink 15 itself may be of any suitable design. The heat sink 15 may, for example, be formed of aluminum or another thermally conductive material, cooled by a cooling flow of a coolant that may be a gas (e.g., air) or a liquid (e.g., water or an oil). In some embodiments, a surface of the heat sink 15 opposite the prepackages 12 may be subject to an impinging flow of coolant to increase the coefficient of heat transfer between the prepackages 12 and the cooling medium of the heat sink 15.

To provide efficient heat removal by conduction, there is to be a good quality and consistent thermal interface between the heat removal side 123b of each of the prepackages 12 and the heat sink 15. This may be challenging because, although the heat removal side 123b of the prepackages 12 may be configured to be flat, there does exist some manufacturing and assembly tolerance. For example, the thickness of the electrical contacts 113 may vary slightly between and within prepackages 12, which may result in prepackage tilting and/or inconsistent distances between the heat removal side 123b and the heat sink 15. As another example, the multi-layer carrier substrate 11 may bend or locally deform. In view of this, the converter 10 is also shown to include a thermal interface layer (TIL) 16 between the heat removal side 123b of the prepackages 12 and the heat sink 15. The TIL 16 is included to provide a good quality thermal interface between the prepackages 12 and the heat sink 15. The TIL accommodates tolerance issues while also providing a thermally conductive path in the z-direction between the heat removal side 123b of each of the prepackages 12 and the heat sink 15. In some examples, the TIL 16 may also have a high thermal conductivity on the x-y plane to spread heat across the surface of the heat sink 15. This may be of particular use where a single TIL 16 serves multiple prepackages 12.

The TIL 16 may take one of a number of different forms, including solids (e.g., a solder layer, a foil, or a film), semi-solids (e.g., a paste), or a liquid. In one group of examples, the TIL 16 is a layer of solder (e.g., indium-tin solder). In this case, to provide a good quality solder connection, each prepackage 12 may have its own TIL 16 rather than a single TIL. In another group of examples, the TIL is a foil (e.g., indium-tin or graphene foil) that is both thermally conductive and flexible. Utilizing a TIL with some compressibility may be advantageous for both accommodating manufacturing tolerances and preventing separation of the heat sink 15 from the prepackages 12 during, for example, vibration. The TIL 16 may have a thermal conductivity of at least 1 W/mK or at least 2.5 W/mK. The thickness of TIL 16 may be less than a few mm (e.g., less than 1 mm), and in one group of examples, the TIL has a thickness of between 100 µm and 500 µm.

A power electronics converter may be characterized by a converter heat transfer parameter η, defined as:

$$\eta = \frac{h}{G_3} \quad (17)$$

where:

h=heat transfer coefficient from prepackage to cooling medium, and $G_3$=distance in z-direction between heat removal side of prepackage and heat sink.

The gap $G_3$ is labelled in FIG. 2A. Table 12 shows exemplary values of η for power electronics converters according to the present disclosure. The values of η are characteristically high and associated with a combination of a compactness, high efficiency, and high power density. Values of η are quoted in units of MW/m$^3$K.

TABLE 12

| Peak Rated Power | $\eta = \dfrac{h}{G_3}$ (MW/m³K) | | |
|---|---|---|---|
| (KW) | Example 1 | Example 2 | Example 3 |
| 50 | 0.125 | 37.5 | 150 |
| 100 | 0.125 | 37.5 | 150 |
| 150 | 0.125 | 37.5 | 150 |
| 200 | 0.125 | 37.5 | 150 |
| 400 | 0.125 | 37.5 | 150 |

Power electronics converters in accordance with the present disclosure may have values of η greater than or equal 100 kW/m³K (0.1 MW/m³K). However, values of η greater than or equal 10 MW/m³K may be provided.

Table 13 shows exemplary values for the heat transfer coefficient h and the size of the gap, $G_3$, between the heat removal side of the power semiconductor prepackage and the heat sink.

TABLE 13

| Peak Rated Power (kW) | h (kW/m²K) | | | $G_3$ (mm) | | |
|---|---|---|---|---|---|---|
| | Example 1 | Example 2 | Example 3 | Example 1 | Example 2 | Example 3 |
| 50 | 0.1 | 7.5 | 30 | 0.8 | 0.2 | 0.05 |
| 100 | 0.1 | 7.5 | 30 | 0.8 | 0.2 | 0.05 |
| 150 | 0.1 | 7.5 | 30 | 0.8 | 0.2 | 0.05 |
| 200 | 0.1 | 7.5 | 30 | 0.8 | 0.2 | 0.05 |
| 400 | 0.1 | 7.5 | 30 | 0.8 | 0.2 | 0.05 |

A power electronics converter may also be characterized by a thermal interface parameter, Ω, defined as:

$$\Omega = \frac{M}{K} \qquad (18)$$

where:
M=mechanical compressibility of thermal interface layer, and
k=thermal conductivity of thermal interface layer.

Table 14 shows exemplary values for the thermal interface parameter Ω. Values of Ω are quoted in units of MNK/Wm (Mega-NK/Wm, equal to $10^6$ NK/Wm).

TABLE 14

| Peak Rated Power | $\Omega = \dfrac{M}{k}$ (MNK/Wm) | | |
|---|---|---|---|
| (KW) | Example 1 | Example 2 | Example 3 |
| 50 | 0 | 0.86 | $10^3$ |
| 100 | 0 | 0.86 | $10^3$ |
| 150 | 0 | 0.86 | $10^3$ |
| 200 | 0 | 0.86 | $10^3$ |
| 400 | 0 | 0.86 | $10^3$ |

Converters of the present disclosure may have values of Ω that satisfy 0.1 MNK/Wm<Ω<1 GNK/Wm or 0.25 MNK/Wm<Ω<2 MNK/Wm. Thermal interface parameters in this range may provide a good combination of heat transfer and mechanical properties.

Table 15 shows exemplary values for the mechanical compressibility, M, of the thermal interface layer as well as for the thermal conductivity k of the thermal interface layer.

TABLE 15

| Peak Rated Power | M (MN/m²) | | | k (W/mK) | | |
|---|---|---|---|---|---|---|
| (KW) | Example 1 | Example 2 | Example 3 | Example 1 | Example 2 | Example 3 |
| 50 | 0 | 3 | 100 | 1 | 3.5 | 90 |
| 100 | 0 | 3 | 100 | 1 | 3.5 | 90 |
| 150 | 0 | 3 | 100 | 1 | 3.5 | 90 |
| 200 | 0 | 3 | 100 | 1 | 3.5 | 90 |
| 400 | 0 | 3 | 100 | 1 | 3.5 | 90 |

Figure 2B:
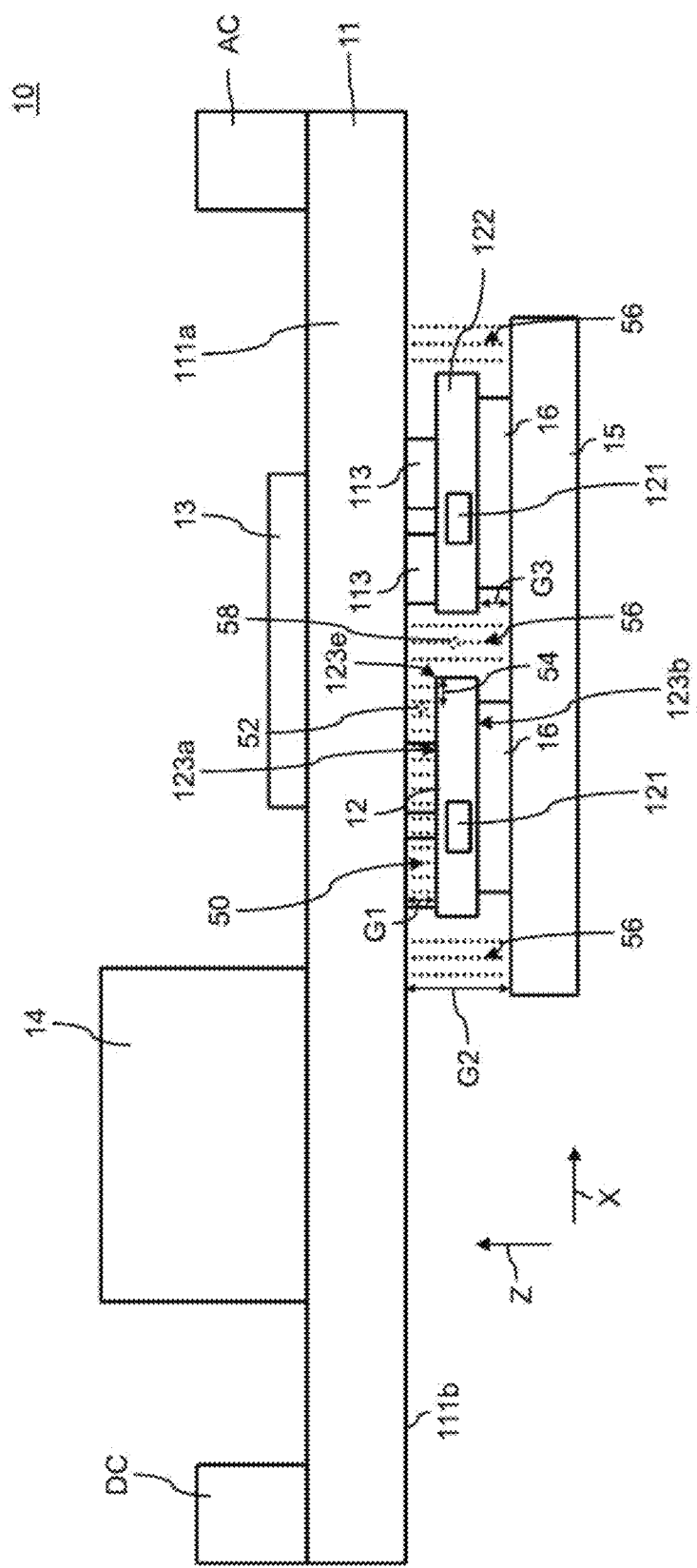
FIG. 2B is a further schematic cross-section of the one-phase, two-level AC-DC converter of FIG. 1 illustrating further properties such as electric fields.

FIG. 2B is a further illustration of the converter 10 of FIG. 2A and illustrates the electric fields developed between components of the converter 10.

The prepackage gap, labelled G1 in FIG. 2B, is visible between the second surface 111b of the multi-layer carrier substrate 11 and the electrical connection side/surface 123a of the prepackages 12. The prepackage gap G1 has a size that may be measured in the z-direction. A first electric field 50 is established in the prepackage gap G1 resulting from the potential difference (e.g., voltage) between the second surface 111b of the multi-layer carrier substrate 11 and the electrical connection surface 123a of the prepackages 12.

A power electronics converter may be characterized by a converter parameter θ, defined as a size in the z-direction of the prepackage gap divided by a maximum electric field strength in the prepackage gap (referred to herein as the first maximum electric field strength):

$$\theta = \frac{G_1}{E_1} \qquad (19)$$

where:
$G_1$=Size of prepackage gap in z-direction, and
$E_1$=Maximum electric field strength in prepackage gap.

Table 16 shows exemplary values for the converter parameter θ for power electronics converters according to the present disclosure. The values of θ are characteristically lower than the prior art and associated with a high power density. Values of θ are quoted in units of pm²/V (pico-m²/V, or $\times 10^{-12}$ m²/V).

TABLE 16

| Peak Rated Power | $\theta = \dfrac{G_1}{E_1}$ (pm²/V) | | |
|---|---|---|---|
| (KW) | Example 1 | Example 2 | Example 3 |
| 50 | 0.5 | 6.25 | 250 |
| 100 | 0.5 | 6.25 | 250 |
| 150 | 0.5 | 6.25 | 250 |
| 200 | 0.5 | 6.25 | 250 |
| 400 | 0.5 | 6.25 | 250 |

Power electronics converters in accordance with the present disclosure may have values of θ less than or equal to 300 pm²/V. The value of θ may be greater or equal to 0.1 pm²/V, as lower values may be associated with, for example, greater risk of electrical breakdown. Values of θ may be in the range 2.0 pm²/V to 50 pm²/V, as this may strike a good balance between power density and reliability.

Those skilled in the art will appreciate that the first maximum electric field strength is a maximum homogenous electric field strength. In other words, the first maximum electric field strength is the maximum field strength determined in a location sufficiently spaced away from sharp edges and/or obstructions in the gap that may result in electric field singularities or other highly localized maxima. For example, FIG. 2B shows a first region 52 in the prepackage gap in which the first maximum electric field strength may be determined, as the first region 52 is spaced from any edge or boundary of the multi-layer planar carrier substrate or of the power semiconductor prepackage in the x-y direction. FIG. 2B shows that the first region 52 is spaced in the x-direction by a first distance 54 from a prepackage edge 123e. In a similar manner, the first region 52 is spaced apart from another prepackage edge 123e in the y-direction (not visible here, as the y-direction is perpendicular to the drawing plane). Such offset of the first region 52 in the x-y direction towards the inside of the prepackage gap provides that the maximum field strength is determined over a suitably homogenous region of the electric field. Where the maximum electric field strength is determined by modelling (e.g., finite element analysis (FEA)), the maximum electric field strength may be determined at a location at least three mesh cells from any singularity in the model (e.g., spikes, sharp edges, triple points).

Table 17 provides exemplary values for the size $G_1$ of the prepackage gap in the z-direction, as well as the maximum electric field strength $E_1$ in the prepackage gap.

TABLE 17

| Peak Rated Power (KW) | $G_1$ (μm) | | | $E_1$ (kV/mm) | | |
|---|---|---|---|---|---|---|
| | Example 1 | Example 2 | Example 3 | Example 1 | Example 2 | Example 3 |
| 50 | 20 | 100 | 250 | 1 | 16 | 40 |
| 100 | 20 | 100 | 250 | 1 | 16 | 40 |
| 150 | 20 | 100 | 250 | 1 | 16 | 40 |
| 200 | 20 | 100 | 250 | 1 | 16 | 40 |
| 400 | 20 | 100 | 250 | 1 | 16 | 40 |

The second surface 111b of the multi-layer carrier substrate 11 and a heat sink 15 are spaced apart in the z direction in a substantially parallel manner so as to form a heat sink gap, which is labelled G2 in FIG. 2B. A second electric field 56 is established in the heat sink gap G2, resulting from the potential difference (e.g., voltage) between the second surface 111b of the multi-layer carrier substrate 11 and the heat sink.

A power electronics converter may be characterized by a converter parameter φ, defined as a size in the z-direction of the heat sink gap divided by a maximum electric field strength in the heat sink gap (referred to herein as the second maximum electric field strength):

$$\varphi = \frac{G_2}{E_2} \quad (20)$$

where:
$G_2$=Size of heat sink gap in z-direction, and
$E_2$=Maximum electric field strength in heat sink gap.

Table 18 shows exemplary values for the converter parameter φ. The values of φ are characteristically lower than the prior art and associated with a high power density. Values of φ are quoted in units of $nm^2/V$ (nano-$m^2/V$, or $\times 10^{-9}$ $m^2/V$).

TABLE 18

| Peak Rated Power | $\varphi = \dfrac{G_2}{E_2}$ ($nm^2/V$) | | |
|---|---|---|---|
| (KW) | Example 1 | Example 2 | Example 3 |
| 50 | 0.05 | 1.00 | 15 |
| 100 | 0.05 | 1.00 | 15 |
| 150 | 0.05 | 1.00 | 15 |
| 200 | 0.05 | 1.00 | 15 |
| 400 | 0.05 | 1.00 | 15 |

Power electronics converters in accordance with the present disclosure may have values of φ less than or equal to 20 $nm^2/V$. The value of β may be greater or equal to 0.01 $nm^2/V$, as lower values may be associated with, for example, greater risk of electrical breakdown. Values of φ may be, for example, in the range 0.05 $nm^2/V$ to 5 $nm^2/V$, as this may strike a good balance between power density and reliability.

As with the first maximum electric field strength $E_1$, the second maximum electric field strength $E_2$ is a maximum homogenous electric field strength, and thus, singularities and other highly localized maxima are excluded. By way of example, in FIG. 2B, a second region 58 is illustrated for determining a second maximum electric field strength of the second electric field 56. The second region 58 is located inside the heat sink gap G2 and spaced away from any obstructions and edges inside the heat sink gap G2, such as those associated with the prepackages 12. Where the maximum electric field strength is determined by modelling (e.g., finite element analysis (FEA)), the maximum electric field strength may be determined at a location at least three mesh cells from any singularity in the model.

Table 19 provides exemplary values for the size $G_2$ of the heat sink gap between the multi-layer planar carrier substrate 11 and the heat sink 15 in the z-direction and the maximum electric field strength $E_2$ in the heat sink gap.

TABLE 19

| Peak Rated Power (KW) | $G_2$ (mm) | | | $E_2$ (kV/mm) | | |
|---|---|---|---|---|---|---|
| | Example 1 | Example 2 | Example 3 | Example 1 | Example 2 | Example 3 |
| 50 | 0.5 | 1.5 | 3.0 | 0.2 | 1.5 | 10 |
| 100 | 0.5 | 1.5 | 3.0 | 0.2 | 1.5 | 10 |
| 150 | 0.5 | 1.5 | 3.0 | 0.2 | 1.5 | 10 |
| 200 | 0.5 | 1.5 | 3.0 | 0.2 | 1.5 | 10 |
| 400 | 0.5 | 1.5 | 3.0 | 0.2 | 1.5 | 10 |

Figure 3A:
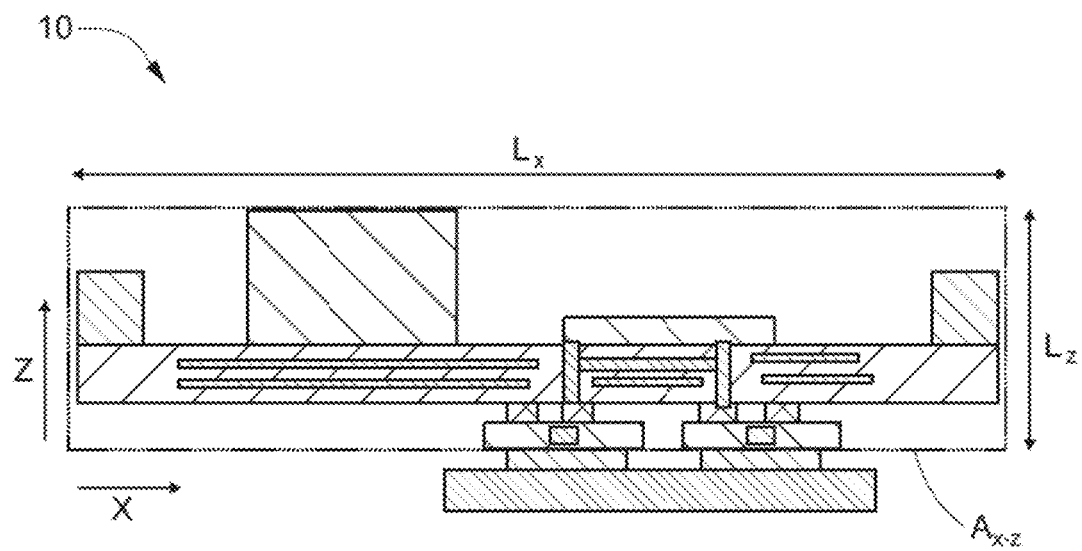
FIGS. 3A and 3B are schematic cross-sectional and plan views of the one-phase, two-level AC-DC converter of FIG. 2A, further illustrating the calculation of the commutation cell volume.
Figure 3B:
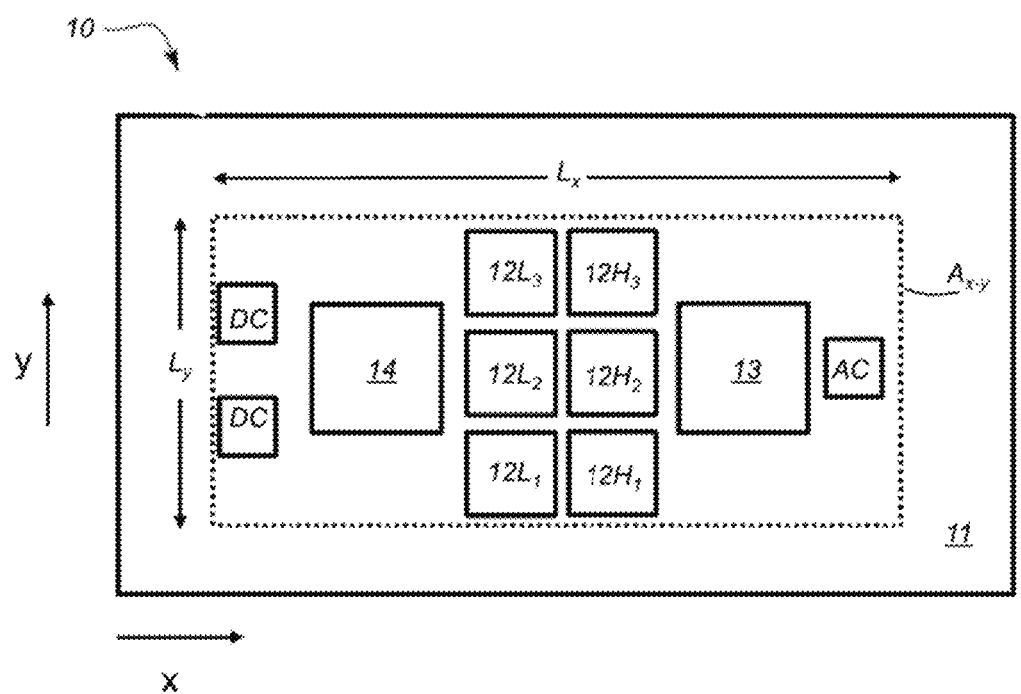

FIGS. 3A and 3B illustrate the smallest cuboidal volume that encloses the commutation cell of a power electronics converter. Once again, the example of a one-phase, two-level converter is chosen for ease of explanation. Reference is made to Equation 1, which defines the inductance-volume parameter α in terms of the smallest cuboidal volume that encloses the commutation cell.

FIG. 3A is the cross-sectional view also shown in FIG. 2A. The x- and z-directions are indicated. The box with dashed lines, labelled $A_{x-z}$, is a cross-section in the x-z plane through the smallest volume that encloses the commutation cell of the converter 10. The cross-sectional area $A_{x-z}$ encloses both the power circuit (e.g., the power semiconductors 121 that are formed in the prepackages 12, the capacitor 14, the DC inputs, and the AC outputs and the connections therebetween) and the gate driver circuit 13 and its connections with the power semiconductors 121. The area $A_{x-z}$ may be calculated as the product of the size of the box measured in the x-direction ($L_x$) and the size of the box measured in the z-direction ($L_z$).

FIG. 3B is a plan view of converter of FIG. 3A. The x- and z-directions are indicated. The box with dashed lines, labelled $A_{x-y}$, is a cross-section in the x-y plane through the smallest cuboidal volume that encloses the commutation cell of the converter 10. The cross-sectional area $A_{x-y}$ encloses both the power circuit (e.g., the power semiconductors 121, the capacitor, the DC inputs, and the AC outputs and the connections therebetween) and the gate driver circuit 13 and its connections with the power semiconductors. The area $A_{x-z}$ may be calculated as the product of the size of the box measured in the x-direction ($L_x$) and the size of the box measured in the y-direction ($L_y$).

The smallest cuboidal volume that encloses the commutation cell may be calculated as the product of the three dimensions, $L_x$, $L_x$, and $L_z$.

All components of the commutation cell are visible in FIG. 3B even though some of the components illustrated in the cross-sectional view of FIG. 3A are located on the underside of carrier substrate 11. This is solely for the purpose of illustration and clear explanation, and in practice, not all components of the converter 10 of FIGS. 3A-3B would be visible in a single plan view. The x-y position of the gate driver circuit 13 has been moved in FIG. 3B for ease of illustration (e.g., so as not to overlap with the x-y locations of the prepackages 12 as it does in FIG. 3A). However, flexibility in the x-y location of commutation cell components is an advantageous feature of converters according to the present disclosure; this is in part because changes in the x-y locations do not significantly alter the parasitic inductance of the connections between components.

While only two power semiconductor prepackages 12L and 12H are visible in FIG. 3A, there are six prepackages $12L_{1-3}$ and $12H_{1-3}$ in FIG. 3B. This is to illustrate parallelization of the power semiconductor switching elements 121. Specifically, FIG. 3B shows that the low side of the half-bridge includes three power semiconductor prepackages $12L_1$, $12L_2$, and $12L_3$, including a corresponding three power semiconductor switching elements connected together in parallel. Likewise, the high side of the half-bridge includes three power semiconductor prepackages, $12H_1$, $12H_2$, and $12H_3$, including a corresponding three power semiconductor switching elements connected in parallel. In FIG. 3A, where the y-direction is obscured, only one of three prepackages 12L, 12H of each of the low and high side are visible.

FIG. 4A illustrates a single power semiconductor prepackage 12 and shows detail not visible in FIGS. 2A and 3A.

The power semiconductor switching element 121, which in this example is a MOSFET in the form of a semiconductor die or chip, is embedded in solid insulating material 122 (e.g., FR4). Electrical connections 124, 125i that may be filled holes, vias, or similar extend in the z-direction from the terminals of the semiconductor switching element 121 to the electrical connection side 123a of the prepackage 12, where the electrical connections 124, 125i terminate to form a flat surface 123a. Although vertically extending connections 124, 125i are illustrated, it should be appreciated the connections may have a component in the x-y plane too.

The MOSFET 121 has at least three terminals (e.g., the source, drain, and gate terminals). A first electrical connection 124 extends from the source terminal to the flat electrical connection surface 123a. In this example, the drain and gate terminals are electrically connected by an electrically conductive metallization layer 125ii on the underside of the MOSFET die 121. A second electrical connection 125i extends from the conductive layer 125ii to the flat electrical connection surface 123a. In other examples, the gate and drain terminals are not connected and, for example, the connections 125i, 125ii correspond only to the drain terminal, with the gate terminal served by a separate connection from the gate terminal to the flat electrical connection surface 123a.

The illustrated prepackage 12 further includes an optional electrical isolation layer (EIL) 126. The purpose of the EIL 126, which in this example is a layer of ceramic material, is to electrically isolate the MOSFET 121 and its terminals from the heat sink 15 that is arranged on the underside of the prepackage 12 (see FIG. 4B). In other embodiments, the EIL 126 may be omitted from the prepackage 12, for example, if a separate EIL is provided between the underside of the prepackage 12 and the heat sink 15, or if the TIL 16 is able to provide sufficient electrical isolation. Where present, the EIL 126 may have a thickness of less than 5 mm. In one embodiment, the EIL 126 has a thickness of less than 1 mm to keep the converter compact while still achieving the isolation function. Lower thicknesses (e.g., less than 0.1 mm) may be used where, for example, an organic substrate such as IMS is used.

The illustrated prepackage 12 further includes an optional metal layer 127 on the underside of the EIL 126. The metal layer 127 improves thermal conduction between the prepackage 12 and TIL 16. The metal layer 127 may also provide a suitable material interface between the underside of the prepackage and TIL 16. For example, if the TIL 16 is a solder layer, this may necessitate that the underside 123b of the prepackage 12 carries a material suitable for a solder connection. The metal layer 127 may be omitted (e.g., if a TIL other than solder is used).

FIG. 4B shows the prepackage 12 of FIG. 4A sandwiched between a multi-layer carrier substrate 11 and a heat sink 15. FIG. 4B further illustrates how the electrical connections 124, 125ii that extend from the terminals of the power semiconductor 121 to the electrical connection surface 123a may be connected to the conductive elements of the multi-layer carrier substrate 11 and thereby other components of the commutation cell.

In the illustrated example, a planar surface 111b of the multi-layer carrier substrate 11 includes one or more regions carrying an outer conductive layer 1121. These regions 1121 allow for soldered or sintered connections 113 to be formed to connect the substrate 11 to the distal ends of the electrical connections 124, 125i of the prepackage 12. In the illustrated example, metallization regions 1241 (e.g., conductive contact pads such as solder pads) are also provided adjacent to the distal ends of the electrical connections 124, 125i to improve the ease with which soldered, sintered, or glued connections may be formed. In other examples, these may be omitted, and the solder connections 113 may be made directly on the exposed distal ends of the connections 124, 125ii.

With the terminals of the power semiconductor switching elements 121 now connected to the conductive regions 1121 of the carrier substrate 11, connections to the other components of the commutation cell are made through connection to the conductive regions 1121. These connections may be formed by a combination of conductive layers 112 of the carrier substrate 11 (see FIG. 2A) and electrical connections 114 that extend in the z-direction from the conductive regions 1121 through the carrier substrate. For example, referring to FIGS. 2A and 4B, the layer 1121 that is soldered to the connection 124 that connects to the source terminal of the MOSFET 121 may be associated with one or more (e.g., many) connections 114a that extend in the z-direction to an internal conductive layer 112. The internal conductive layer 112 may then connect to a terminal of the DC link capacitor 14. As another example, the layer 1121 that is soldered to the connection 125i that connects to the gate terminal of the MOSFET 121 may be associated with one or more connections 114b that extend in the z-direction all the way through the substrate 11 to terminals of the gate driver circuit 13.

Power electronics converters described herein may be characterized by a converter parameter ρ, defined as follows:

$$\rho = k \times E_{Break} \quad (21)$$

where:
k=thermal conductivity of thermal isolation layer (TIL), and
$E_{Break}$=breakdown electric field strength of electrical isolation layer (EIL).

Table 20 shows exemplary values for the converter parameter ρ. Converters described herein may have characteristically high values of ρ that may be associated with a combination of good heat removal from the prepackages and good resistance to electrical breakdown. Values of ρ are quoted in units of MVW/m²K (Mega-VW/m₂K, or ×10⁶ VW/m²K).

TABLE 20

| Peak Rated Power (kW) | ρ = k × E_Break (MVW/m²K) | | | |
|---|---|---|---|---|
| | Example 1 | Example 2 | Example 3 | Example 4 |
| 50 | 10 | 70 | 4.5 × 10³ | 22.5 × 10³ |
| 100 | 10 | 70 | 4.5 × 10³ | 22.5 × 10³ |
| 150 | 10 | 70 | 4.5 × 10³ | 22.5 × 10³ |
| 200 | 10 | 70 | 4.5 × 10³ | 22.5 × 10³ |
| 400 | 10 | 70 | 4.5 × 10³ | 22.5 × 10³ |

Power electronics converters in accordance with the present disclosure may have values of ρ greater than or equal to 5 MVW/m²K, though values greater than 20 MVW/m²K may be provided.

Table 21 shows exemplary values for the breakdown electric field strength (which may also be referred to as the dielectric strength in some literature), $E_{Break}$, of the electrical isolation layer (EIL). For exemplary values for thermal conductivity k of the thermal interface layer, see Table 15.

TABLE 21

| Peak Rated Power (kW) | $E_{Break}$ (kV/mm) | | | |
|---|---|---|---|---|
| | Example 1 | Example 2 | Example 3 | Example 4 |
| 50 | 10 | 20 | 50 | 250 |
| 100 | 10 | 20 | 50 | 250 |
| 150 | 10 | 20 | 50 | 250 |
| 200 | 10 | 20 | 50 | 250 |
| 400 | 10 | 20 | 50 | 250 |

Higher values for $E_{Break}$ (e.g., in Example 4) are for EILs including organic materials, whereas the lower values (e.g., Examples 1, 2, and 3) are EILs including inorganic materials.

As noted above, the EIL 126 is optional. In alternative embodiments, the EIL 126 is omitted and a TIL 16 with suitably electrically isolating properties is provided. Thus, the TIL 16 may provide electrical isolation between the prepackages and the heat sink, as well as a good heat path between the prepackages and heat sink.

Such embodiments may be characterized by a TIL parameter λ, defined as the thermal conductivity of the TIL divided by the electrical conductivity of the TIL:

$$\lambda = \frac{k}{P} \quad (22)$$

where:
k=thermal conductivity of thermal isolation layer (TIL), and
P=electrical conductivity of the TIL.

Table 22 shows exemplary values of the parameter λ. The values of λ are characteristically high. Values of λ are quoted in units of TW/SK (Tera-W/SK, or ×10² W/SK).

TABLE 22

| Peak Rated Power (KW) | $\lambda = \frac{k}{P}$ (TW/SK) | | |
|---|---|---|---|
| | Example 1 | Example 2 | Example 3 |
| 50 | 1 | 350 | 90 × 10³ |
| 100 | 1 | 350 | 90 × 10³ |
| 150 | 1 | 350 | 90 × 10³ |
| 200 | 1 | 350 | 90 × 10³ |
| 400 | 1 | 350 | 90 × 10³ |

Power electronics converters in accordance with the present disclosure may have values of λ greater than or equal to 1 TW/SK, though values greater than 100 TW/SK may be provided.

Table 23 shows exemplary values for the electrical conductivity P of the thermal interface layer.

TABLE 23

| Peak Rated Power (kW) | P (S/m) | | |
|---|---|---|---|
| | Example 1 | Example 2 | Example 3 |
| 50 | 1 × 10⁻¹⁵ | 1 × 10⁻¹⁴ | 1 × 10⁻¹³ |
| 100 | 1 × 10⁻¹⁵ | 1 × 10⁻¹⁴ | 1 × 10⁻¹³ |
| 150 | 1 × 10⁻¹⁵ | 1 × 10⁻¹⁴ | 1 × 10⁻¹³ |
| 200 | 1 × 10⁻¹⁵ | 1 × 10⁻¹⁴ | 1 × 10⁻¹³ |
| 400 | 1 × 10⁻¹⁵ | 1 × 10⁻¹⁴ | 1 × 10⁻¹³ |

Figure 4C:
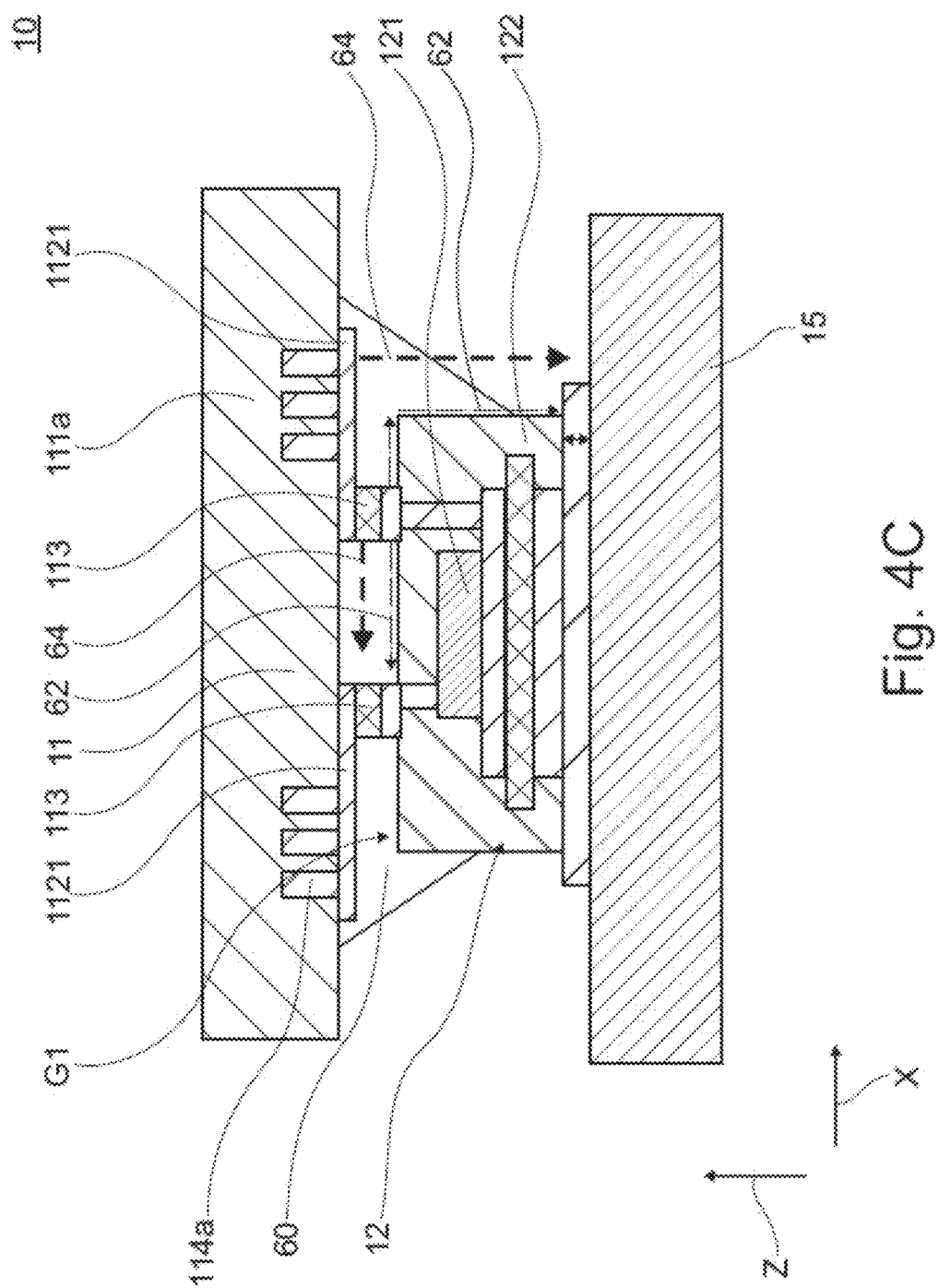
FIG. 4C is a schematic cross-section of an embodiment of a power semiconductor prepackage sandwiched between a multi-layer carrier substrate and a heat sink, and including an electrically insulating material in a prepackage gap.

FIG. 4C illustrates a further arrangement of a power electronics converter 10 in which at least a portion of the prepackage gap G1 is filled with electrically insulating material 60 (e.g., a resin). The electrically insulating material 60 is arranged in and, optionally, around the prepackage gap G1. "Around" in this context provides that the electrically insulating material 60 extends beyond the semiconductor prepackage 12 in the x-y direction. For example, the material 60 may additionally cover the metal layers 1121 extending from connections 114a to the connections 113.

Using the electrically insulating material 60, a creepage distance 62 as well as an air gap distance 64 may be reduced and kept physically small. Thus, utilizing the electrically insulating material 60, small distances between the components of the power electronics converter 10 (e.g., between the metal layers 1121 and the connections 114a) may be achieved without a significant risk of adverse electrical effects such as sparking or creeping currents. This is particularly advantageous given the high voltages utilized in converters of the present disclosure, which may result in high potential differences between, for example, the metal layers 1121 and the prepackage surfaces 12 and heat sink 15.

The applied electrically insulating material 60 may include voids (e.g., air) within its volume due to imperfections in the manufacturing process. A power electronics converter utilizing electrically insulating material in a prepackage gap may be characterized by a converter parameter σ, defined as an insulation fill factor divided by a maximum void size of the voids:

$$\sigma = \frac{F}{R_{max}} \quad (23)$$

where:
F=Insulation fill factor, and
$R_{max}$=Maximum void size in insulation.

In this equation, F is the insulation fill factor and $R_{max}$ is the maximum void size of the plurality of voids. The insulation fill factor is defined as a cumulated volume of the plurality of voids (the 'void volume'), subtracted from a volume of the electrically insulating material, divided by the volume of the electrically insulating material. This may be expressed as follows:

$$F = \frac{V_{IM} - V_V}{V_{IM}} \quad (24)$$

where:
$V_{IM}$=Volume of electrically insulating material (including voids), and
$V_V$=Cumulated volume of voids.

Hence, the converter parameter σ may also be expressed as:

$$\sigma = \frac{V_{IM} - V_V}{V_V \times R_{max}} \quad (25)$$

Table 24 shows exemplary values for the converter parameter σ, expressed in units of 1/mm.

TABLE 24

| Peak Rated Power | $\sigma = \frac{F}{R_{max}}$ (1/mm) | | |
|---|---|---|---|
| (KW) | Example 1 | Example 2 | Example 3 |
| 50 | 18 | 100 | 1000 |
| 100 | 18 | 100 | 1000 |
| 150 | 18 | 100 | 1000 |
| 200 | 18 | 100 | 1000 |
| 400 | 18 | 100 | 1000 |

Converters according to the present disclosure may have values of σ greater than or equal to 10/mm to provide good electrical insulation properties. However, values greater than or equal to 50/mm may be provided, especially at higher operating voltages.

Table 25 shows exemplary values for the insulation fill factor F and the maximum void size $R_{max}$.

TABLE 25

| Peak Rated Power (kW) | F (%) | | | $R_{max}$ (μm) | | |
|---|---|---|---|---|---|---|
| | Example 1 | Example 2 | Example 3 | Example 1 | Example 2 | Example 3 |
| 50 | 90 | 99 | 99.99 | 1 | 10 | 50 |
| 100 | 90 | 99 | 99.99 | 1 | 10 | 50 |
| 150 | 90 | 99 | 99.99 | 1 | 10 | 50 |
| 200 | 90 | 99 | 99.99 | 1 | 10 | 50 |
| 400 | 90 | 99 | 99.99 | 1 | 10 | 50 |

Values of $R_{max}$ may be determined through an equivalent-sphere method in which measurements of the void size are made for a representative sample of the electrically insulating material, and a maximum void size is statistically estimated under the assumption the voids are spherical and the measured sizes are diameters of spheres.

A power electronics converter utilizing electrically insulating material in a prepackage gap may also be characterized by a converter parameter τ, defined as the product of the dielectric strength of the electrically insulating material and the maximum void size:

$$\tau = D \times R_{max} \quad (26)$$

where:
D=Dielectric strength of electrically insulating material, and
$R_{max}$=Maximum void size in insulation.

Table 26 shows exemplary values for the converter parameter τ, expressed in units of Volts.

TABLE 26

| Peak Rated Power (kW) | τ = D × $R_{max}$ (V) | | |
|---|---|---|---|
| | Example 1 | Example 2 | Example 3 |
| 50 | 1 | 200 | 10,000 |
| 100 | 1 | 200 | 10,000 |
| 150 | 1 | 200 | 10,000 |
| 200 | 1 | 200 | 10,000 |
| 400 | 1 | 200 | 10,000 |

Converters according to the present disclosure may have values of τ less than or equal to 1,000 V to provide good electrical insulation properties. Values less than or equal to 100 V may, however, be provided, especially at higher operating voltages.

Table 27 shows exemplary values for the dielectric strength D of the electrically insulating material.

TABLE 27

| Peak Rated Power (kW) | D (kV/mm) | | |
|---|---|---|---|
| | Example 1 | Example 2 | Example 3 |
| 50 | 1 | 20 | 200 |
| 100 | 1 | 20 | 200 |
| 150 | 1 | 20 | 200 |

TABLE 27-continued

| Peak Rated Power (kW) | D (kV/mm) | | |
|---|---|---|---|
| | Example 1 | Example 2 | Example 3 |
| 200 | 1 | 20 | 200 |
| 400 | 1 | 20 | 200 |

Figure 5A:
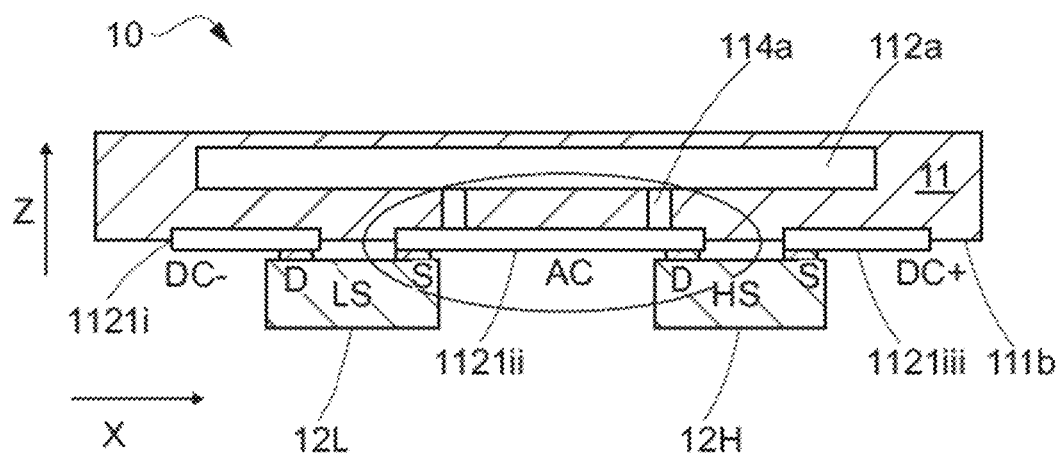
FIG. 5A illustrates an embodiment of how low- and high-side power semiconductor switching elements of a half-bridge may be electrically connected through a multi-layer carrier substrate.

FIG. 5A illustrates how low-side and high-side power semiconductor switching elements 121L, 121H of the prepackages 12L, 12H may be electrically connected using the multi-layer carrier substrate 11. The x- and z-directions are indicated.

As in FIG. 4B, a planar surface 111b of the substrate 11 has regions 1121i, 1121ii, 1121iii carrying an outer conductive layer. These regions 1121i-iii facilitate connection to the terminals of the power semiconductors 121L, 121H by soldering or sintering. The multi-layer substrate 11 is further shown to include an internal conductive layer 112a that electrically connects to one of the outer layer regions 1121ii through a set of connections 114a that extends in the z-direction through the substrate 11.

The source terminal (S) of the high-side power semiconductor switching element 121H is electrically connected to the high-side DC input (DC+) through a connection (e.g., a soldered, sintered, or glued connection) to the third outer layer region 1121iii. The drain terminal (D) of the low-side power semiconductor switching element 121L is electrically connected to the low-side DC input (DC−) through a connection to the first outer layer region 1121i. The drain terminal (D) of the high-side power semiconductor switching element 121H and the source terminal (S) of the low-side power semiconductor switching element 121L are electrically connected to each other and to the inner conductive layer 112 of the substrate by connections to the second outer layer region 1121ii.

The internal layer 112 is shown to be thicker in the z-direction than the outer layer regions 1121i-1121iii. This increased thickness reduces the resistance and thus increases the current carrying capability of the inner conductive layer 112. This reflects the fact that, in this example, the inner conductive layer 112 carries a high current, whereas the outer layer regions 1121i-iii are used as electrical contact and not paths for carrying current between components. The thin outer layer regions 1121i-1121iii may have a thickness of less than 100 µm (e.g., 50 µm), whereas the thicker inner layer 114 may have a thickness of greater than 100 µm (e.g., 100-400 µm). A plurality (e.g., five, ten, or more) of vias may be used to connect a thin outer contact region and the thick inner layer. By increasing the number of vias for one electrical path, the current carrying capability may be increased accordingly.

Figure 5B:
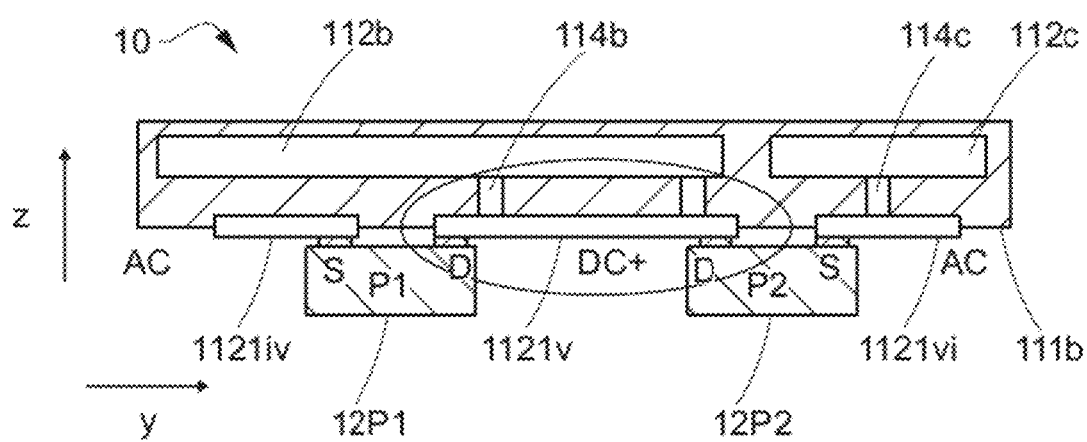
FIG. 5B illustrates an embodiment of how power semiconductor switching elements may be electrically connected in parallel through a multi-layer carrier substrate.

FIG. 5B illustrates how power semiconductor switching elements P1 and P2 may be connected in parallel. P1 and P2 may, for example, be two low-side power semiconductors of one phase of a two-level AC-DC converter. The y- and z-directions are indicated for comparison with FIG. 5A.

As in FIG. 5A, a planar surface 111b of the substrate 11 has regions 1121iv, 1121v, 1121vi carrying an outer conductive layer. These regions 1121iv, 1121v, 1121vi facilitate connection to the terminals of the power semiconductors P1 and P2 by, for example, soldering, sintering, or gluing. The multi-layer substrate 11 is further shown to include two internal conductive layers 112b, 112c. Each of the internal layers 112b, 112c electrically connects to one of the outer layer regions 1121v, 1121vi through corresponding sets of connections 114b, 114c that extend in the z-direction through the substrate 11. As in FIG. 5A, the internal layers 112b, 112c are thicker than the outer layer regions 1121iv-vi.

The source terminal (S) of the first power semiconductor switching element P1 is electrically connected to the AC side of the converter 10 through a connection to the first outer layer region 1121iv. The source terminal (S) of the second power semiconductor switching element P2 is electrically connected to the AC side of the converter 10 through a connection to the third outer layer region 1121vi, which connects on to the ticker inner conductive layer 112c through the connection 114c. The drain terminal (D) of the first power semiconductor switching element P1 and the drain terminal (D) of the second power semiconductor switching element P2 are electrically connected to each other and to the inner conductive layer 112b of the substrate 11 by soldered, sintered, or glued connections to the second outer layer region 1121v.

The connection arrangements of FIGS. 5A-5B are merely examples, and connections may be made in various different ways, with different combinations of outer layers, inner layers, and z-direction connections. The various internal layers 112a-c are shown to be of the same thickness and at the same depth through the substrate 11. This is not necessary and may not be the case. Internal layers may have different thicknesses and be staggered in the z-direction and/or x-y direction. The outer layers 1121i-vi and inner layers 112a-c may be of the same or different thicknesses. Suitable thicknesses will depend to some extent on the application requirements (e.g., power). It may be easier to fabricate thick internal layers 112a-c through, for example, known PCB manufacturing techniques than thick outer layers that may be provided by, for example, deposition.

Figure 6A:
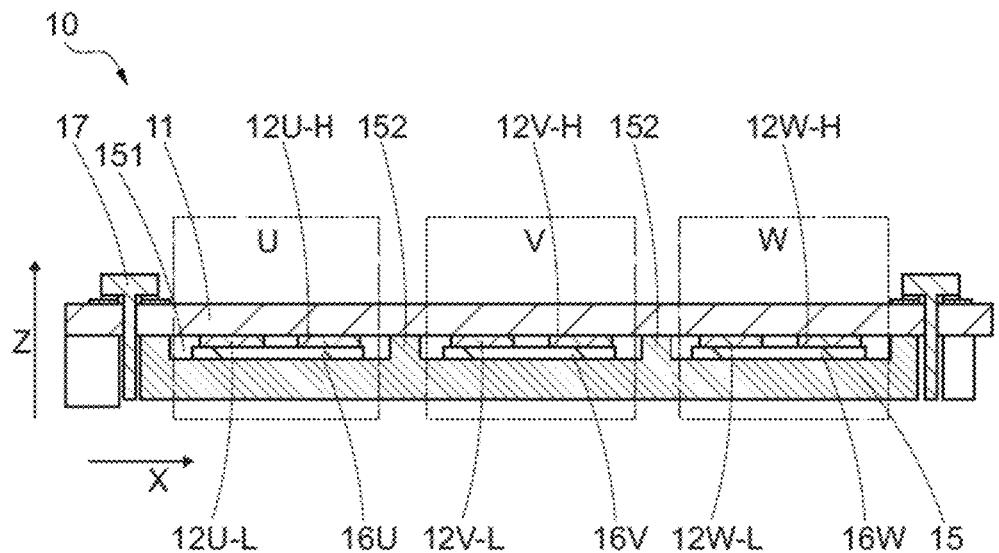
FIGS. 6A and 6B illustrate how the one-phase arrangements of FIGS. 2A, 2B, 3A, 3B, 4A-C, 5A, and 5B may be extended to multiple phases.
Figure 6B:
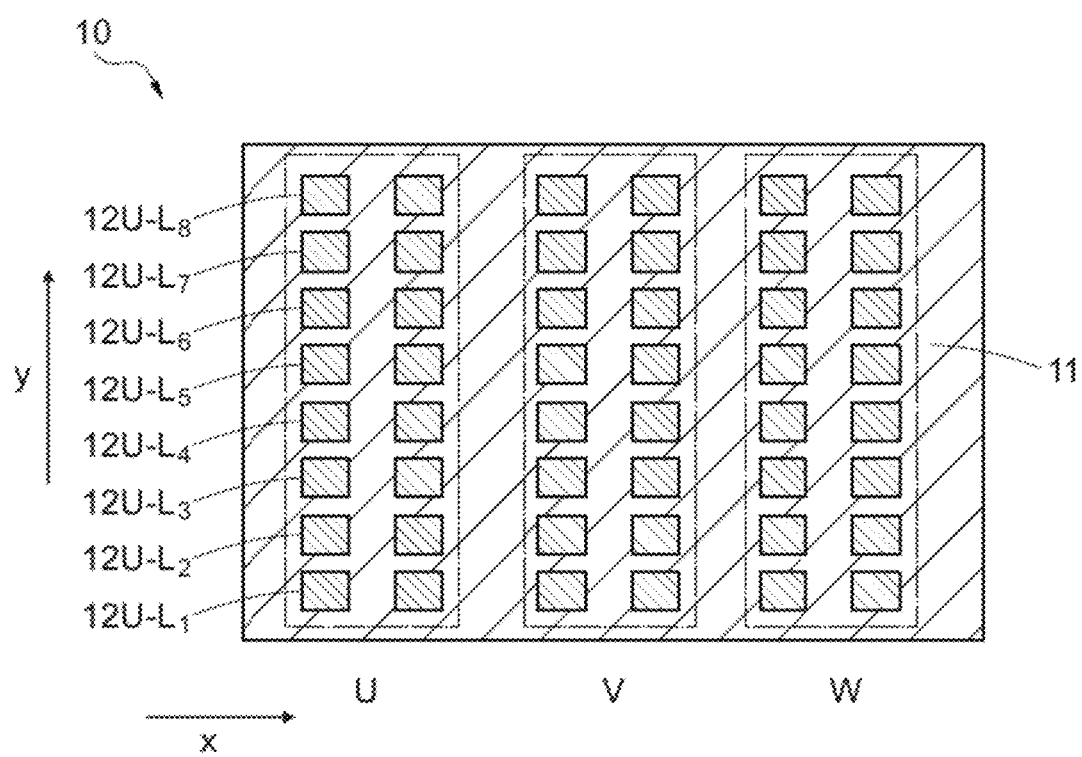

In each of the examples described above, the AC-DC converter 10 has only a single phase. This, however, is only for ease of illustration and explanation, and AC-DC converters according to the present disclosure may have multiple phases. To this end, FIGS. 6A-6B illustrate how the concepts described above may be extended to multiple phases. FIGS. 6A-6B illustrate a two-level, three-phase AC-DC converter in which the low-side and high-side of each phase includes multiple (e.g., eight) parallel-connected power semiconductor switching elements.

FIG. 6A is a schematic cross-section of the converter 10. The x-direction and z-direction are indicated. The converter 10 has three phases, designated U, V, and W. Each phase has its own set of power semiconductor prepackages: the first phase U has prepackages 12U-L and 12U-H; the second phase V has prepackages 12V-L and 12V-H; and the third phase W has prepackages 12W-L and 12W-H. The prepackages 12 of each phase are surface mounted and electrically connected to a common multi-layer planar carrier substrate 11 that, as before, may be a PCB. The heat removal sides of the prepackages 12 face a heat sink 15, with thermal interface layers 16U, 16V, 16W between the undersides of the prepackages 12U-W and the heat sink 15.

For ease of illustration, the other components of the commutation cell (e.g., the gate driver circuit 13, the capacitor(s) 14, and the electrical connections between the components) are not shown. These components and their connections will be substantially as described above with reference to FIGS. 1-5.

In this example, there is a common heat sink 15 that serves the entire converter 10, but there may instead be a separate heat sink for each phase U, V, W, similar to the arrangement shown in FIG. 2 for a single phase. Further, in this example, the prepackages sit in a recess 151 in the heat sink 15. The use of a recess may reduce the thickness of the converter in the z-direction and may also provide a secondary thermal conduction path between the prepackages 12 and the heat sink 15 that passes through the substrate 11. Further, provided the recess is suitably sealed, a liquid or gaseous cooling medium may be flowed through the recess to directly cool the prepackages 12.

In the illustrated example, the heat sink 15 and substrate 11 are secured and pressed together by fasteners 17. This is not essential, but the use of fasteners to press the substrate 11 and prepackages 12 to the heat sink 15 may be provided for a better thermal interface to the heat sink 15.

The heat sink is shown to define barrier walls 152 that separate the recess 151 into three chambers (e.g., one for each phase) to provide isolation between the phases. This may be useful for fault mitigation, but in other examples, may be omitted. The barrier walls 152 may also not be integral with the heat sink 15, though integral barrier walls may improve the quality of the secondary thermal conduction path between the prepackages 12 and heat sink 15. Where the barrier walls 152 are omitted, a TIL 16 spanning the prepackages of multiple (e.g., all) of the phases U, V, W of the converter 10 may be used.

FIG. 6B is a schematic plan view of the converter 10 of FIG. 6A. Only the prepackages 12 are illustrated and, as with FIG. 3B, the prepackages 12 are shown despite being located on the underside of the substrate and being obscured by the heat sink 15. With the y-direction no longer obscured, FIG. 6B shows that the low-side and high-side of each phase U, V, W includes eight power semiconductor switching elements each provided in a power semiconductor prepackage. For example, the eight prepackages 12U-L$_1$ to 12U-L$_8$ are labelled.

Those skilled in the art will appreciate that the example of FIGS. 6A-B may be extended to any number of phases and to any number of parallel-connected power semiconductor switching elements. The example of FIGS. 6A-6B may also be extended to DC-DC converter circuits, which may only include a single power semiconductor switching element or one set of parallel-connected power semiconductor switching elements.

A power electronics converter may be formed of one or more 'logical switches' each including one or more parallel-connected power semiconductor switching elements. In the case of a two-level AC-DC converter, there are two logical switches per phase (e.g., one low-side and one high-side logical switch). In the case of a DC-DC converter, there may be as few as one logical switch (see, e.g., FIG. 11A), though other DC-DC converters may include multiple logical switches (see, e.g., FIG. 11B that has four logical switches; two per side of the transformer 250'). Converters according to the present disclosure may include any number of power semiconductors (and thus prepackages) per logical switch, (e.g., three to ten prepackages per logical switch).

It is worth considering how a change to the number of phases affects the definition of the volume of the commutation cell and the parasitic inductance of the power circuit. Each phase forms part of the commutation cell. Thus, the smallest cuboidal volume that enclose the commutation cell will enclose every phase of the converter. However, each phase circuit is essentially independent from the other phase circuits, with its switching and the conduction between its DC and AC sides being independent of the other phase circuits. Thus, a multi-phase power circuit may, from the perspective of parasitic inductance, be considered equivalent to multiple independent one-phase power circuits, and the parasitic inductance of the power circuit is therefore equal to the parasitic inductance of one of the phases. The parasitic inductance of each phase will be the same (except for small unavoidable variation due to, for example, component manufacturing tolerance and electrical contact quality), so it does not matter which phase is selected. In principle, it is possible to intentionally design a converter in which each phase has a different parasitic inductance, but this would be undesirable.

By way of specific examples, Table 28 includes specifications of two example converters in accordance with the present disclosure. Both are two-level, three-phase AC-DC converters, but it will be understood this is not intended to be limiting.

TABLE 28

| | Example 1 (100 KW, 2-Level, 3-Phase AC-DC) | Example 1 (200 KW, 2-Level, 3-Phase AC-DC) |
|---|---|---|
| Substrate Type | Rigid Multi-layer PCB | Rigid Multi-layer PCB |
| Power Semiconductor Type | SiC MOSFET | SiC MOSFET |
| Prepackage Type | FR4 isolation with integral ceramic EIL | FR4 isolation with integral ceramic EIL |
| Heat Sink Type | Air-cooled aluminum | Liquid-cooled aluminum |
| TIL Type | Indium-tin solder | Indium-tin foil |
| Peak Power Rating | 100 KW | 200 kW |
| MOSFET Source-Drain Blocking Voltage | 1,200 V | 1,400 V |
| Peak Rated Current | 200 A | 350 A |
| Maximum Switching Frequency | 50 KHz | 50 KHz |
| Maximum Source-Drain Voltage Ramp Rate [dv/dt] | 30 kV/µs | 35 kV/µs |
| Parasitic Inductance of Power Circuit [L] | 4 nH | 2 nH |
| Total Power Circuit Capacitance [C, @ 298K, 1,000 V DC] | 50 µF | 100 µF |
| Commutation Cell Volume [Smallest Cuboidal] | 300 cm$^3$ | 424 cm$^3$ |
| Number of Prepackages per Logical Switch | 6 | 12 |
| Total Number of Prepackages | 36 | 72 |
| Gap Between Substrate and Prepackages | 100 µm | 120 µm |
| Gap Between Substrate and Heat Sink | 1.5 mm | 1.6 mm |
| TIL Thickness | 200 µm | 150 µm |
| EIL Thickness | 0.25 mm | 0.25 mm |

TABLE 28-continued

|  | Example 1 (100 KW, 2-Level, 3-Phase AC-DC) | Example 1 (200 KW, 2-Level, 3-Phase AC-DC) |
|---|---|---|
| TIL Thermal Conductivity | 3.5 W/mK | 2.5 W/mK |
| Efficiency | 99% | 99% |
| $\alpha = L \times Vol$ | 1.2 pHm³ | 0.85 pHm³ |
| $\beta = f_{max} \times \|dv/dt\|_{max}$ | 1.5 PV/s² | 1.75 PV/s² |
| $\gamma = \dfrac{C}{P \times f_{max}}$ | 10 fFs/W | 10 fFs/W |
| $\delta = \dfrac{V_{block}}{L \times C}$ | 6 PV/FH | 7 PV/FH |
| $\varepsilon = \dfrac{f_{max} \times \left\|\dfrac{dv}{dt}\right\|_{max}}{L \times C}$ | $7.5 \times 10^{27}$ V/s⁴ | $8.8 \times 10^{27}$ V/s⁴ |
| $\theta = \dfrac{G_1}{E_1}$ | 6.25 pm²/V | 6.25 pm²/V |
| $\varphi = \dfrac{G_2}{E_2}$ | 1 nm²/V | 1 nm²/V |
| $\sigma = \dfrac{F}{R_{max}}$ | 80/mm | 100/mm |
| $\tau = K \times R_{max}$ | 20 V | 20 V |
| $\rho = k \times E_{Break}$ | 25 GV/m²K | 25 GV/m²K |
| $\eta = \dfrac{h}{G_3}$ | 0.3 MW/m³K | 0.7 MW/m³K |
| $\Omega = \dfrac{M}{K}$ | 0.8 MNK/Wm | 0.8 MNK/Wm |

FIGS. 7A-71B and FIGS. 8A-8B3 illustrate a number of alternative ways in which the power semiconductor prepackages 12 may be arranged and connected with respect to the multi-layer carrier substrate 11. In each case, the gate driver circuit 13 and capacitor(s) 14 are omitted, but it will be understood these may be incorporated into the alternative arrangements substantially as described above.

Figure 7A:
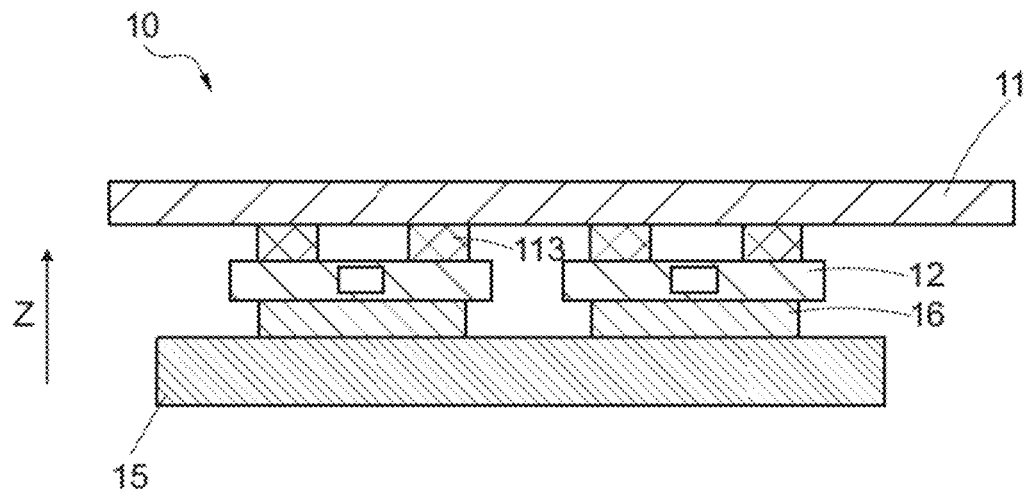
FIG. 7A is a further schematic cross-sectional illustration of the power electronics converter of FIG. 2A.

FIG. 7A shows a converter arrangement 10 described above with reference to FIGS. 2A, 2B, 3A, 3B, 4A-4C, 5A, 5B, 6A, and 6B and in Table 28. Each power semiconductor prepackage 12 is surface mounted on the underside of the multi-layer carrier substrate 11, with electrical connections between the two taking the form of soldered, sintered, or glued connections 113. The other side of the prepackages 12 faces a common heat sink 15, with a TIL 16 providing the mechanical and thermal interface between the prepackage 12 and the heat sink 15.

Figure 7B:
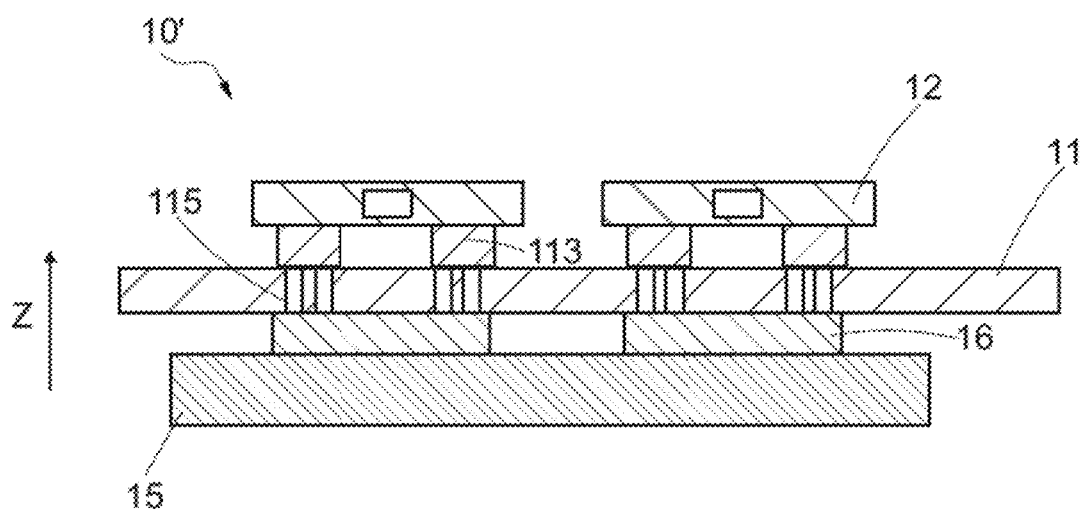
FIG. 7B is a schematic cross-sectional illustration of an alternative exemplary arrangement in which power semiconductor prepackages and a heat sink are arranged on opposite sides of the multi-layer carrier substrate.

FIG. 7B shows an alternative converter arrangement 10' in which the prepackages 12 and the heat sink 15 are mounted on opposite sides of the carrier substrate 11. As before, the prepackages 12 are surface mounted to the substrate 11 using soldered or sintered connections 113. The heat sink 15 mechanically and thermally interfaces with the substrate 11 via a TIL 16. The length and thermal resistance of the path of thermal conduction between the prepackages 12 and the heat sink 15 is increased by mounting the prepackages 12 and heat sink 15 on opposite sides of the substrate 11. For this reason, the arrangement of FIG. 7A may be provided instead of the arrangement of FIG. 7B. The addition of integrated thermally conductive elements 115 into the carrier substrate may, however, provide a useful and sufficient reduction in the thermal resistance. The thermally conductive elements may be, for example, copper vias.

Figure 8A:
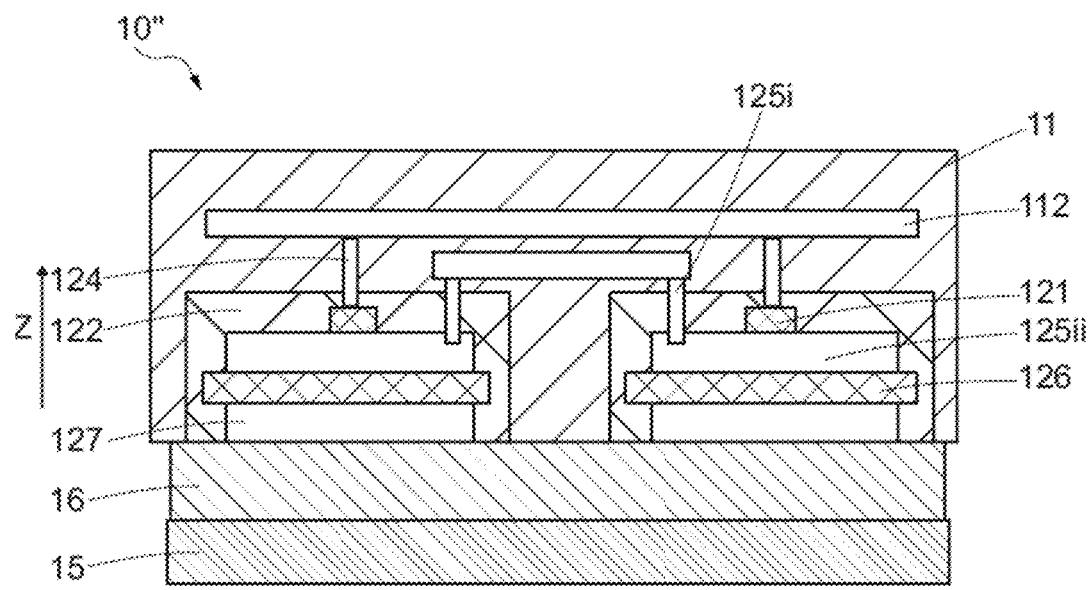
FIGS. 8A and 8B illustrate alternative embodiments of arrangements in which power semiconductor prepackages are embedded within a multi-layer carrier substrate.
Figure 8B:
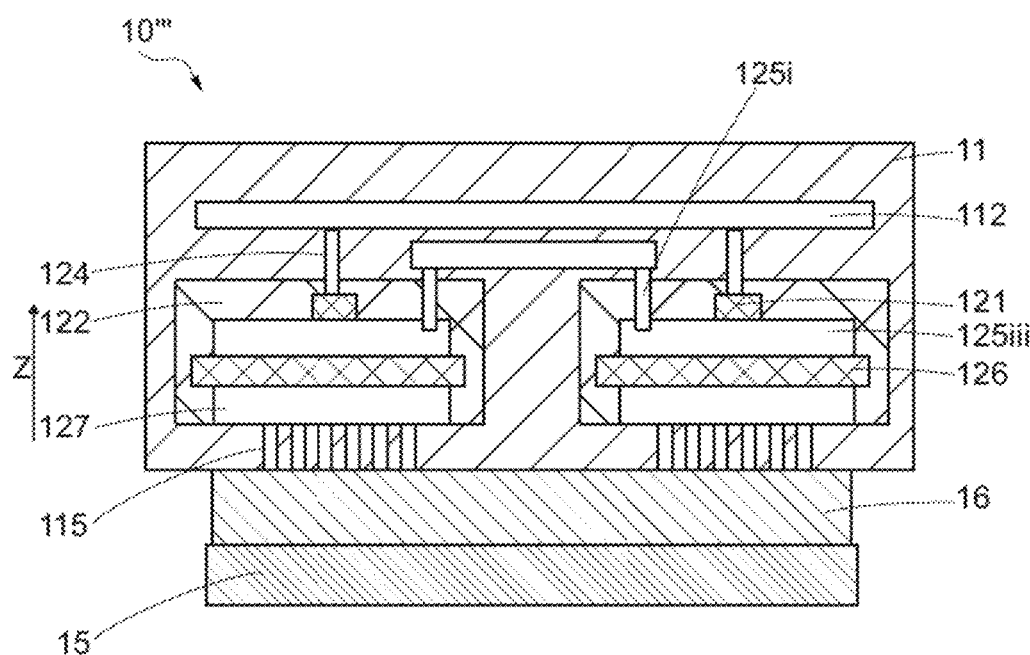

FIGS. 8A and 8B show further alternative converter arrangements 10", 10''' in which the prepackages 12 are embedded within the multi-layer carrier substrate 11. Embedding the prepackages 12 may offer a number of advantages. First, the embodiments eliminate some air gaps from the converter that may otherwise be vulnerable to electrical breakdown due to the high voltages and electric fields that may be used in converters of the present disclosure. Second, it is possible to make the converter somewhat more compact in the z-direction because of the elimination of some gaps. Third, there is a reduced need to form, for example, soldered or sintered connections between the prepackages and the conductive elements of the substrates 11, which provides some reduction in manufacturing complexity and eliminates a source of failure. Removing heat from the arrangements 10", 10''' of FIGS. 8A and 8B is, however, more challenging.

FIG. 8B differs from FIG. 8A in that the prepackages 12 are fully embedded within the substrate 11 and thus entirely surrounded by insulating material. In FIG. 8A, an underside of the prepackage 12 is exposed and flush with one of the planar surfaces of the substrate 11. Fully embedding the prepackages 12 in the substrate 11 results in a further improvement in the electrical isolation of the power semiconductors 121, but also further increases the thermal resistance between the prepackages 12 and heat sink 15. In FIG. 8B, thermally conductive elements 115 are integrated into the substrate 11 to reduce the thermal resistance of the path of the thermal conduction.

In each of the examples described above, the power electronics converters 10, 10', 10", 10'" have taken the form of a two-level AC-DC converter. Those skilled in the art will appreciate that the concepts described may be equally applied to different types of power electronics converters, including alternative AC-DC converter topologies (including multi-level converter topologies) and DC-DC converters. FIGS. 10A-10C, 11A, and 11B illustrate various AC-DC and DC-DC power electronics converter circuits that may be used in accordance with the embodiments described above.

Figure 9:
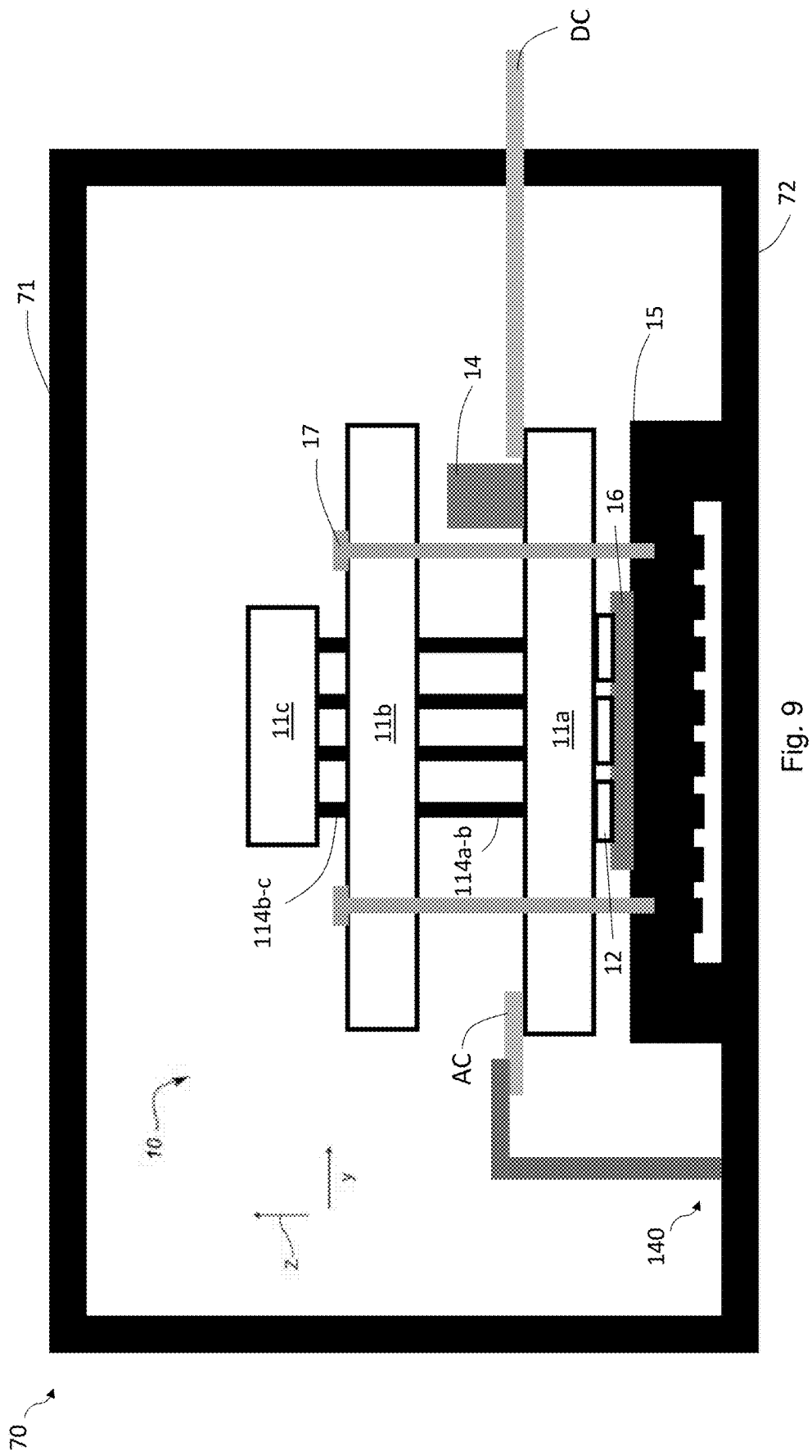
FIG. 9 illustrates an embodiment of a power electronics converter in which several multi-layer carrier substrates with different functions are stacked in a z-direction.

The above description has explained how components of the commutation cell of a power electronics converter 10 may be electrically connected (e.g., via a multi-layer planar carrier substrate 11) and cooled (e.g., via a heat sink 15). FIG. 9 illustrates how additional functional components of a converter 10 (e.g., components associated with monitoring, protection, and control of the converter 10) may be incorporated by the stacking of carrier substrates. In this particular example, the converter 10 is a three-phase, two-level DC-AC converter having an AC side that is connected to windings of an electrical machine 140. This is not intended to be limiting.

As shown, the converter 10 includes a plurality of planar carrier substrates 11a, 11b, 11c that are spaced apart (e.g., stacked) in the z-direction. The plurality of planar carrier substrates includes a first carrier substrate 11a, a second carrier substrate 11b and, in this particular example, a third carrier substrate 11c. In accordance with the present example, each of the carrier substrates 11a, 11b, 11c is associated with a different set of converter components having different functions.

The first planar carrier substrate 11a is associated with the commutation cell of the power electronics converter 10. The first carrier substrate 11a is connected to the components of the power circuit of the commutation cell (e.g., the power semiconductor prepackages 12, an input capacitor 14, and DC and AC input/output connections). The prepackages 12, the capacitor 14, and the connection to each other through conductive layers of the first carrier substrate 11a and electrical connections extending in the z-direction have been described above.

As in the examples described above, the heat-generating components of the commutation cell (e.g., the prepackages 12, which include the power semiconductor switching elements) are cooled by a heat sink 15 that interfaces with the heat removal sides of the prepackages 12 via a TIL 16.

The second planar carrier substrate 11b, which is spaced apart (e.g., in the +z direction relative to a z=0 plane that coincides with the first planar carrier substrate 11a) from the first planar carrier substrate 11a, is associated with additional components that do not form part of the power circuit cell of the commutation cell. For example, the second planar carrier substrate 11b may be associated with and be connected to an AC filter or one or more sensors (e.g., a temperature sensor, a voltage sensor, or a current sensor such as a Rogowski coil) for sensing one or more operating conditions or parameters of the converter 10. Additionally or alternatively, the second planar carrier substrate 11b may be associated with and connected to a protection device (e.g., a solid state circuit breaker or a solid state power controller) operable to protect (e.g., electrically isolate) components of the power circuit in case of a fault or failure.

The converter 10 is shown to further include electrical connections 114a, 114b that extend in the z-direction between the first planar carrier substrate 11a and the second planar carrier substrate 11b. The electrical connections 114a, 114b connect the power circuit components and, for example, the sensors and/or protection devices as required to perform their functions (e.g., isolation of the power circuit in case of a fault). A distance between the first planar carrier substrate 11a and the second planar carrier substrate 11b, measured in the z-direction, may be greater than a distance between the first planar carrier substrate 11a and the heat sink 15. For example, the distance between the first planar carrier substrate 11a and the second planar carrier substrate 11b, measured in the z-direction, may be of the order of one centimeter or a number of centimeters.

In the illustrated example, heat produced by the components associated with the second planar carrier substrate 11b is removed by the same heat sink 15 that serves the first planar carrier substrate 11a. The components associated with the second planar carrier substrate 11b may produce less heat than the components associated with the first planar carrier substrate 11a (e.g., the power semiconductor switching elements) because, for example, the components associated with the second planar carrier substrate 11b may have lower power ratings or are only intermittently used and may thus require a less direct heat removal path. In some examples, heat may be transferred by conduction from the second planar carrier substrate 11b and components of the second planar carrier substrate 11b to the heat sink 15 along the electrical connections 114a, 114b. In other examples, a dedicated heat transfer path between the second planar carrier substrate 11b and the heat sink 15 may be provided.

The third planar carrier substrate 11c, which is spaced apart (e.g., in the +z direction) from the second planar carrier substrate 11b, is associated with control functions of the converter 10. For example, the third planar carrier substrate 11c may be associated with and connected to one or more processors (e.g., digital signal processors) that supply control signals to components associated with the first planar carrier substrate 11a and the second planar carrier substrate 11b. The one or more processors may also receive signals (e.g., sensor measurement signals or fault indication signals) from the components associated with the first planar carrier substrate 11a and the second planar carrier substrate 11b.

The converter 10 is shown to further include electrical connections 114b, 114c that extend in the z-direction between the second planar carrier substrate 11b and the third planar carrier substrate 11c. The electrical connections 114b, 114c connect, for example, the processor(s) of the third planar carrier substrate 11c to the components of the first planar carrier substrate 11a and the second planar carrier substrate 11b so that signals may be exchanged between the components. Heat generated by the components of the third planar carrier substrate 11c (e.g., one or more processors) may also flow along the connections 114b-c for onward transfer to the heat sink 15. Alternatively, a dedicated transfer path between the third planar carrier substrate 11c and the heat sink 15 may be provided. The distance between the second planar carrier substrate 11b and the third planar carrier substrate 11c, measured in the z-direction, may be similar to the distance between the first planar carrier substrate 11a and the second planar carrier substrate 11b. For example, the distance between the second planar carrier substrate 11b and the third planar carrier substrate 11c, measured in the z-direction, may be of the order of one centimeter or a number of centimeters.

In some examples, the processor(s) of the third planar carrier substrate 11c determine, based on, for example, a request for a particular power or torque from an electrical machine 140, appropriate switching parameters (e.g., switching frequencies, duty cycles, and the like) for the power semiconductor switching elements 121 of the first substrate 11a. Based on the determination, the processor(s) may supply low voltage (e.g., 3-5 Volts) control signals to a gate driver circuit 13 (not shown in FIG. 9) that is connected to gate terminals of the power semiconductor switching elements 121 of the prepackages 12. In some examples, the gate driver circuit 13 is associated with the first planar carrier substrate 11a and receives the control signals either directly from the processor(s) or via a logic circuit associated with the second planar carrier substrate 11b. In other examples, the gate driver circuit 13 may be associated with the second planar carrier substrate 11b and delivers switching signals to the gate terminals via the connections 114a, 114b.

The processor(s) associated with the third planar carrier substrate 11c may also perform health monitoring and diagnostic determinations based on, for example, sensor measurements received via sensor components associated with the second planar carrier substrate 11b. In some examples, the processor(s) may supply control signals to protection devices of the second planar carrier substrate 11b based on health monitoring and diagnostic determinations.

As noted previously, in this example, the power electronics converter 10 is a DC-AC converter that is connected at an AC side of the power electronics converter 10 to the windings of an electrical machine 140. FIG. 9 shows a DC input of the power cell connected to a DC power channel that extends outside of a housing 70 of the converter 10, and an AC output of the power cell connected to the electrical machine 140. The housing 70 may provide shielding against electromagnetic interference (EMI) to the AC-side connection. A lid 71 of the housing 70, which during level flight of an aircraft may be an upper surface of the housing 70, may protect the converter 10 against incident cosmic radiation. The converter 10 and the electrical machine 140 may be integrated within an EPU of an aircraft.

In some examples, there may be close integration of the power electronics converter 10 and the electrical machine 140. For example, the heat sink 15 may be a common heat sink for the both the converter 10 and the electrical machine 140. In some examples, a portion of the housing 70 (e.g., the wall 72 of the housing 70) may be both a wall of the housing 70 of the converter 10 and a wall of a machine housing of the electrical machine 140. Heat generated by both the electrical machine 140 and the converter 10 may be removed by the heat sink 15, which is disposed between the electrical machine 140 and the converter 10.

Figure 10A:
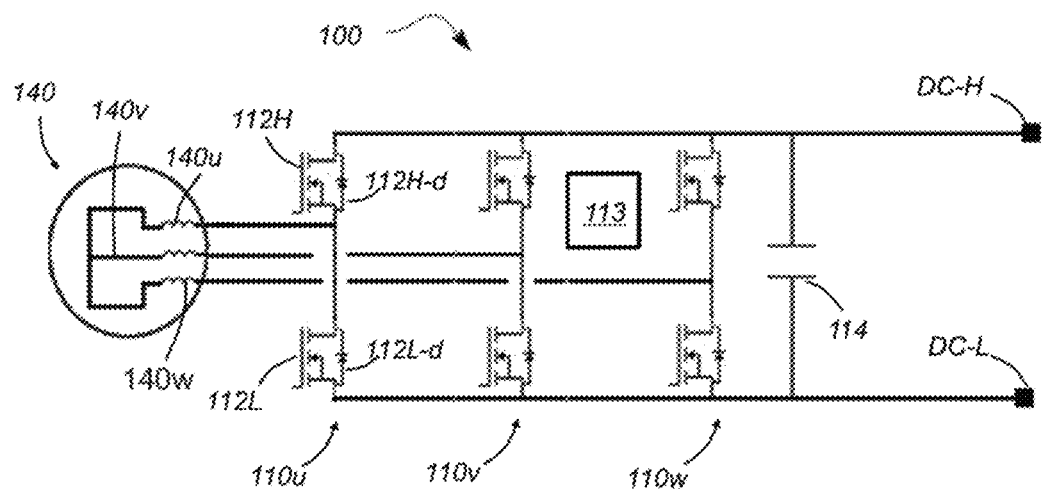
FIG. 10A illustrates one embodiment of a two-level, three phase inverter powering a three-phase motor.

FIG. 10A shows a three-phase electrical machine 140 connected to a two-level, three-phase AC-DC converter 100. The electrical machine 140 is configured as a motor, and the converter 100 is configured as an inverter; the arrangement of a generator and rectifier would be very similar.

In this example, one end of each phase winding 140u-w of the motor 140 is connected at a common point (e.g., the 'star' or 'Y' point), though, for example, a Delta connection arrangement of the windings 140u-w may also be used. The other end of each phase winding is connected to a corresponding phase leg 110u-w of the inverter 100 at a phase connection point. Each phase leg 110u-w is further connected to high and low DC inputs DC-H, DC-L that may, for example, connect to a DC bus such as the DC bus 330 of FIG. 12A. Each phase leg includes high- and low-side transistors 112H, 112L and associated parallel diodes 112H-d, 112L-d connected between the high- and low-side DC inputs DC-H, DC-L.

The inverter 100 further includes a smoothing DC-link capacitor 114 that is connected between the high and low DC inputs DC-H, DC-L and a gate driver circuit 113 that is connected to and configured to supply switching signals to the gate terminals of the transistors 112H, 112L. The gate driver circuit 113 may receive low-power control signals from a controller (not illustrated) and amplifies the low-power signals to supply the gate terminals with switching signals suitable for controlling the on/off state of the transistors 112H, 112L of the phase legs 110u-w.

In this example, the transistors 112L, 112H are MOSFETs (e.g., Silicon Carbide (SiC) MOSFETs). Thus, as will be appreciated by those skilled in the art, the parallel diodes 112H-d, 112L-d associated with the MOSFETs 133, 134 may not be discrete components but rather the so-called 'body diodes' of the MOSFETs (e.g., the inherent diode characters of the MOSFETs). In other examples, the diodes 112H-d, 112L-d may be discrete components separate from the transistors 112H, 112L.

In use, the inverter 100 receives DC electrical power via the DC connections DC-H, DC-L. The gate terminals of the transistors 112H, 112L receive switching signals from the gate driver circuit 113. As will be understood by those skilled in the art, the switching signals switch the transistors 112L, 112H of each phase leg 110u-w between conductive and non-conductive (e.g., 'on' and 'off') states, commutating current from the upper and lower branches of each phase leg 110u-w to the respective phase winding 140u-w of the motor 140. Timings and durations of the switching are controlled so that AC electrical power is supplied to the phase windings 140u-w of the motor 140 via the AC phase connection points.

Figure 10B:
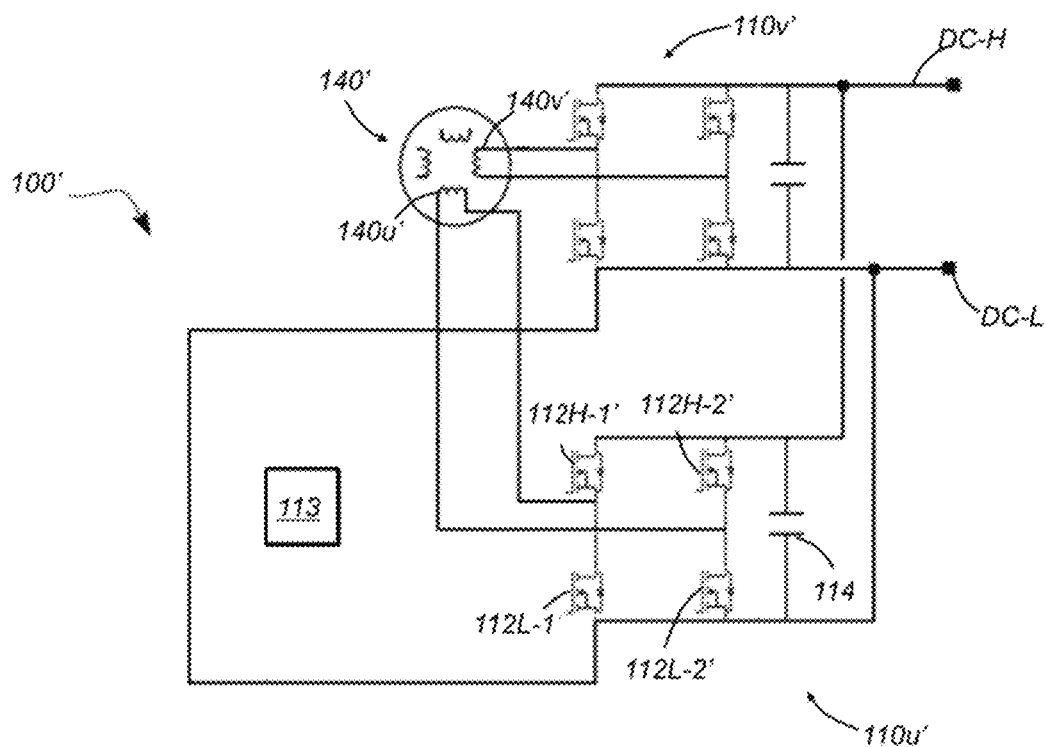
FIG. 10B illustrates a plurality of H-bridge inverter circuits powering a four-phase motor, according to an embodiment.

FIG. 10B illustrates another inverter circuit 100'. In this example, a four-phase electrical motor 140' is supplied with electrical power from a two-level DC supply via an AC-DC power electronics converter 100' including four independent H-bridge circuits. For clarity, FIG. 10B only shows two of the four H-bridge circuits 110u', 110v', connected with a corresponding two of the four phases 140u', 140v' of the motor 140'.

Each H-bridge circuit (e.g., H-bridge circuit 110u') includes four transistors 112L-1', 112H-1', 112L-2', 112H-2' and associated parallel diodes connected in an H-bridge configuration between the high and low DC connections DC-H, DC-L and one of the phase windings 140u' of the motor 140'. A DC-link capacitor 113 is also connected between the DC connections DC-H, DC-L. During operation, the DC connections supply DC electrical power to the H-bridge circuit 110u', and the gate driver circuit 113 supplies switching signals to the gate terminals of the transistors 112L-1', 112H-1', 112L-2', 112H-2'. The switching of the transistors between their conductive and non-conductive states affects inversion of the DC power to AC power for supply to the phase windings 140u' of the motor 140'.

Figure 10C:
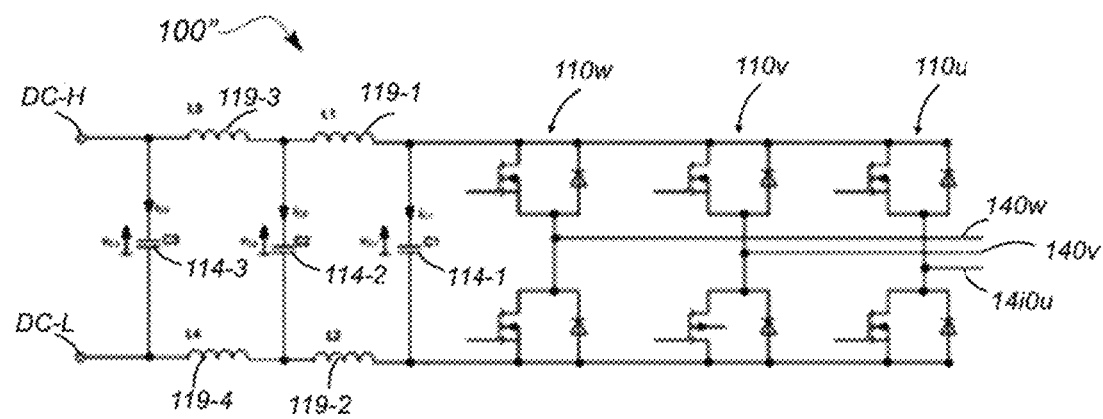
FIG. 10C illustrates one embodiment of a two-level, three phase inverter with a more complex DC-side filter.

FIG. 10C shows an inverter 100" circuit with a DC-side filter that is more complex than the single DC-link capacitor of the converters 100, 100' of FIGS. 10A-B. The inverter 100" is, like the inverter 100 of FIG. 10A, a two-level three phase inverter. However, the inverter 100" includes a DC filter having three capacitors 114-1, 114-2, 114-3 and four inductors 119-1, 119-2, 119-3, 119-4 connected between the DC connections DC-L, DC-H and the converter phase legs 110u-w. Any suitable DC-side filter circuit may be used in accordance with the embodiments described herein.

Figure 11A:
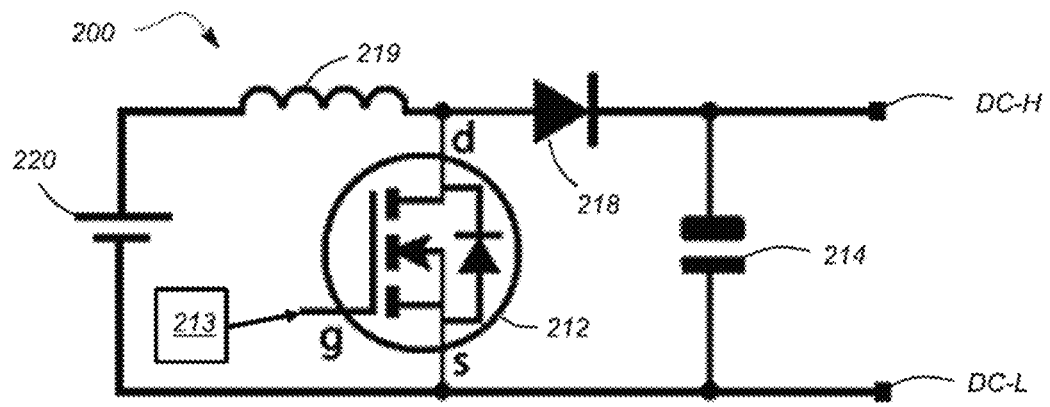
FIG. 11A illustrates one embodiment of a DC-DC converter connected with the terminals of a battery.

FIG. 11A illustrates a DC-DC converter 200 of the boost type. Buck type and buck-boost type DC-DC converters are also known.

Figure 12A:
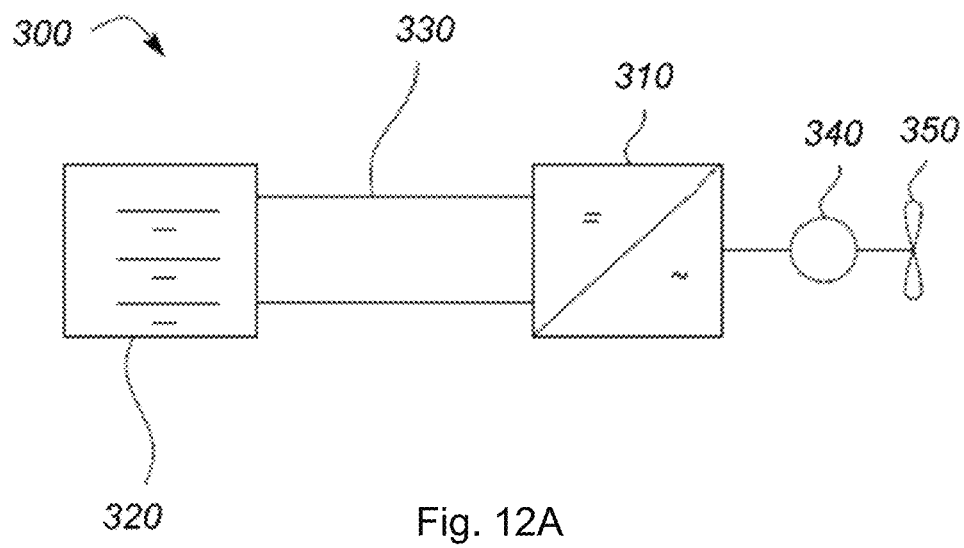
FIG. 12A is a schematic illustration of one embodiment of an electric aircraft power and propulsion system.
Figure 15A:
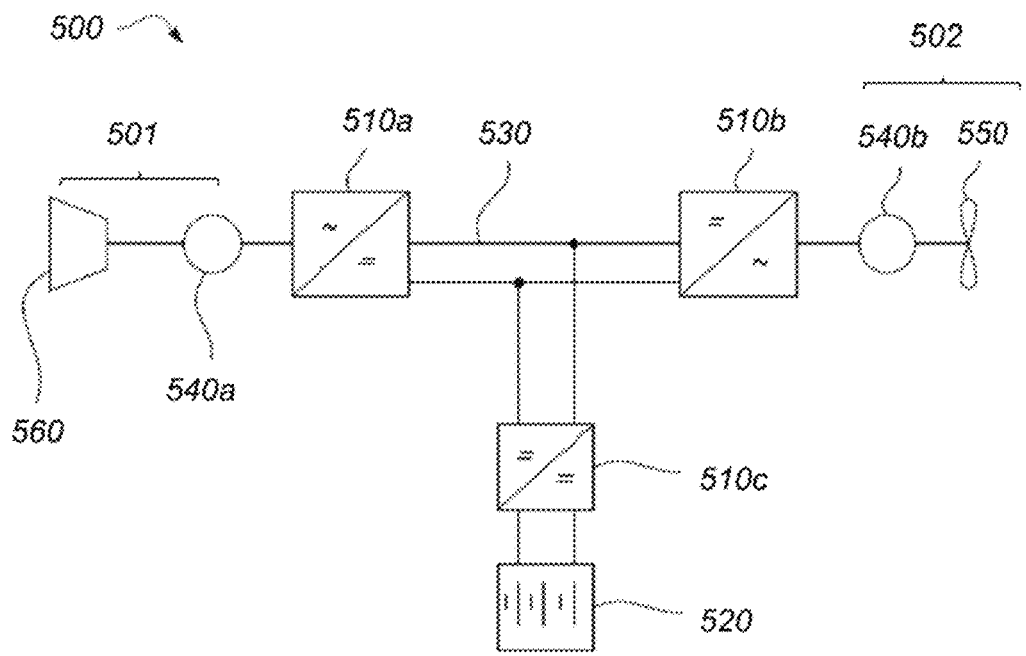
FIG. 15A is a schematic illustration of one embodiment of a hybrid electric aircraft propulsion system.

The DC-DC converter 200 is connected to a battery 220 at one of its sides and on the other of its sides is connected to, for example, a DC power channel such as the DC power channel 330 of FIG. 12A or the DC power channel 530 of FIG. 15A.

The DC-DC converter 200 includes a transistor 212, a gate terminal (g) of which is connected to a gate driver circuit 213. As in the previous examples, the transistor 212 is a MOSFET and the parallel diode associated with the transistor 212 may be an additional discrete diode of the inherent body diode of the MOSFET. The converter circuit 200 further includes a diode 218, a smoothing capacitor 214 (which may be referred to as the input capacitor in the context of a DC-DC converter), and an inductor 219.

In use, the DC-DC converter circuit 200 receives DC power, either from the terminals of the battery 220 or from the DC connections DC-L, DC-H. The gate driver circuit 213 supplies the gate terminal (g) of the transistor with switching signals to control the on/off state of the transistor 212 to affect the desired voltage increase or decrease.

Figure 11B:
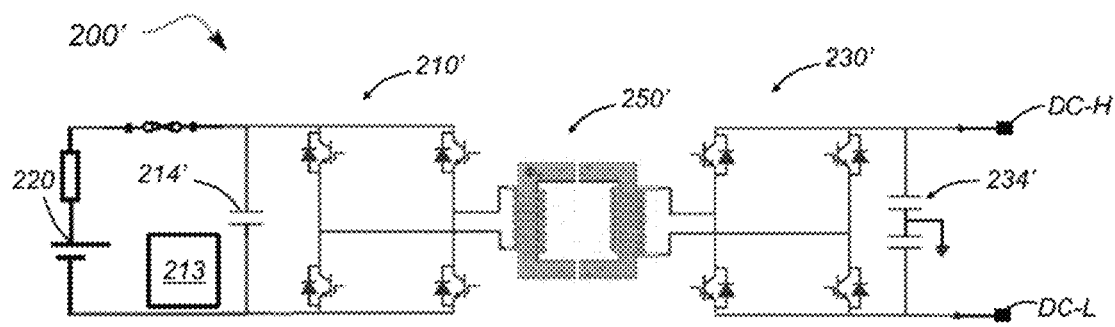
FIG. 11B illustrates one embodiment of a DC-AC-DC converter connected with the terminals of a battery.

FIG. 11B illustrates another type of DC-DC converter 200'. The DC-DC converter 200' is of the DC-AC-DC type and includes back-to-back inverter 210' and rectifier 230' stages with an intermediate transformer 250'. In this example, each of the inverter 210' and the rectifier 230' are of the H-bridge type, though other inverter and rectifier circuits may be used. Each have associated DC-side filters 214', 234'.

In use, the DC-DC converter 200' receives DC current from a DC current source (e.g., the energy storage system 230 or via the DC connections DC-H, DC-L). The gate terminals of the transistors of the H-bridge circuits 210', 230' receive switching signals from the gate driver circuit 213, which affects inversion of DC and rectification of AC to supply current to or receive current from the windings of the transformer 250'. The DC output by one of the first and second H-bridge circuits 210', 230' is supplied to either the battery 220 or a DC network via the DC connections DC-L, DC-H.

FIGS. 12A, 12B, 13A, 13B, 14, 15A, and 15B illustrate exemplary aircraft power and propulsion systems 300, 400, 500 including power electronics converters. The power electronics converters may be of the efficient, power-dense types described herein.

FIG. 12A is a schematic illustration of a purely electric aircraft propulsion system 300. The system 300 includes an electrical energy storage unit 320 (e.g., a high-voltage battery pack) that supplies a DC power channel 330 with DC electrical power. The DC power channel 330 supplies electrical power to electrical loads including an electric motor 340 that drives rotation of a propulsor 350 (e.g., a propeller or ducted fan). An inverter 310 converts the DC power from the DC power channel 330 to AC power for supply to the windings of the motor 340. In some embodiments, the inverter 310 may be integrated with (e.g., share a common housing structure with) the motor 340, and/or the motor 340 may be integrated with the propulsor 350.

Although not illustrated, the electrical propulsion system 300 may optionally include a DC-DC converter connected between the terminals of the battery pack 320 and the DC power channel 330 to regulate the voltage on the DC power channel. For example, the terminal voltage of the battery pack 320 will tend to drop (e.g., by a factor of up to two) as the battery pack 320 discharges from a maximum charge level to a lower charge level. By way of an example, the voltage may drop from a maximum voltage level of 900 V to 450 V over the course of its discharge. A DC-DC converter may therefore be used to boost the terminal voltage to maintain a constant voltage on the DC power channel 330. Other arrangements may omit the DC-DC converter and compensate for the voltage drop and the associated power drop by increasing the current delivered to the loads (e.g., the motor 340).

Figure 13A:
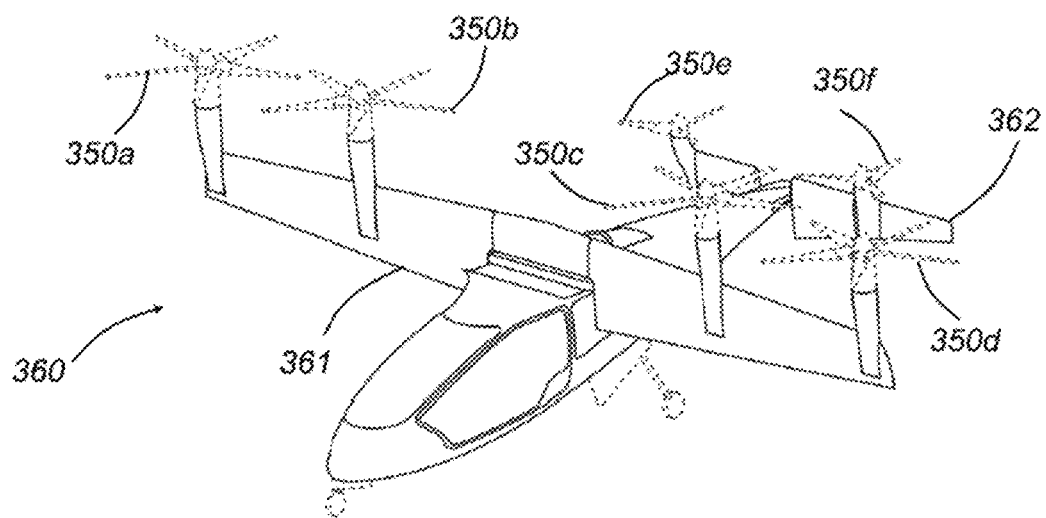
FIG. 13A is a perspective view of one embodiment of an electric vertical take-off and landing (eVTOL) aircraft including six electrically powered propulsors in an eVTOL flight configuration.

The electrical power and propulsion system 300 illustrated in FIG. 12A includes only a single power channel (or power 'lane') and a single propulsor. In practice, a power and propulsion system may include multiple channels and be of a more complex configuration. To illustrate, FIG. 13A shows an exemplary electrical vertical take-off and landing (eVTOL) aircraft 360 that has a distributed propulsion system that in this case includes six propulsors 350a-f. In this arrangement, each propulsor 350a-f may be associated with its own power channel (e.g., six power channels of the type shown in FIG. 12A). In another example, one or more of the propulsors 350a-f may share a power channel so that there are fewer than six power channels.

Still referring to FIG. 13A, four of the propulsors 350a-d are coupled to the wings 361 of the aircraft 360, while the remaining two propulsors 350e-f are coupled to rear flight surfaces 362. The wings 361 and rear flight surfaces 362 tilt between a VTOL configuration (shown in FIG. 13A), in which the propulsors 350a-f provide thrust for lift, and a forward flight configuration (shown in FIG. 13B), in which at least some of the propulsors (e.g., the rear propulsors 350e-f in FIG. 13B) provide forward thrust. Other numbers of propulsors (e.g., four or eight) are possible, as are other eVTOL configurations (e.g., multicopter designs and variations of the illustrated tilt rotor design are also known).

Figure 12B:
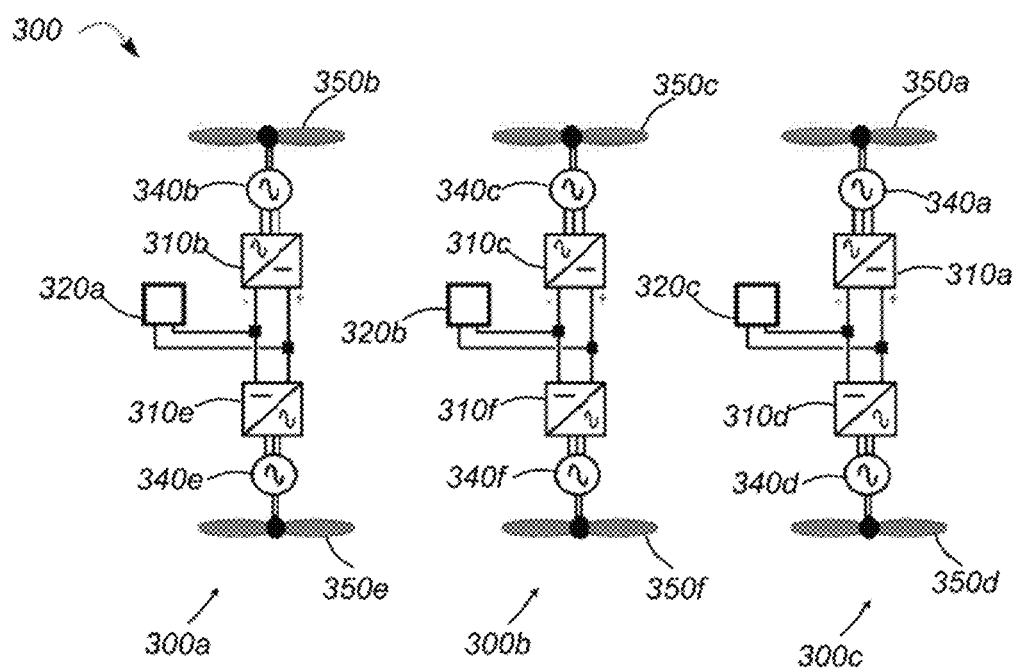
FIG. 12B is a schematic illustration of one embodiment of a multi-channel electric power and propulsion system for an aircraft including six electrically powered propulsors.

FIG. 12B illustrates how six electrically powered propulsors (e.g., the six propulsors 350a-f of FIGS. 13A-B) may be arranged within an electrical power system 300. The power system 300 includes three independent power system channels 300a, 300b, 300c, each of which is associated with two of the six propulsors 350a-f. In this specific example, each of the first two power channels 300a, 300b is associated with one front propulsor 350b, 350c and one rear propulsor 350e, 350f, while the third channel 300c is associated with one front-left propulsor 350a and one front-right propulsor 350d. Each propulsor 350a-f is associated with a respective motor 340a-f and a respective inverter 340a-f. Other power system configurations are possible and will occur to those skilled in the art. For example, the system 300 may feature connections between power channels 300a-c and the use of multi-redundant motor winding arrangements to allow power sharing between some or all the power channels 300a-c and to increase fault-tolerance and power availability.

Figure 13B:
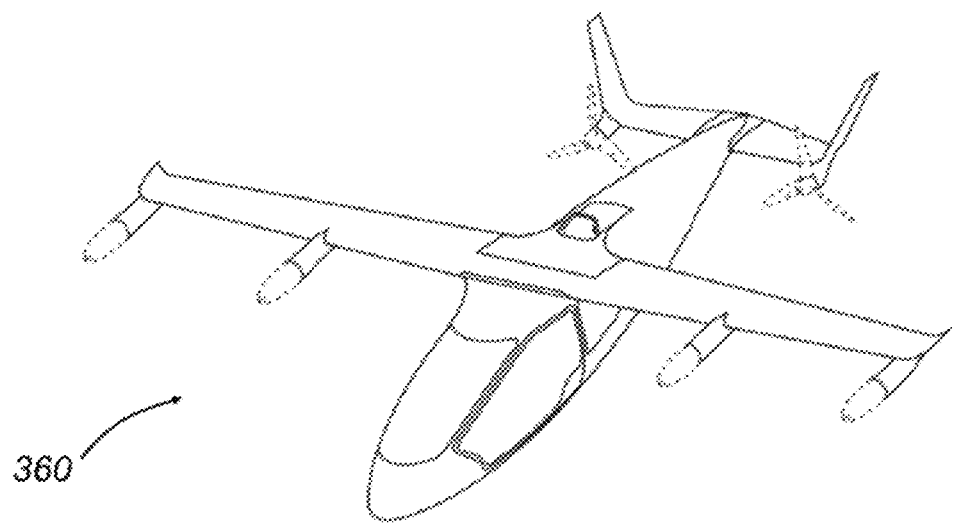
FIG. 13B is a perspective view of the eVTOL aircraft of FIG. 13A in a forward flight configuration.

The use of a distributed propulsion system such as that illustrated in FIG. 12B and FIGS. 13A-B may be highly desirable in terms of improved flight characteristics, reduced aerodynamic noise, and reduced drag. The use of the distributed propulsion system, however, also may increase the number of power electronics converters present in the electrical power system. For example, applying the system of FIG. 12B, the platform may include nine independent power electronics converters (e.g., six inverters and three DC-DC converters), which may add considerable weight to the platform and add losses to the power system. Thus, for platforms of this type, the improvements in the efficiency and power-density of the converters disclosed herein may be particularly advantageous.

Figure 14:
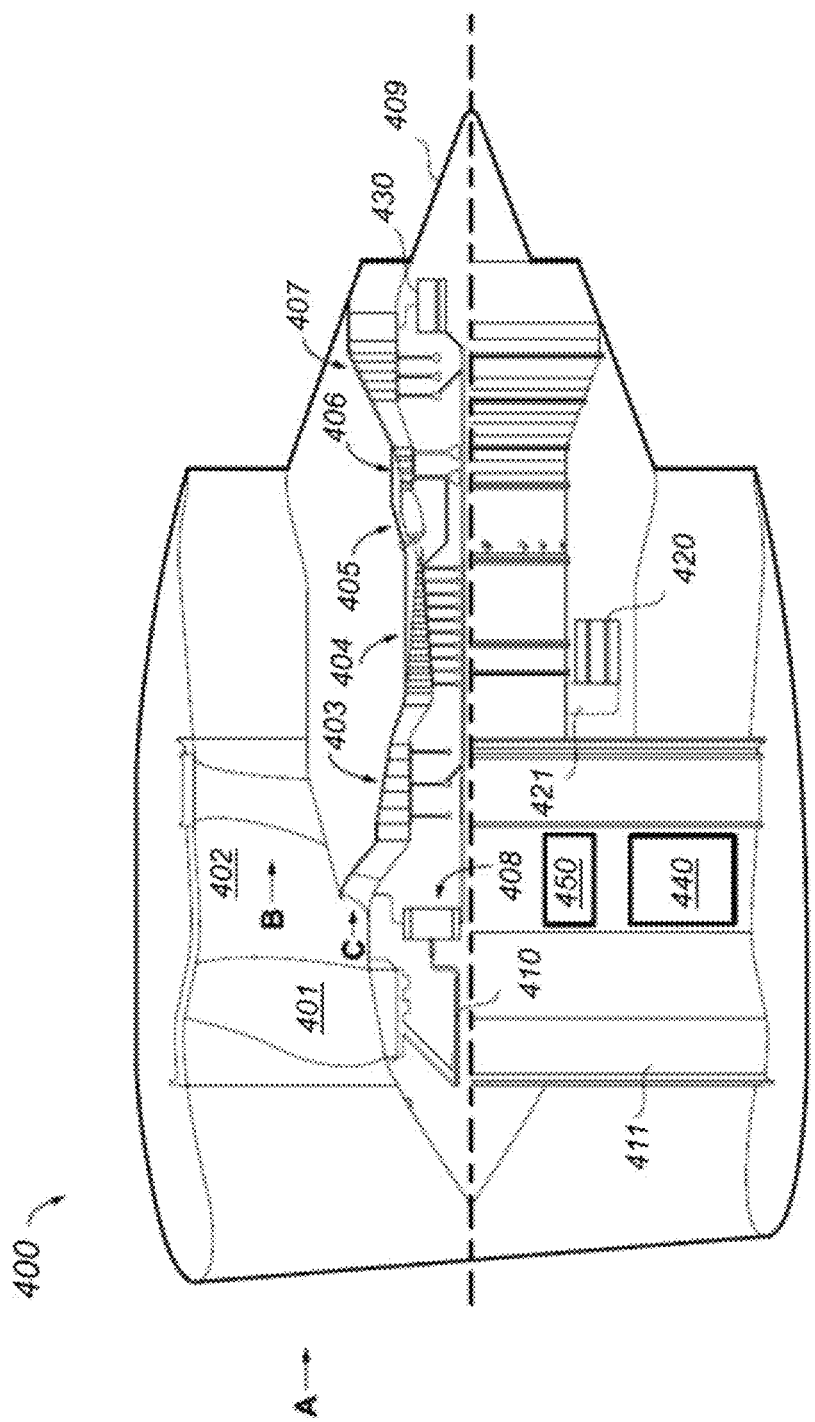
FIG. 14 shows an arrangement of one embodiment of a turbofan engine for an aircraft.

FIG. 14 shows an arrangement of an engine 400 for an aircraft. The engine 400 is of turbofan configuration, and thus includes a ducted fan 401 that receives intake air A and generates two pressurized airflows: a bypass flow B that passes axially through a bypass duct 402 and a core flow C that enters a core gas turbine.

The core gas turbine includes, in axial flow series, a low-pressure compressor 403, a high-pressure compressor 404, a combustor 405, a high-pressure turbine 406, and a low-pressure turbine 407.

In operation, the core flow C is compressed by the low-pressure compressor 403 and is then directed into the high-pressure compressor 404 where further compression takes place. The compressed air exhausted from the high-pressure compressor 404 is directed into the combustor 405 where the compressed air is mixed with fuel and the mixture is combusted. The resultant hot combustion products then expand through, and thereby drive, the high-pressure turbine 406 and in turn the low-pressure turbine 407 before being exhausted to provide a small proportion of the overall thrust.

The high-pressure turbine 406 drives the high-pressure compressor 404 via an interconnecting shaft. The low-pressure turbine 407 drives the low-pressure compressor 403 via another interconnecting shaft. Together, the high-pressure compressor 404, high-pressure turbine 406, and associated interconnecting shaft form part of a high-pressure spool of the engine 400. Similarly, the low-pressure compressor 403, low-pressure turbine 407, and associated interconnecting shaft form part of a low-pressure spool of the engine 400. Such nomenclature will be familiar to those skilled in the art. Those skilled in the art will also appreciate that while the illustrated engine has two spools, other gas turbine engines have a different number of spools (e.g., three spools).

The fan 401 is driven by the low-pressure turbine 407 via a reduction gearbox in the form of a planetary-configuration epicyclic gearbox 408. Thus, in this configuration, the low-pressure turbine 407 is connected with a sun gear of the gearbox 408. The sun gear is meshed with a plurality of planet gears located in a rotating carrier. The plurality of planet gears are meshed with a static ring gear. The rotating carrier drives the fan 401 via a fan shaft 410. In alternative embodiments, a star-configuration epicyclic gearbox (in which the planet carrier is static, and the ring gear rotates and provides the output) may be used instead, and the gearbox 408 may be omitted entirely so that the fan 401 is driven directly by the low-pressure turbine 407.

It is increasingly desirable to facilitate a greater degree of electrical functionality on the airframe and on the engine. To this end, the engine 400 of FIG. 14 includes one or more rotary electrical machines (e.g., capable of operating both as a motor and as a generator). The number and arrangement of the rotary electrical machines will depend to some extent on the desired functionality. Some embodiments of the engine 400 include a single rotary electrical machine 420 driven by the high-pressure spool (e.g., by a core-mounted accessory drive 421 of conventional configuration). Such a configuration facilitates the generation of electrical power for the engine and the aircraft and the driving of the high-pressure spool to facilitate starting of the engine in place of an air turbine starter. Other embodiments, including the one shown in FIG. 14, include both a first rotary electrical machine 420 coupled with the high-pressure spool and a second rotary electrical machine 430 coupled with the low-pressure spool. In addition to generating electrical power and the starting the engine 400, having both first and second rotary machines 420, 430, connected by power electronics, may facilitate the transfer of mechanical power between the high and lower pressure spools to improve operability, fuel consumption, etc.

As mentioned above, in FIG. 14, the first rotary electrical machine 420 is driven by the high-pressure spool by a core-mounted accessory drive 421 of conventional configuration. In alternative embodiments, the first electrical machine 420 may be mounted coaxially with the turbomachinery in the engine 400. For example, the first electrical machine 420 may be mounted axially in line with the duct between the low- and high-pressure compressors 403 and 403. In FIG. 14, the second electrical machine 430 is mounted in the tail cone 409 of the engine 400 coaxially with the turbomachinery and is coupled to the low-pressure turbine 407. In alternative embodiments, the second rotary electrical machine 430 may be located axially in line with low-pressure compressor 403, which may adopt a bladed disc or bladed drum configuration to provide space for the second rotary electrical machine 430. It will be appreciated by those skilled in the art that any other suitable location for the first and, if present, second electrical machines may be adopted.

The first and second electrical machines 420, 430 are connected with power electronics. Extraction of power from or application of power to the electrical machines is performed by power electronics converters 440. In the present embodiment, the power electronics converters 440 are mounted on the fan case 411 of the engine 400, but it will be appreciated that the power electronics converters 440 may be mounted elsewhere such as on the core of the gas turbine, or in the vehicle to which the engine 400 is attached, for example.

Control of the power electronics converters 440 and of the first and second electrical machines 420 and 430 is in the present example performed by an engine electronic controller (EEC) 450. In the present embodiment, the EEC 450 is a full-authority digital engine controller (FADEC), the configuration of which will be known and understood by those skilled in the art. The EEC 450 therefore controls all aspects of the engine 400 (e.g., both the core gas turbine and the first and second electrical machines 420 and 430). In this way, the EEC 450 may holistically respond to both thrust demand and electrical power demand.

The one or more rotary electrical machines 420, 430 and the power electronics converters 440 may be configured to output to or receive electric power from one, two, or more DC buses or power channels. The DC power channels allow for the distribution of electrical power to other engine electrical loads and to electrical loads on the airframe.

Those skilled in the art will appreciate that the gas turbine engine 400 described above may be regarded as a 'more electric' gas turbine engine because of the increased role of the electrical machines 420, 430 compared with those of conventional gas turbines.

Figure 15B:
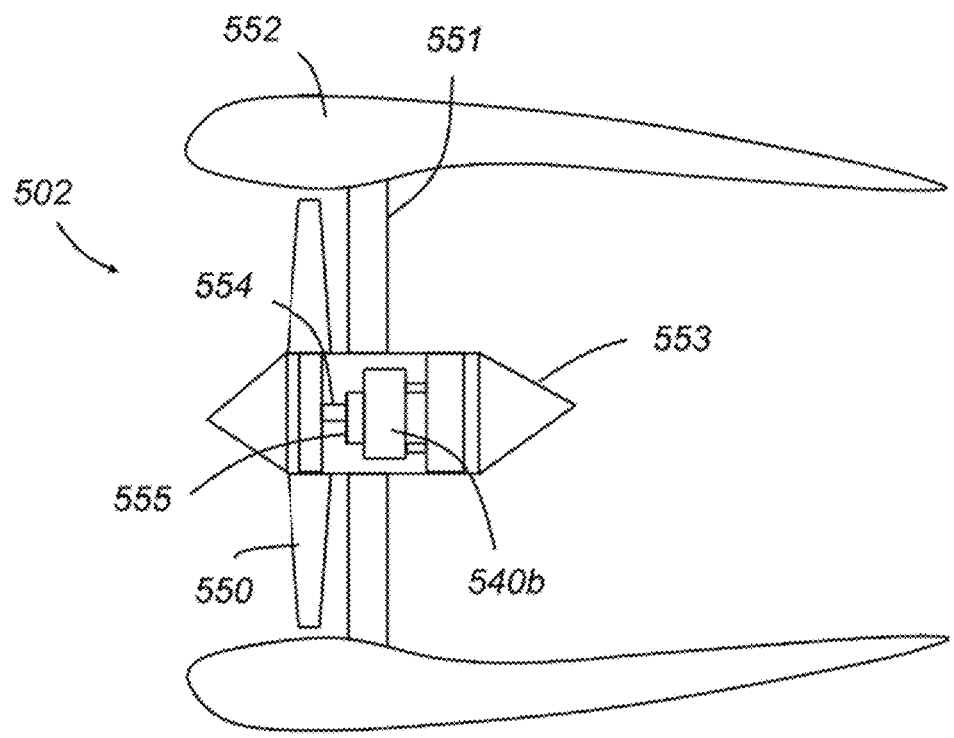
FIG. 15B illustrates one embodiment of an electrically powered propulsor such as may be used in an electric or hybrid electric propulsion system.

Turning now to FIG. 15A, this illustrates an exemplary power and propulsion system 500 of a hybrid electric aircraft. The system 500 includes a generator set 501 including an engine 560 and electrical generator 540a, and a battery pack 520. Both the generator set 501 and the battery pack 520 are used as energy sources to power a motor-driven propulsor 502, an example of which is shown in FIG. 15B.

The illustrated propulsion system 500 further includes a rectifier 510a, a DC distribution bus 530, an inverter 510b, and a DC-DC converter 510c. It will be appreciated that while one generator set 501 and one propulsor 502 are illustrated in this example, a propulsion system 500 may include more than one generator set 501 and/or one or more propulsor 502.

A shaft or spool of the engine 560 is coupled to and drives the rotation of a shaft of the generator 540a, which thereby produces alternating current. The rectifier 510a, which faces the generator 540a, converts the alternating current into direct current that is fed to various electrical systems and loads via the DC distribution bus 530. These electrical systems include non-propulsive loads (not shown in FIG. 15A) and the motor 540b that drives the fan 550 of the propulsor 502 via the inverter 510b.

The battery pack 520, which may be made up of a number of battery modules connected in series and/or parallel, is connected to the DC distribution bus 530 via the DC-DC converter 510c. The DC-DC converter 510c converts between a terminal voltage of the battery pack 520 and a voltage of the DC distribution bus 530. In this way, the battery pack 520 may replace or supplement the power provided by the generator set 501 (e.g., by discharging and thereby feeding the DC distribution bus 530) or may be charged using the power from the generator set 501 (e.g., by being fed by the DC distribution bus 530).

Referring to FIG. 15B, in this example, the propulsor 502 takes the form of a ducted fan incorporating an electrical machine 540b. The fan 550 is enclosed within a fan duct 551 defined within a nacelle 552 and is mounted to a core nacelle 553. The fan 550 is driven by the electrical machine 540b via a drive shaft 554, both of which may also be thought of as components of the propulsor 502. In this embodiment, a gearbox 555 is provided between the electrical machine 540b and the drive shaft 554.

The electrical machine 540b is supplied with electric power from a power source (e.g., the generator set 501 and/or the battery 520 via the DC bus 530). The electrical machine 540b of the propulsor 502, and indeed the electrical machine 540a of the generator set 501, may be of any suitable type (e.g., of the permanent magnet synchronous type).

The inverter 510b may be integrated with (e.g., share a common housing structure with) the electrical machine 540b and thus form a part of the propulsor 502. Likewise, the rectifier 510a may be integrated with (e.g., share a common housing structure with) the electrical machine 540a. The DC-DC converter 510c may itself be integrated with the energy storage system 520.

Those skilled in the art will recognize the propulsion system 500 of FIGS. 15A-B to be of the series hybrid type. Other hybrid electric propulsion systems are of the parallel type, while still others are of the turboelectric type or have features of more than one type. The configuration of the more electric engine 400 of FIG. 14 may be considered similar to a parallel hybrid system, with the main distinction being the roles of the electrical machines. For example, the electrical machines of a more electric engine may only be used in motor mode to start the engine and to improve engine operability, whereas the electric machines of a parallel hybrid propulsion system are used to motor the spools to meaningfully add to the amount of propulsive thrust produced by the turbomachinery.

Those skilled in the art will also appreciate that the hybrid architecture illustrated in FIG. 15A is only one example, and other architectures are known and will occur to those skilled in the art.

Figure 16A:
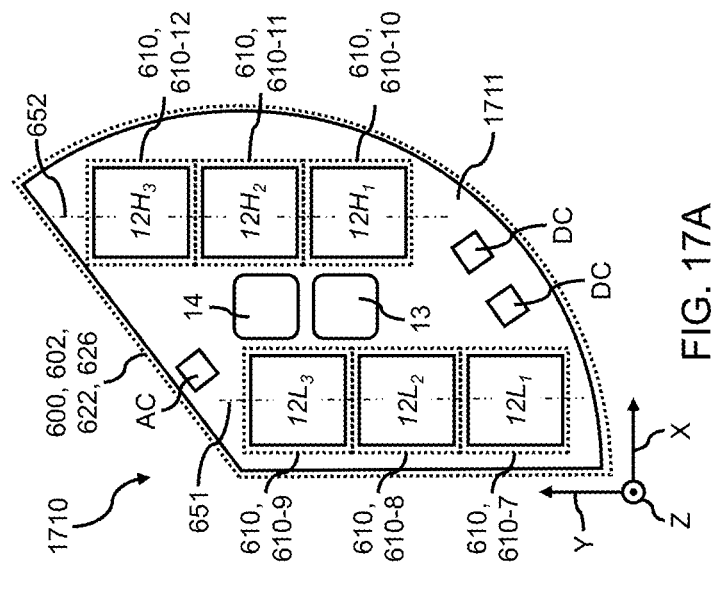
FIG. 16A is a schematic plan view illustration of a one-phase, two-level AC-DC converter, similar to that of FIG. 2A, further illustrating the concept of shape constraints.

FIG. 16A shows a schematic plan view illustration of a one-phase, two-level AC-DC converter 1610 (e.g., a converter). The converter 1610 is designed and manufactured according to a method 700 of manufacturing a power electronics converter according to an aspect of the present disclosure. A multi-layer carrier substrate 1611 of the converter 1610 meets a shape constraint 600. The converter 1610 is similar to the converter shown in FIG. 2A. The method 700, however, is applicable to any other converter according to the present disclosure. The converter 1610 serves as an example to illustrate the method 700.

The shape constraint 600 is a two-dimensional shape constraint 602 (e.g., a rectangular shape constraint 620) and defines a maximum area (e.g., defined by maximum extents in each of the x-direction and the y-direction) that is not to be exceeded by the multi-layer carrier substrate 1611. Thus, when a designer, who is faced with the objective of designing and/or manufacturing a power converter, applies the method 700 according to the disclosure, the shape constraint 600 may limit the number of possible types (e.g., shapes) of multi-layer carrier substrates 1611 to a limited number of possible multi-layer carrier substrates 1611, or even one single type (e.g., shape) of multi-layer carrier substrate 1611.

The converter 1610 includes a half-bridge circuit with six power semiconductor prepackages $12L_{1-3}$ and $12H_{1-3}$ that are each arranged according to a position constraint 610. Similar to the embodiment shown in FIGS. 3A and 3B, a low side of the half-bridge circuit includes three power semiconductor prepackages $12L_1$, $12L_2$, and $12L_3$ connected together in parallel. Likewise, a high side of the half-bridge circuit includes three power semiconductor prepackages $12H_1$, $12H_2$, and $12H_3$ connected together in parallel.

A first low-side semiconductor prepackage $12L_1$ is arranged according to a first position constraint 610-1, a second low-side semiconductor prepackage $12L_2$ is arranged according to a second position constraint 610-2, and a third low-side semiconductor prepackage $12L_3$ is arranged according to a third position constraint 610-3. A first high-side semiconductor prepackage $12H_1$ is arranged according to a fourth position constraint 610-4, a second high-side semiconductor prepackage $12H_2$ is arranged according to a fifth position constraint 610-5, and a third high-side semiconductor prepackage $12H_3$ is arranged according to a sixth position constraint 610-6. The six position constraints 610-1 to 610-6 are arranged in a grid, including two rows in the y-direction and three rows in the x-direction. The three low-side power semiconductor prepackages, $12L_1$, $12L_2$ and $12L_3$ are arranged in one row with respect to the y-direction, and the three high-side power semiconductor prepackages, $12H_1$, $12H_2$ and $12H_3$ are arranged in another, parallel row with respect to the y-direction.

Figure 17A:
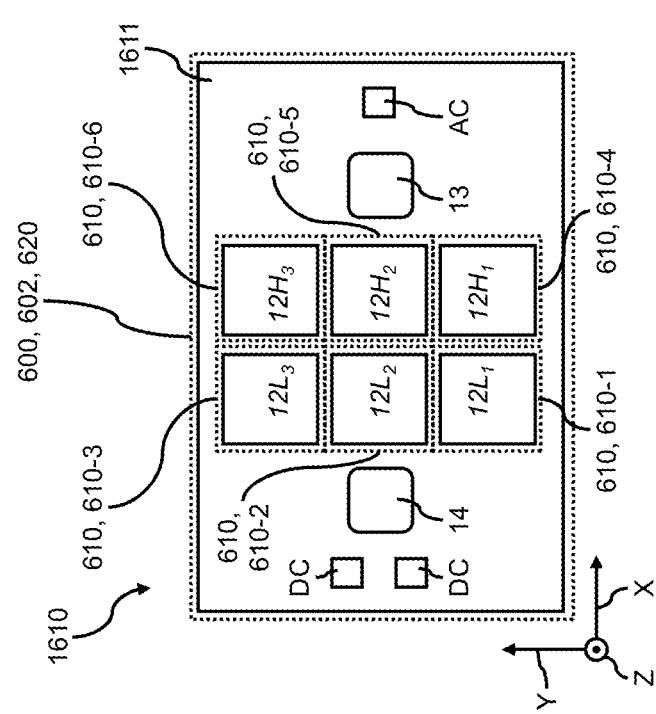
FIG. 17A is a schematic plan view illustration of another one-phase, two-level AC-DC converter designed and manufactured with a method according to the present disclosure.
Figure 17B:
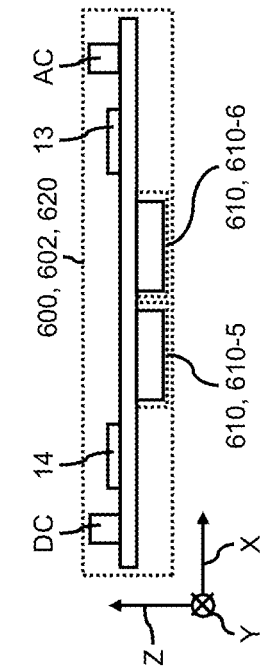
FIG. 17B is a schematic side view illustration of the AC-DC converter shown in FIG. 17A.

FIGS. 17A and 17B show another embodiment of a power converter 1710, with a multi-layer carrier substrate 1711 according to a shape constraint 600. The shape constraint 600 is a non-rectangular shape constraint 622 (e.g., a circular segment shape constraint 626). A non-rectangular shape constraint 622 may be particularly suitable for integrating a power converter into an EPU, such as an EPU of the power and propulsion system 500 shown in FIGS. 15A and 15B, or into other propulsion units such as the engine 400 shown in FIG. 14.

A non-rectangular shape constraint 622 such as the circular segment shape constraint 626 may be arranged (e.g., defined) in an axial plane, perpendicular to an axis of rotation. The axis of rotation may be an axis of rotation of, for example, the engine 400 or of the power and propulsion system 500. Due to the shape constraints, a suitable multi-layer carrier substrate (e.g., the multi-layer carrier substrate 1711) that matches an installation space 640 (exemplarily shown in FIG. 20) of an EPU, electrical machine, gas turbine, or the like propulsion and/or power generation device (e.g., of a vehicle such as an aircraft) may be selected.

The converter 1710 includes the same components as the converter 1610, including the six power semiconductor prepackages $12L_{1-3}$ and $12H_{1-3}$ on an underside of the multi-layer carrier substrate 1711, a gate driver circuit 13, an intermediate capacitor 14 (e.g., an intermediate DC-Link capacitor), as well as DC inputs and AC outputs on the upper side of the multi-layer carrier substrate 1711. In the present embodiment, however, the position constraints 610-7 to 610-12 are such that the three low-side power semiconductor prepackages $12L_1$, $12L_2$, and $12L_3$ are arranged in a first row 651 with respect to the y-direction, and the three high-side power semiconductor prepackages $12H_1$, $12H_2$, and $12H_3$ are arranged in a second row 652 with respect to the y-direction. The first row 651 and the second row 652 are parallel but spaced apart.

On the multi-layer carrier substrate 1711, the components may be flexibly arranged with respect to position in the x-direction and the y-direction without a negative impact on the electrical properties (e.g., parasitic inductance) of the converter (e.g., because of the power converter design measures according to this disclosure). Although the semiconductor prepackages $12L_{1-3}$, $12H_{1-3}$ are arranged in rows 651, 652 with the design and manufacturing method according to this disclosure, other arrangements, such as arcuate lines, may be used. From a manufacturing point of view, however, an arrangement in rows may be advantageous.

Figure 16B:
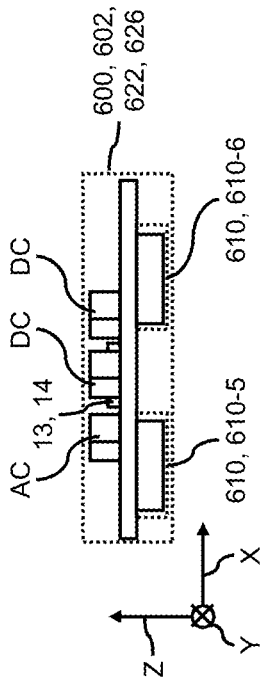
FIG. 16B is a schematic side view illustration of the AC-DC converter shown in FIG. 16A.

There may be further factors influencing the position constraints 610. For example, it may be required that a power semiconductor prepackage 12 is sufficiently spaced apart from another power semiconductor prepackage 12 due to thermal and/or electromagnetic considerations. Additionally or alternatively, it may be required that a semiconductor prepackage 12 is arranged sufficiently close to another semiconductor prepackage 12, or that a plurality of semiconductor prepackages 12 is arranged in a certain shape such as an arcuate line, due to the attachment to a correspondingly or suitably shaped heat sink. For such cases, position constraints may be formulated accordingly. Although the shape constraints 600 in FIGS. 16B and 17B show a vertical extension (e.g., an extension in the z-direction), unless otherwise noted, the z-direction may not be considered in the shape constraint 600. This may be because the sizes and shapes of the electronic components, such as the semiconductor prepackages 12, in the z-direction are relatively small and also not influenced by the disclosed design and manufacturing method 700. Therefore, for a substantially planar installation space 640, for example, the shape constraint 600 may be a two-dimensional shape constraint 602. Such installation space 640 does have an extension in the vertical direction, but due to the limited variation of the vertical extension of the electric components to be arranged on the multi-layer carrier substrate 1711, the extension in the vertical direction may not be considered in the shape constraint.

FIGS. 18A, 18B, 18C, 18D, 18F, 18G, and 18H show different examples of shape constraints 600. FIG. 18A shows a two-dimensional shape constraint 602 (e.g., a rectangular shape constraint 620). FIG. 18B shows another two-dimensional shape constraint 602 (e.g., a circular shape constraint 624). FIG. 18C shows another two-dimensional shape constraint 602 (e.g., a circular segment shape constraint 626). Optionally, the circular segment shape constraint 624 may have an arcuate border 628 on the radially inner side, resulting in an annular segment shape constraint 630 (such as the one shown in FIG. 21).

FIG. 18D shows an example of a three-dimensional shape constraint 604 (e.g., a cuboidal shape constraint 660). In comparison to the two-dimensional, rectangular shape constraint 620, the cuboidal shape constraint 660 has a further restriction in a third dimension (e.g., in the z-direction), in addition to restrictions in a first dimension (e.g., in the x-direction) and a second dimension (e.g., in the y-direction). A three-dimensional constraint may result from, for example, the presence of other components not belonging to the converter in a relevant installation space.

FIG. 18F shows another example of a three-dimensional shape constraint 604 in the form of a cylindrical shape constraint 662.

FIGS. 18G and 18H shows another example of a three-dimensional shape constraint 604 in the form of a hollow cylindrical segment shape constraint 664 (e.g., a shape constraint in the form of a segment of a hollow cylinder). Such a shape constraint may be particularly useful for an installation space 640 where a plurality of power converters (e.g., inverters) and/or multi-layer substrate carriers are arranged circumferentially around an EPU, electrical machine, gas turbine, or other rotating machinery, with respect to a rotational axis R. A plurality of (e.g., three in this example) multi-layer carrier substrate segments 1811-1, 1811-2, 1811-3 are arranged circumferentially around the rotational axis R, each multi-layer carrier substrate 1811-1, 1811-2, 1811-3 extending axially along the rotational axis R in a tangential plane. In order to define the possible positions for the multi-layer carrier substrates 1811-1, 1811-2, 1811-3 more precisely, the hollow cylindrical segment shape constraint 664 may include a number of substantially planar space segments 632-1, 632-2, 632-3.

Due to the bent or annular shape of the hollow cylindrical segment shape constraint 664, a plurality of multi-layer carrier substrate segments 1811-1, 1811-2, 1811-3 (e.g., according to the space segments 632-1, 632-2, 632-3) that have a relatively small tangential extension 1811T are selected in order to fit into the curved shape of the installation space 640 (and the hollow cylindrical segment shape constraint 664, respectively). For example, each multi-layer carrier substrate segment of the plurality of multi-layer carrier substrate segments 1811-1, 1811-2, 1811-3 is selected such that the respective multi-layer carrier substrate segment, including its mounted components such as semiconductor prepackages, fit into the installation space 640 and thus meet the shape constraint 664. For example, the plurality of multi-layer carrier substrate segments 1811-1, 1811-2, 1811-3 are arranged on a center plane 1811P or the like plane parallel to the radial boundaries of the hollow cylindrical segment shape constraint 664.

FIG. 19 shows an example of a combined shape constraint 670 including three space segments 632-1, 632-2, 632-3. The space segments 632-1, 632-2, 632-3 are substantially planar and may each be considered two-dimensional shape constraints. Such a combination of space segments in a combined shape constraint 670 may be particularly suitable for converters 10 including more than one multi-layer carrier substrate 1811. For example, as shown in FIG. 19, a converter may include a first multi-layer carrier substrate 1811-1 that includes a plurality of semiconductor prepackages, a second multi-layer carrier substrate 1811-2 that includes auxiliary electronic components, and a third multi-layer carrier substrate 1811-3 that includes control components of the inverter 1810. For example, the first multi-layer carrier substrate 1811-1 may be a power board, the second multi-layer carrier substrate 1811-2 may be an auxiliary board, and the third multi-layer carrier substrate 1811-3 may be a control board. A combined shape constraint 670 may be particularly suitable for accommodating a non-cuboidal, yet relatively planar installation space.

Figure 20:
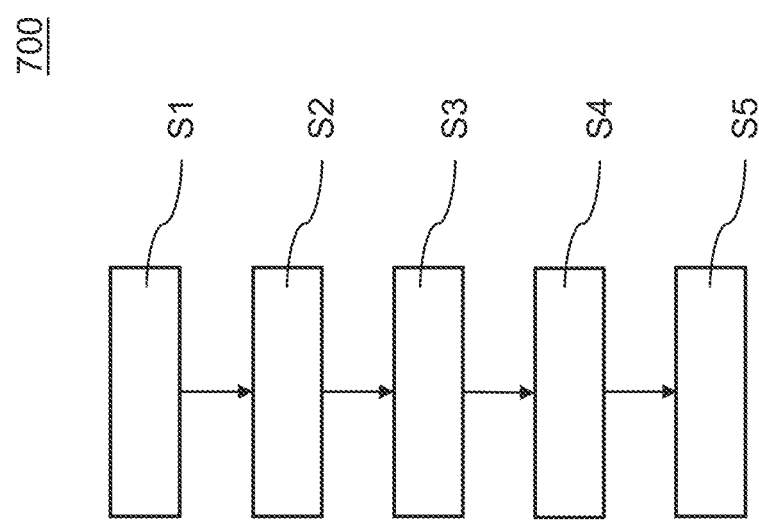
FIG. 20 is a schematic illustration of an embodiment of the method according to the present disclosure.

FIG. 20 is an illustration of an embodiment of a method 700 for designing a power electronics converter according to the present disclosure. In a first act S1, a circuit design for the power electronics converter is selected. For example, a two-level, three-phase AC-DC converter circuit design with one or more (e.g., five) power semiconductors per logical switch may be selected. In a second act S2, a shape constraint for integrating the converter into the electrical power system is determined. The shape constraint may be determined according to (e.g., based on) an installation space available in (e.g., defined by) the electrical power system. The electrical power system may be part of a combined electrical power and propulsion system. The installation space may alternatively or additionally be dependent on system components other than the power electronics components (e.g., cooling components, machine components, or others). In a third act S3, a multi-layer carrier substrate according to the determined shape constraint is obtained. In a fourth act S4, a plurality of power semiconductor prepackages is obtained. Each power semiconductor prepackage includes at least one power semiconductor switching element embedded in a solid insulating material, and at least one electrical connection extending through the solid insulating material from at least one terminal of the power semiconductor switching element to a connection surface of the prepackage. In a fifth act S5, the converter is assembled by forming electrically conductive connections in a z-direction between terminals of the power semiconductor prepackages and one or more electrically conductive layers of the multi-layer carrier substrate. The z-direction is orthogonal to an x-y plane of the multi-layer carrier substrate and the one or more electrically conductive layers. Once the connections are formed, the substrate, power semiconductors, and possibly other converter components (e.g., capacitors) result in the circuit design selected in act S1. The power semiconductor prepackages may be arranged on the substrate according to one or more position constraints, as described above.

Figure 21:
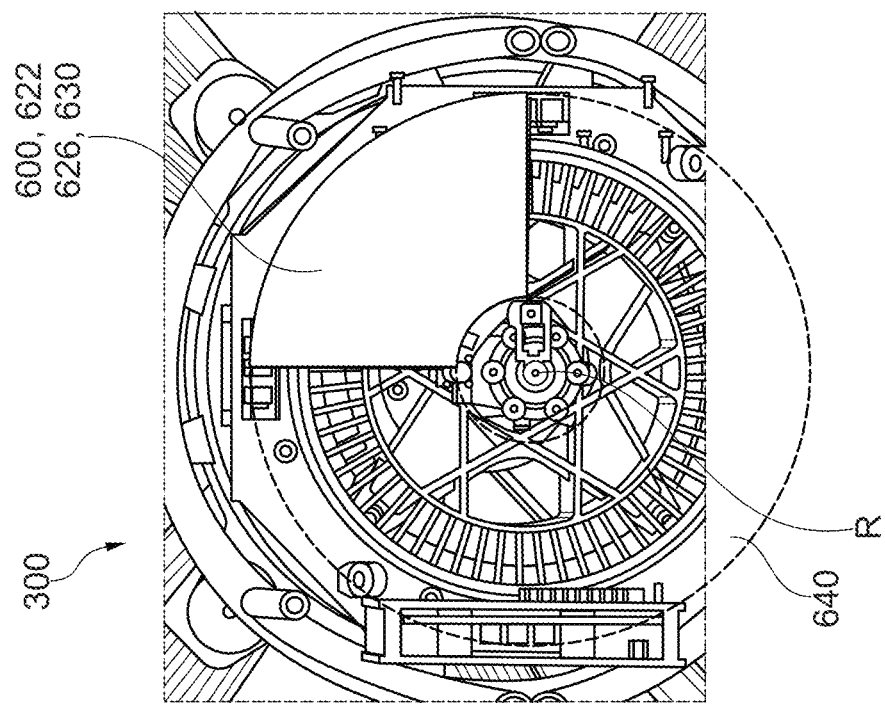
FIG. 21 is an exemplary illustration of an installation space including a possible shape constraint.

FIG. 21 is an illustration of an example of an installation space 640 in an aircraft power and propulsion system 300. The installation space 640 is approximately circular and planar with respect to a plane perpendicular to an axis of rotation R. Accordingly, as a shape constraint 600, a two-dimensional shape constraint 602 in the form of a non-rectangular shape constraint 622 (e.g., a circular segment shape constraint 626) is selected. Since at the radially inner side of the installation space 640 a cut out (e.g., defined by an arcuate border 628) provides space for a shaft of the aircraft power and propulsion system 300, the circular segment shape constraint 626 is an annular segment shape constraint 630.

Various examples have been described, each of which feature various combinations of features. It will be appreciated by those skilled in the art that, except where clearly mutually exclusive, any of the features may be employed separately or in combination with any other features and the disclosure extends to and includes all combinations and sub-combinations of one or more features described herein.

While the embodiments have been described with reference to an aircraft, and to turbofan engines, the principles of the described electrical systems may be applied to other installations (e.g., to aircraft with turboprop and open rotor engines, to marine environments such as on a naval vessel, and to other transport applications including trains).

The invention claimed is:

1. A power electronics converter comprising:
a first multi-layer planar carrier substrate defining an x-y direction parallel to a planar surface of the first multi-layer planar carrier substrate and a z-direction perpendicular to the x-y direction, wherein the first multi-layer planar carrier substrate has one or more electrically conductive layers extending in the x-y direction;
a second multi-layer planar carrier substrate spaced apart from the first multi-layer planar carrier substrate in a +z direction, wherein a planar surface of the second multi-layer planar carrier substrate is parallel to the planar surface of the first multi-layer planar carrier substrate, and wherein the second multi-layer planar carrier substrate has one or more electrically conductive layers extending in the x-y direction;
a converter commutation cell circuit comprising a plurality of commutation cell components, wherein commutation cell components of the plurality of commutation cell components are electrically connected together via the one or more electrically conductive layers of the first multi-layer planar carrier substrate and electrical connections extend in the z-direction, wherein the plurality of commutation cell components comprises one or more power semiconductor switching elements included in one or more power semiconductor prepackages, and wherein each power semiconductor prepackage comprises a power semiconductor switching element embedded in a solid insulating material;
one or more additional converter components electrically connected to the one or more electrically conductive layers of the second multi-layer planar carrier substrate; and
one or more further electrical connections extending in the z-direction connecting together at least one electrically conductive layer of the one or more of the electrically conductive layers of the first multi-layer planar carrier substrate and at least one electrically conductive layer of the one or more of the electrically conductive layers of the second multi-layer planar carrier substrate.

2. The power electronics converter of claim 1, wherein the plurality of commutation cell components further comprises one or more capacitors, a gate driver circuit, or a combination thereof.

3. The power electronics converter of claim 1, wherein each power semiconductor switching element of the one or more power semiconductor switching elements is a Silicon Carbide (SiC) power semiconductor switching element with a blocking voltage greater than or equal to 800 V.

4. The power electronics converter of claim 1, wherein the one or more additional converter components are not part of the converter commutation cell circuit of the power electronics converter.

5. The power electronics converter of claim 4, wherein the one or more additional converter components comprise an AC filter, one or more sensors configured to sense one or more operating conditions of the power electronics converter, a protection circuit, an auxiliary power supply, a logic circuit, or a combination thereof.

6. The power electronics converter of claim 5, wherein the protection circuit is in a form of a solid-state power controller (SSPC).

7. The power electronics converter of claim 1, wherein each power semiconductor prepackage of the one or more power semiconductor prepackages is surface mounted to the planar surface of the first multi-layer planar carrier substrate, and
wherein, for each respective power semiconductor prepackage of the one of the one or more power semiconductor prepackages, a gap measured in the z-direction between the planar surface of the first multi-layer planar carrier substrate and the respective power semiconductor prepackages is less than or equal to 300 μm.

8. The power electronics converter of claim 1, further comprising:
a heat sink spaced apart from the first multi-layer planar carrier substrate in a −z direction opposite the +z direction,
wherein the heat sink is configured to remove heat from heat-generating components of the converter commutation cell circuit.

9. The power electronics converter of claim 8, wherein the heat sink is further configured to remove heat from one or more heat-generating components of the one or more additional converter components electrically connected to the one or more electrically conductive layers of the second multi-layer planar carrier substrate.

10. The power electronics converter of claim 9, further comprising:
one or more thermally conductive elements extending the z-direction from the second multi-layer planar carrier substrate to the first multi-layer planar carrier substrate,
wherein the one or more thermally conductive elements are configured to increase a rate of heat transfer from the one or more heat-generating components of the one or more additional converter components to the heat sink.

11. The power electronics converter of claim 8, wherein the heat sink is further configured to remove heat from an electrical machine electrically connected to the power electronics converter.

12. The power electronics converter of claim 11, wherein the power electronics converter is provided within a first housing,
wherein the electrical machine is provided within a second housing, and
wherein the heat sink forms at least a portion of a shared wall shared by the first housing and the second housing.

13. The power electronics converter of claim 1, wherein the power electronics converter is an AC:DC power electronics converter having an AC connection for connection to an AC electrical load, and
wherein the AC:DC converter is provided within a housing arranged to electromagnetically shield the AC connection.

14. The power electronics converter of claim 1, further comprising:
a third multi-layer planar carrier substrate spaced apart from the second multi-layer planar carrier substrate in the +z direction, wherein a planar surface of the third multi-layer planar carrier substrate is parallel to the planar surface of the first multi-layer planar carrier substrate and the planar surface of the second multi-layer planar carrier substrate; and
a controller for controlling operations of the power electronics converter,
wherein the third multi-layer planar carrier substrate electrically connects the controller to at least one commutation cell component of the plurality of commutation cell components and to at least one additional converter component of the one or more additional converter components via at least one electrical connection extending in the z-direction.

15. The power electronics converter of claim 14, wherein each power semiconductor switching element of the one or more power semiconductor switching elements comprises a gate terminal,
wherein the plurality of commutation cell components or the one or more additional components comprise a gate driver circuit electrically connected to and configured to provide switching signals to the gate terminal of each power semiconductor switching element of the one or more power semiconductor switching elements,
wherein the controller is configured to supply switching control signals to the gate driver circuit, and
wherein a voltage of the switching control signals is configured to be lower than a voltage of the switching control signals.

16. The power electronics converter of claim 1, wherein the converter commutation cell circuit comprises a power circuit having the one or more power semiconductor switching elements, and
wherein a product of a parasitic inductance of the power circuit and a peak rated power output of the power electronics converter is in a range 0.05 mHW to 1.5 mHW.

17. The power electronics converter of claim 1, wherein the converter commutation cell circuit comprises a power circuit having the one or more power semiconductor switching elements and one or more capacitors, and
wherein a total rated capacitance of the power circuit of the converter commutation cell circuit divided by a peak rated power is less than or equal to 5 nF/W.

18. The power electronics converter of claim 1, wherein the power electronics converter has a peak rated power output of at least 25 kW.

19. An electrical propulsion unit (EPU) for an aircraft, the EPU comprising:
an electric motor; and
an AC:DC power electronics converter configured as an inverter and arranged to supply current to a winding of the electric motor,
wherein the AC:DC power electronics converter comprises:
a first multi-layer planar carrier substrate defining an x-y direction parallel to a planar surface of the first multi-layer planar carrier substrate and a z-direction perpendicular to the x-y direction, wherein the first multi-layer planar carrier substrate has one or more electrically conductive layers extending in the x-y direction;
a second multi-layer planar carrier substrate spaced apart from the first multi-layer planar carrier substrate in a +z direction, wherein a planar surface of the second multi-layer planar carrier substrate is parallel to the planar surface of the first multi-layer planar carrier substrate, and wherein the second multi-layer planar carrier substrate has one or more electrically conductive layers extending in the x-y direction;
a converter commutation cell circuit comprising a plurality of commutation cell components, wherein commutation cell components of the plurality of commutation cell components are electrically connected together via the one or more electrically conductive layers of the first multi-layer planar carrier substrate and electrical connections extend in the z-direction, wherein the plurality of commutation cell components comprises one or more power semiconductor switching elements included in one or more power semiconductor prepackages, and wherein each power semiconductor prepackage comprises a power semiconductor switching element embedded in a solid insulating material;

one or more additional converter components electrically connected to the one or more electrically conductive layers of the second multi-layer planar carrier substrate; and one or more further electrical connections extending in the z-direction connecting together at least one electrically conductive layer of the one or more of the electrically conductive layers of the first multi-layer planar carrier substrate and at least one electrically conductive layer of the one or more of the electrically conductive layers of the second multi-layer planar carrier substrate.

* * * * *